US011489338B2

(12) United States Patent
Inoue et al.

(10) Patent No.: US 11,489,338 B2
(45) Date of Patent: Nov. 1, 2022

(54) POWER CONVERSION DEVICE THAT RECEIVES DEAD ZONE INFORMATION

(71) Applicant: Mitsubishi Electric Corporation, Tokyo (JP)

(72) Inventors: Sadayuki Inoue, Tokyo (JP); Tomihiro Takano, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 141 days.

(21) Appl. No.: 17/040,055

(22) PCT Filed: Feb. 27, 2019

(86) PCT No.: PCT/JP2019/007494
§ 371 (c)(1),
(2) Date: Sep. 22, 2020

(87) PCT Pub. No.: WO2019/211940
PCT Pub. Date: Nov. 7, 2019

(65) Prior Publication Data
US 2021/0028625 A1 Jan. 28, 2021

(30) Foreign Application Priority Data
May 1, 2018 (JP) .............................. JP2018-088112

(51) Int. Cl.
*H02J 3/16* (2006.01)
*H03M 1/00* (2006.01)
(52) U.S. Cl.
CPC .............. *H02J 3/16* (2013.01); *H03M 1/001* (2013.01)

(58) Field of Classification Search
CPC .................................. H02J 3/16; H03M 1/001
See application file for complete search history.

(56) References Cited

U.S. PATENT DOCUMENTS

| 2015/0005979 A1* | 1/2015 | Itaya | ...................... G05B 15/02 700/298 |
| 2016/0156226 A1* | 6/2016 | Itaya | ........................ H02J 3/14 323/234 |

(Continued)

FOREIGN PATENT DOCUMENTS

JP 2016-182021 A 10/2016

OTHER PUBLICATIONS

International Search Report and Written Opinion dated May 14, 2019 for PCT/JP2019/007494 filed on Feb. 27, 2019, 7 pages including English Translation of the International Search Report.

*Primary Examiner* — Harry R Behm
(74) *Attorney, Agent, or Firm* — Xsensus LLP

(57) ABSTRACT

A solar cell power conversion device is disposed between a solar cell and a consumer premises distribution system. A storage battery power conversion device is disposed between a storage battery and the consumer premises distribution system. When an AC effective voltage in the consumer premises distribution system deviates from a voltage range defined in accordance with dead zone information transmitted from HEMS, system voltage stabilization control for returning the AC effective voltage to fall within the voltage range is performed by control of active power and reactive power that are output from a first DC/AC conversion circuit and a second DC/AC conversion circuit.

13 Claims, 30 Drawing Sheets

(56) References Cited

U.S. PATENT DOCUMENTS

2016/0172857 A1* 6/2016 Itaya .................. H02J 3/50
 700/298
2019/0280481 A1* 9/2019 Kuroda ............. H02J 13/00034

* cited by examiner

FIG.30
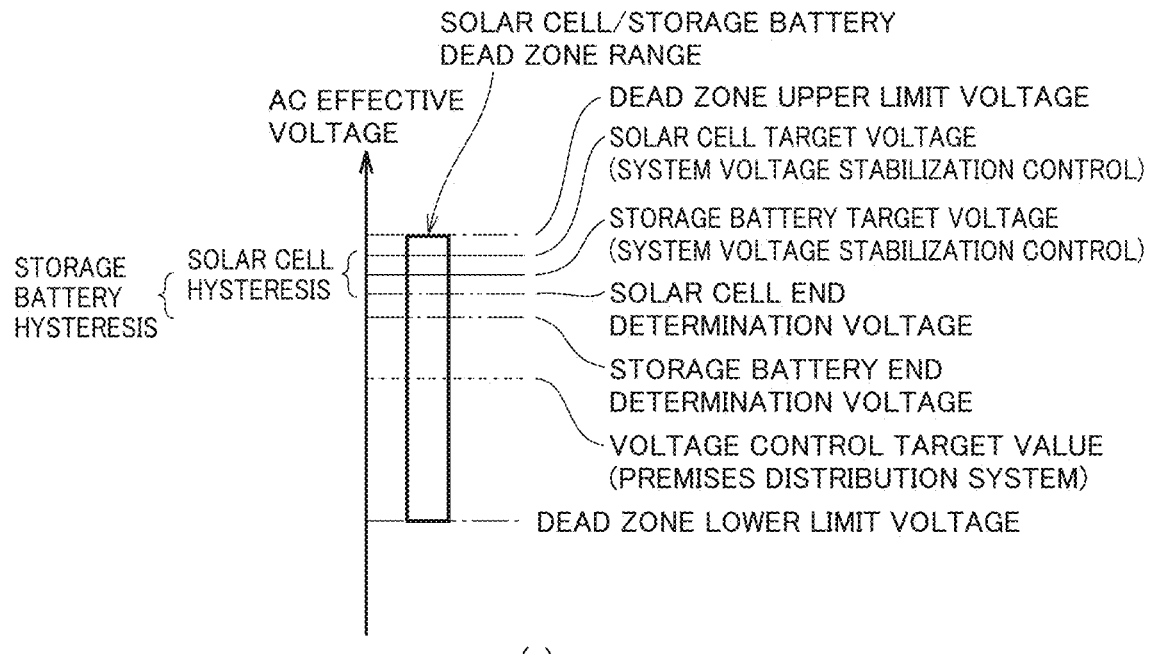
(a)
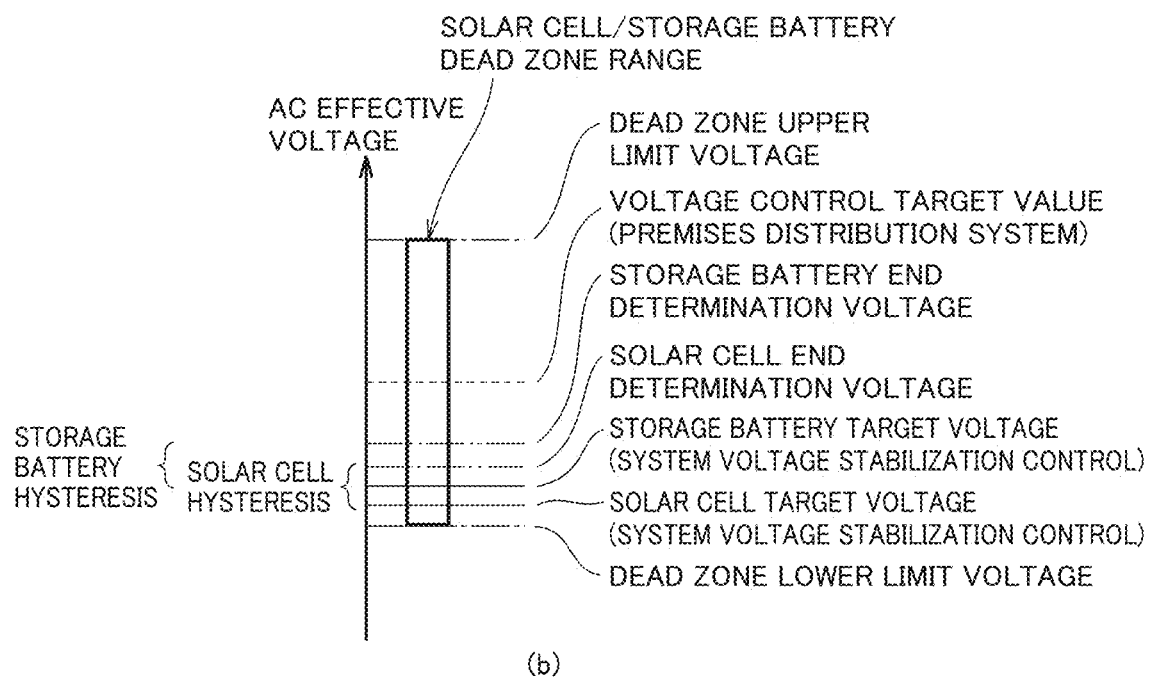
(b)

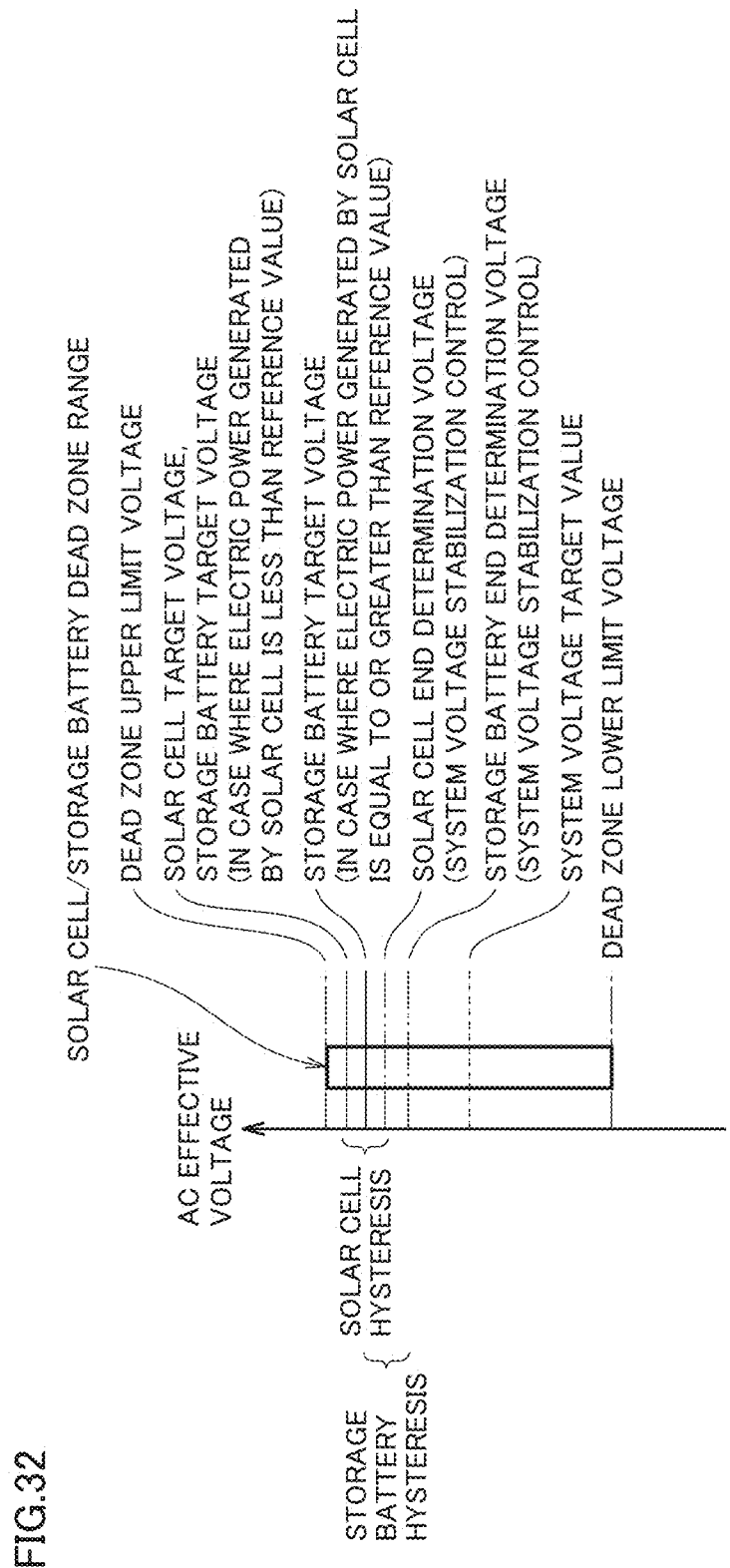

POWER CONVERSION DEVICE THAT RECEIVES DEAD ZONE INFORMATION

CROSS-REFERENCE TO RELATED APPLICATIONS

The present application is based on PCT filing PCT/JP2019/007494, filed Feb. 27, 2019, which claims priority to JP 2018-088112, May 1, 2018, the entire contents of each are incorporated herein by reference.

TECHNICAL FIELD

The present disclosure relates to a power conversion device, and more particularly to output control of a distributed power supply by a power conversion device that performs, with an alternating current, system interconnection of distributed power supplies such as an energy creating device harnessing renewable energy, such as a solar cell (hereinafter also referred to as an "energy creation device"), and an energy storing device such as a storage battery (hereinafter also referred to as an "energy storage device").

BACKGROUND ART

In recent years, for reducing environmental burdens, a power generation system that harnesses natural energy, such as a solar cell not emitting carbon dioxide, has come into widespread use in houses. Furthermore, in order to address power shortage and the like since the Great East Japan Earthquake, product commercialization has been underway for a system including a storage battery, a system utilizing an electric vehicle as a storage battery, a system formed of a combination of a solar cell and a storage battery, and the like. Furthermore, in order to significantly reduce emission of carbon dioxide, widespread use of a zero-emission house (hereinafter also referred to as a "ZEH house" or simply as "ZEH") has been promoted as a house that is improved in heat insulation performance, equipped with an energy creation device such as a solar cell that harnesses renewable energy, and allows zero balance of power consumption and generation in one year.

As described above, when renewable energy of a solar cell and the like is supplied in large quantity, there occurs a problem in the case of a solar cell that the voltage in a distribution system rises in a time zone of daytime with a large amount of solar radiation. This problem has been addressed by solutions, for example, by suppressing reverse power by suppressing power generation from a solar cell, or by power compensation by a static VAR compensator (SVC) and system stabilization facilities represented by storage battery facilities. However, these solutions also cause problems that the electric power that can be generated by a solar cell cannot be utilized to the extent possible or the system stabilization facilities such as SVC are expensive. As part of the solutions, the Japanese government started subsidiary enterprises for increasing in-house consumption of generated power (local production for local consumption) in 2016, and plans to promote the enterprises in the future. As to the enterprises for promoting the above-mentioned ZEH house, in order to promote local production for local consumption, the Japanese government started subsidization in 2016 for storage batteries unrelated to the ZEH conditions for widespread use.

In recent years, a large-scale town development called vacant lot development has been underway, which utilizes the sites of factories and schools (e.g., vacant lot development in the Sustainable Smart Town in Fujisawa City, Kanagawa Prefecture, Kyushu University, etc.). Such developments include the case where a solar cell is installed in each house. Also, according to the above-mentioned guidelines of the government, the future town development is expected to proceed on the precondition that ZEH houses (each equipped with an energy creation device (a solar cell and the like) of several kW) are built. In this case, installation of a solar cell of 4 kW in each house will lead to formation of a so-called mega-solar system in a town scale including about 300 houses. In such a case, in order to stabilize a distribution system (in other words, to suppress a rise in system voltage), system stabilization facilities such as expensive SVC and storage batteries need to be installed in a town. Introduction of the facilities into a smart town may require consumers to bear part of the cost.

Furthermore, it is known as a solution for each house to, upon a voltage rise in the distribution system, control suppression of the system voltage with output of reactive power from a power conversion device connected to a solar cell. When this control is performed, suppression of electric power generated by the solar cell may be required as apparent power rises due to the reactive power.

From the above-mentioned viewpoints, Japanese Patent Laying-Open No. 2016-182021 (PTL 1) discloses a reactive power cooperative control device provided in a distributed power generation system including a plurality of voltage control units. Each of the voltage control units is connected to a low-voltage distribution line to function of adjusting the reactive power such that the voltage value measured at its own terminal is maintained within a target voltage range that is set in advance. The reactive power cooperative control device includes: information generation means for, when one voltage control unit satisfies a prescribed condition, generating target voltage change request information for requesting change of the target voltage range of another voltage control unit other than this one voltage control unit; and information transmission means for transmitting the generated target voltage change request information. The prescribed condition is set such that the prescribed condition is determined as being satisfied in the state where the voltage control unit can adjust the reactive power.

CITATION LIST

Patent Literature

PTL 1: Japanese Patent Laying-Open No. 2016-182021

SUMMARY OF INVENTION

Technical Problem

In a reactive power cooperative control device and a power control system disclosed in PTL 1, the active power and the reactive power output from each of distributed power supplies are controlled based on a command from a host energy management system (EMS) in order to stabilize the system voltage. However, this control cycle is a communication cycle (for example, a 30-minute cycle) from the host EMS. Thus, when the system voltage abruptly rises due to an abrupt change of solar radiation in a town where about 300 ZEH houses are densely built, for example, the electric power generated by a solar cell needs to be suppressed for stabilizing the system voltage. Thus, there occur a problem that essentially unnecessary suppression of power generation amount may be required. On the other hand, for stabilizing the system voltage, expensive system stabilization facilities such as SVC and a large-capacity town storage battery may be introduced, which however causes cost problems.

The present disclosure has been made in order to solve the above-described problems. An object of the present disclosure is to, in a configuration in which distributed power supplies are interconnected with an alternating-current (AC) distribution system by a power conversion device, suppress voltage fluctuations in the AC distribution system caused by an abrupt change in output power of each distributed power supply or in power consumption of a load, without introducing expensive distribution system voltage stabilization facilities such as SVC and a large-capacity storage battery for distribution system.

Solution to Problem

In an aspect of the present disclosure, a power conversion device disposed between a distributed power supply and an AC distribution system includes: an inverter, a voltage measurement unit, an effective voltage calculator, a voltage control target value generator, a communication interface, and an inverter controller. The inverter converts direct-current (DC) power output from the distributed power supply into AC power. The voltage measurement unit measures an AC voltage in the AC distribution system. The effective voltage calculator calculates an AC effective voltage in the AC distribution system from the AC voltage measured by the voltage measurement unit. The voltage control target value generator generates a voltage control target value for the AC distribution system from the AC effective voltage calculated by the effective voltage calculator. The communication interface transmits and receives data to and from outside the power conversion device. The inverter controller controls an output from the inverter. When the AC effective voltage deviates from a voltage range defined to include the voltage control target value in accordance with dead zone information received by the communication interface, the inverter controller controls an operation of the inverter to perform system voltage stabilization control for returning the AC effective voltage to fall within a voltage range by control of active power and reactive power that are output from the inverter.

Advantageous Effects of Invention

According to the present disclosure, when the AC effective voltage in the AC distribution system deviates from the voltage range defined by the dead zone information, the AC effective voltage in the AC distribution system can be returned to fall within the voltage range by autonomous control of the active power and the reactive power by the power conversion device. As a result, without having to introduce expensive system stabilization facilities, voltage fluctuations in the AC distribution system caused by an abrupt change in output power of the distributed power supply or in power consumption of the load can be suppressed by controlling the output from the power conversion device disposed to correspond to the distributed power supply.

BRIEF DESCRIPTION OF DRAWINGS

FIG. 30 is a conceptual diagram illustrating dead zone width information, a target voltage at the time of system voltage stabilization control, and an end determination voltage for system voltage stabilization control by reactive power output in the second embodiment.

FIG. 32 is a conceptual diagram illustrating dead zone width information, a target voltage at the time of system voltage stabilization control, and an end determination voltage for system voltage stabilization control by reactive power output in the fourth embodiment.

DESCRIPTION OF EMBODIMENTS

Figure 1:
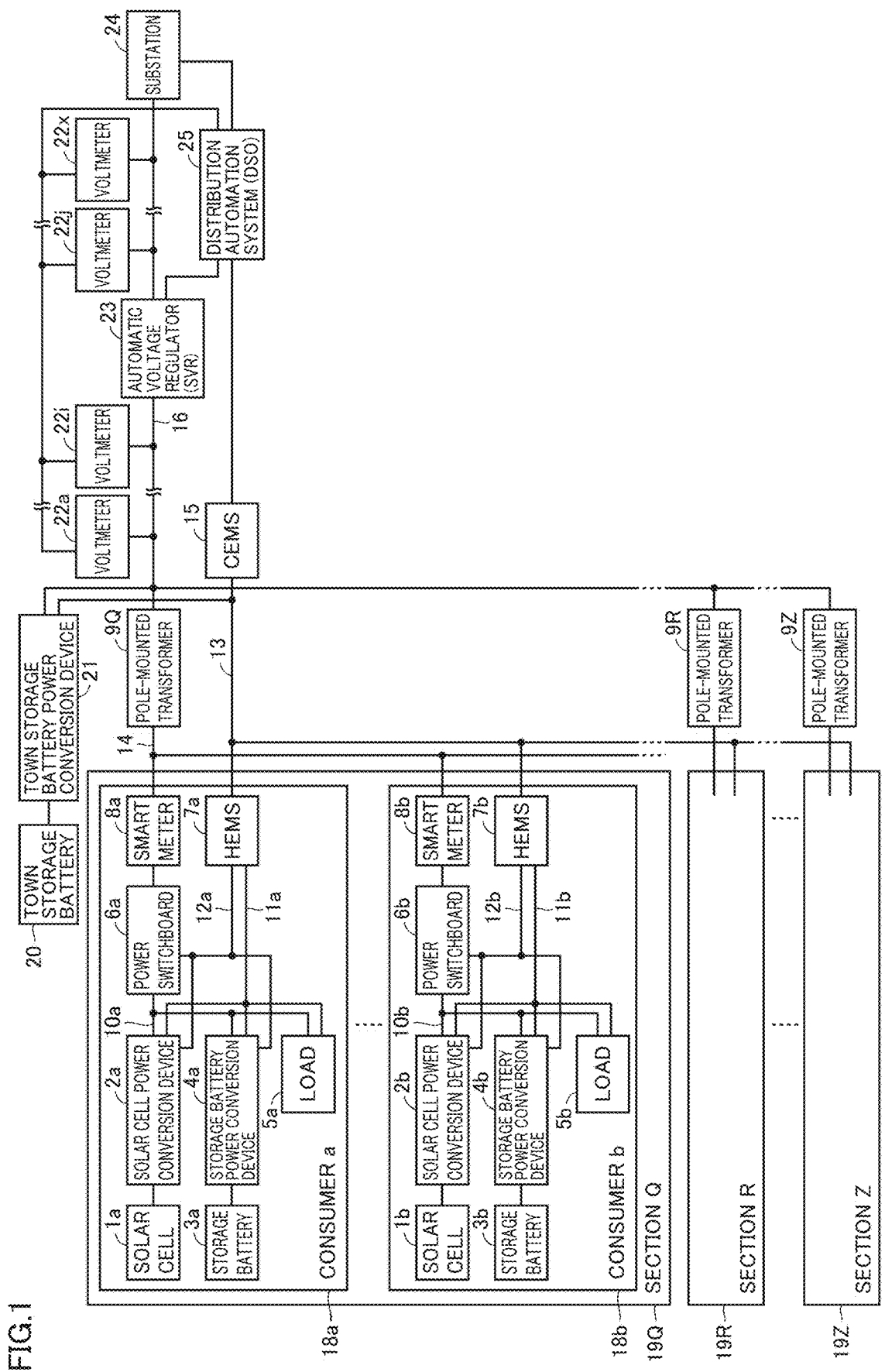
FIG. 1 is a block diagram showing a configuration of a distributed power supply system to which a power conversion device according to the first embodiment of the present disclosure is applied.

The embodiments of the present disclosure will be hereinafter described in detail with reference to the accompanying drawings. In the following description, the same or corresponding portions will be designated by the same reference characters, and description thereof will not be basically repeated.

First Embodiment

FIG. 1 is a block diagram showing a configuration of a distributed power supply system to which a power conversion device according to the first embodiment of the present disclosure is applied.

Referring to FIG. 1, the distributed power supply system is disposed in a smart town formed of a collection of a plurality of sections (for example, about 30 sections). Each of the sections forming such a smart town is constituted of a plurality of (for example, about ten) consumers connected to a common pole-mounted transformer. FIG. 1 shows sections 19Q, 19R and 19Z, and pole-mounted transformers 9Q, 9R and 9Z that correspond to sections 19Q, 19R and 19Z, respectively, but any number of sections may be provided. Furthermore, a consumer a and a consumer b are shown in section 19Q, but any number of consumers may exist.

Each consumer house 18 includes a solar cell 1, a solar cell power conversion device 2, a storage battery 3, a storage battery power conversion device 4, a load 5 in a consumer house, a power switchboard 6, a home energy management system (HEMS) 7, a smart meter 8, a consumer premises distribution system 10, a consumer premises communication network 11, and a signal line 12. Consumer premises communication network 11 connects HEMS 7 to devices installed in each house. Through signal line 12, consumed power and the like of each device measured by power switchboard 6 are transmitted to HEMS 7.

FIG. 1 shows the configurations of consumer houses 18a and 18b of respective consumers "a" and "b" in section 19Q with suffixes a and b added to reference numerals of the respective elements, whereas the elements are denoted by reference numerals without suffixes a and b when the description is common to the consumers since the configurations of the systems in the consumer houses are the same. Similarly, the pole-mounted transformers will be denoted simply as a pole-mounted transformer 9 without suffixes Q, R and Z when the description is common to the sections.

Furthermore, a smart town shared among the consumers and the sections has a configuration including: a substation 24; a distribution system 16 on the pole-mounted transformer's primary side between substation 24 and each pole-mounted transformer 9; a distribution system 14 on the pole-mounted transformer's secondary side between pole-mounted transformer 9 and each consumer; an outside premises communication network 13; a community energy management system (CEMS) 15; a town storage battery 20; a town storage battery power conversion device 21; an automatic voltage regulator 23; and a distribution automation system 25 by a distribution system operator (DSO).

CEMS 15 manages demand and supply of electric power in a city section constituted of sections 19Q to 19Z. Outside premises communication network 13 connects communication between HEMS 7 of each consumer and CEMS 15. Town storage battery power conversion device 21 performs DC/AC power conversion between town storage battery 20 and distribution system 16. Distribution system 16 is equipped with a plurality of voltmeters 22 for measuring a voltage. Any number of voltmeters 22 may be provided, and FIG. 1 shows a configuration in which voltmeters 22a to 22x are disposed. Automatic voltage regulator 23 and distribution automation system 25 control the voltage in distribution system 16. In the following description, automatic voltage regulator 23 will be also referred to as a step voltage regulator (SVR) 23. Specifically, SVR 23 performs tap changing according to a control command from distribution automation system 25 to thereby regulate the voltage in distribution system 16.

In the present embodiment, an explanation will be hereinafter given with regard to the configuration in which solar cell 1 and storage battery 3 are installed as "distributed power supplies" in each of the consumer houses. Solar cell 1 corresponds to one example of an "energy creation device". Storage battery 3 corresponds to one example of an "energy storage device". All of the consumers do not have to have both solar cell 1 (energy creation device) and storage battery 3 (energy storage device), but each consumer may have only one of solar cell 1 and storage battery 3.

Figure 2:
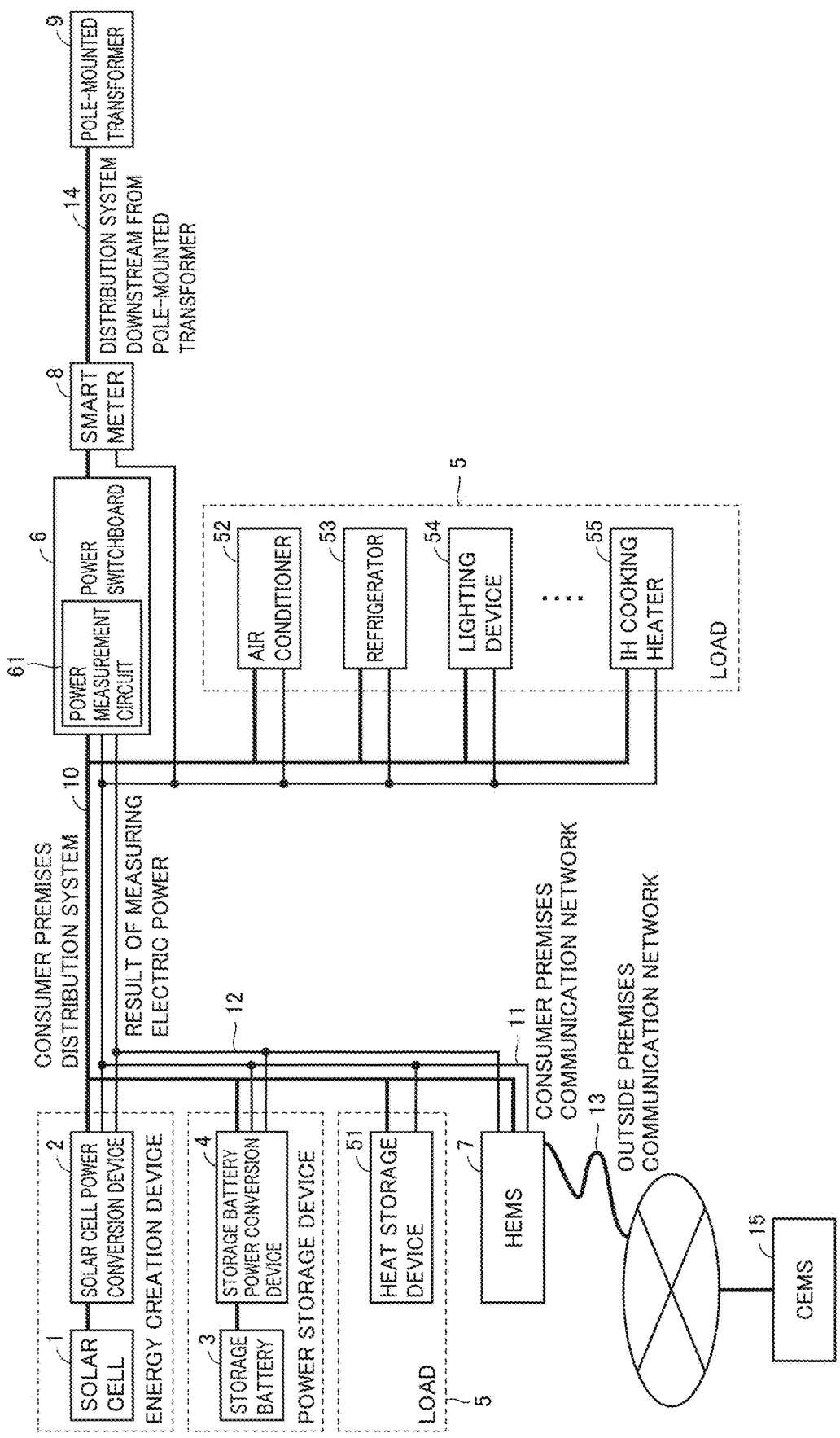
FIG. 2 is a block diagram for further illustrating configurations of various facilities in a consumer house shown in FIG. 1.

FIG. 2 shows a block diagram for further illustrating configurations of various devices in consumer house 18 shown in FIG. 1.

Referring to FIG. 2, solar cell 1 and solar cell power conversion device 2 constitute a distributed power supply by an energy creation device while storage battery 3 and storage battery power conversion device 4 constitute a distributed power supply by an energy storage device. As described above, the power supply system in each consumer house may be provided with only one of a distributed power supply by an energy creation device and a distributed power supply by an energy storage device.

Load 5 includes a heat storage device 51 such as Eco Cute (registered trademark), an air conditioner 52, a refrigerator 53, a lighting device 54, and an IH cooking heater 55, for example. Load 5 operates with electric power supplied from consumer premises distribution system 10. Power switchboard 6 is equipped inside with a power measurement circuit 61 for measuring power consumption per breaker. The measured value by power measurement circuit 61 is transmitted to HEMS 7 through signal line 12. HEMS 7 is capable of transmitting and receiving data to and from each device of load 5 and smart meter 8 through consumer premises communication network 11. Furthermore, HEMS 7 is capable of transmitting and receiving data to and from CEMS 15 through outside premises communication network 13.

Figure 3:
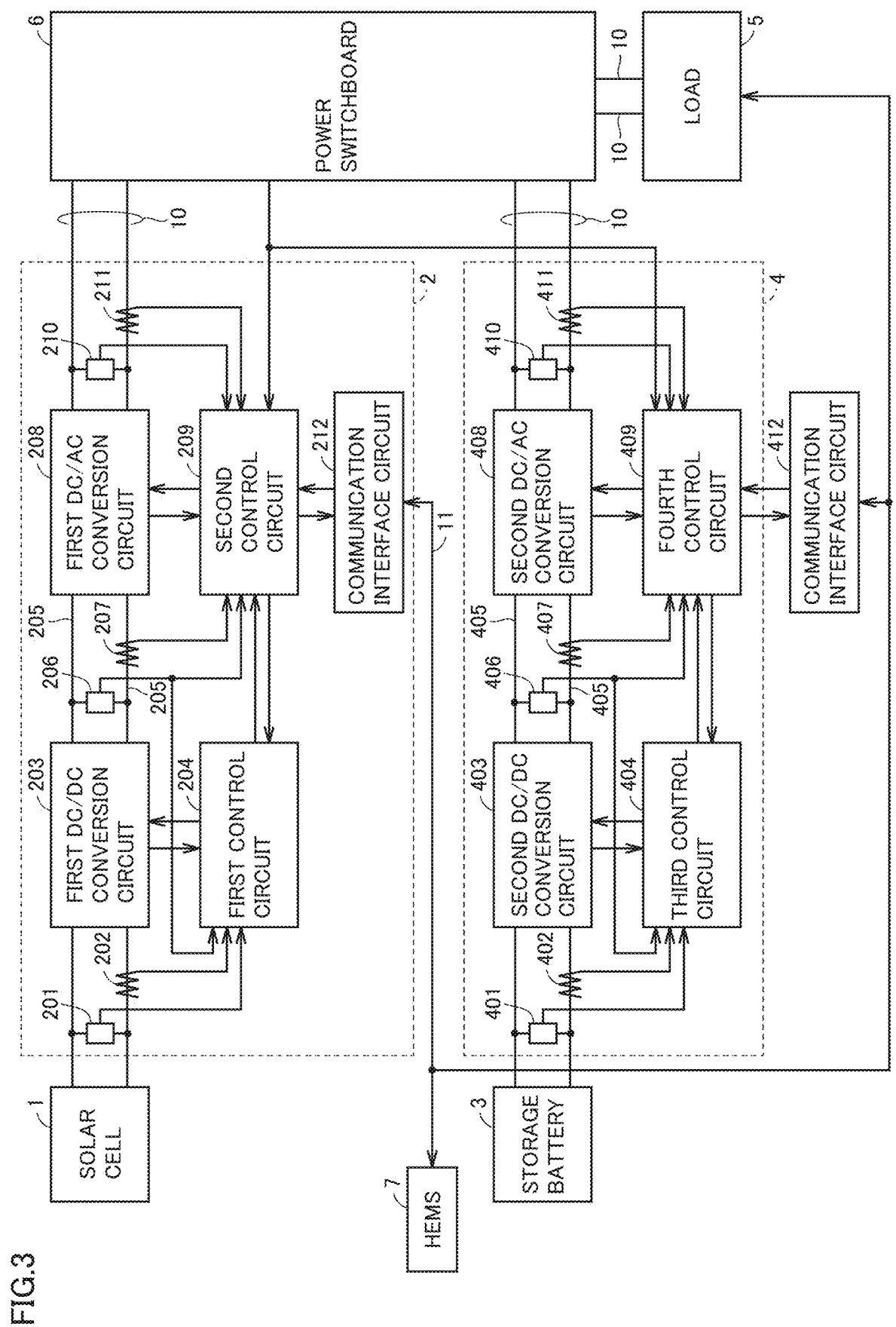
FIG. 3 is a block diagram illustrating configurations of a solar cell power conversion device and a storage battery power conversion device shown in FIG. 1.

FIG. 3 is a block diagram illustrating the configurations of a solar cell power conversion device 2 and a storage battery power conversion device 4.

Referring to FIG. 3, solar cell power conversion device 2 includes a voltmeter 201, an ammeter 202, a first DC/DC conversion circuit 203, a first control circuit 204, a DC bus 205, a voltmeter 206, an ammeter 207, a first DC/AC conversion circuit 208, a second control circuit 209, a voltmeter 210, an ammeter 211, and a communication interface circuit 212.

Voltmeter 201 measures the voltage (DC) output from solar cell 1. Ammeter 202 measures the current (DC) output from solar cell 1. First DC/DC conversion circuit 203 converts the DC power of the first DC voltage output from solar cell 1 into DC power of the second DC voltage. First control circuit 204 controls first DC/DC conversion circuit 203. Through DC bus 205, the second DC voltage output from first DC/DC conversion circuit 203 is supplied to first DC/AC conversion circuit 208. Voltmeter 206 measures the voltage on DC bus 205. Ammeter 207 measures the current (DC) output from first DC/DC conversion circuit 203.

First DC/AC conversion circuit 208 converts the DC power output from first DC/DC conversion circuit 203 into AC power. Second control circuit 209 controls first DC/AC conversion circuit 208. Voltmeter 210 measures the voltage (AC) output from first DC/AC conversion circuit 208. Ammeter 211 measures the current (AC) output from first DC/AC conversion circuit 208. Communication interface circuit 212 establishes communication between solar cell power conversion device 2 and HEMS 7.

Storage battery power conversion device 4 includes a voltmeter 401, an ammeter 402, a second DC/DC conversion circuit 403, a third control circuit 404, a DC bus 405, a voltmeter 406, an ammeter 407, a second DC/AC conversion circuit 408, a fourth control circuit 409, a voltmeter 410, an ammeter 411, and a communication interface circuit 412.

Voltmeter 401 measures the voltage (DC) output from storage battery 3. Ammeter 402 measures the current (DC) output from storage battery 3. Second DC/DC conversion circuit converts the DC power of the third DC voltage output from storage battery 3 into DC power of the fourth DC voltage. Third control circuit 404 controls second DC/DC conversion circuit 403. Through DC bus 405, the fourth DC voltage output from second DC/DC conversion circuit 403 is supplied to second DC/AC conversion circuit 408.

Voltmeter 406 measures the voltage on DC bus 405. Ammeter 407 measures the direct current output from second DC/DC conversion circuit 403. Second DC/AC conversion circuit 408 converts the DC power output from second DC/DC conversion circuit 403 into AC power. Fourth control circuit 409 controls second DC/AC conversion circuit 408. Voltmeter 410 measures the voltage (AC) output from second DC/AC conversion circuit 408. Ammeter 411 measures the current (AC) output from second DC/AC conversion circuit 408. Communication interface circuit 412 establishes communication between storage battery power conversion device 4 and HEMS 7.

First DC/DC conversion circuit 203, second DC/DC conversion circuit 403, first DC/AC conversion circuit 208, and second DC/AC conversion circuit 408 can be formed in configurations of a known DC/DC converter and inverter as appropriate. In the configuration in FIG. 3, each of first DC/AC conversion circuit 208 and second DC/AC conversion circuit 408 corresponds to one example of an "inverter", and in particular, first DC/AC conversion circuit 208 corresponds to the "first inverter", and second DC/AC conversion circuit 408 corresponds to the "second inverter". Furthermore, second control circuit 209 and fourth control circuit 409 correspond to one example of the "inverter controller".

Figure 4:
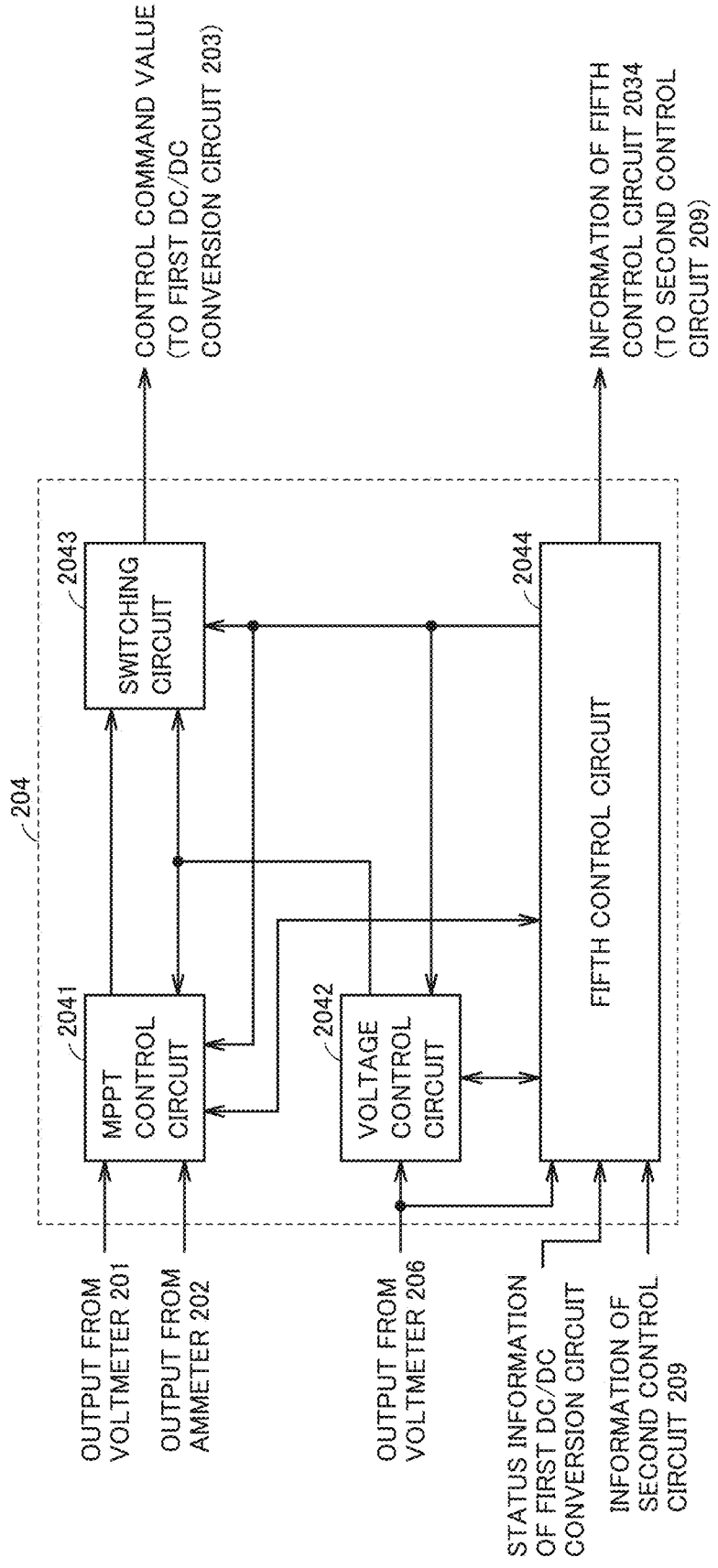
FIG. 4 is a block diagram illustrating a configuration of a first control circuit that controls a first DC/DC conversion circuit in the solar cell power conversion device.

FIG. 4 is a block diagram illustrating the configuration of first control circuit 204 that controls the first DC/DC conversion circuit in solar cell power conversion device 2, as shown in FIG. 3.

Referring to FIG. 4, first control circuit 204 includes a maximum power point tracking (MPPT) control circuit 2041, a voltage control circuit 2042, a switching circuit 2043, and a fifth control circuit 2044. Based on the measured values by voltmeter 201 and ammeter 202, MPPT control circuit 2041 searches for the maximum power point of solar cell 1 in order to extract, to the extent possible, the electric power generated by solar cell 1 for the so-called maximum power point tracking. Specifically, MPPT control circuit 2041 generates a control command value of the first DC/DC conversion circuit for controlling the DC voltage measured by voltmeter 201 to be set at a voltage corresponding to the above-mentioned maximum power point.

Based on the measured value by voltmeter 206, voltage control circuit 2042 generates a control command value of first DC/DC conversion circuit 203 for maintaining the DC voltage (the second DC voltage) on DC bus 205 at a predetermined target voltage (for example, 350V).

Fifth control circuit 2044 outputs a control parameter, a control target value and the like to MPPT control circuit 2041 and voltage control circuit 2042, and also manages the power generation state of solar cell 1, and the like. Fifth control circuit 2044 further outputs a control signal for switching circuit 2043.

According to the control signal from fifth control circuit 2044, switching circuit 2043 selectively outputs one of the outputs from MPPT control circuit 2041 and voltage control circuit 2042 as a control command value for first DC/DC conversion circuit 203.

As described below, first DC/DC conversion circuit 203 is controlled in an MPPT mode or a voltage control mode. In the MPPT mode, switching circuit 2043 is controlled to output the control command value generated by MPPT control circuit 2041. In the voltage control mode, switching circuit 2043 is controlled to output the control command value generated by voltage control circuit 2042.

Figure 5:
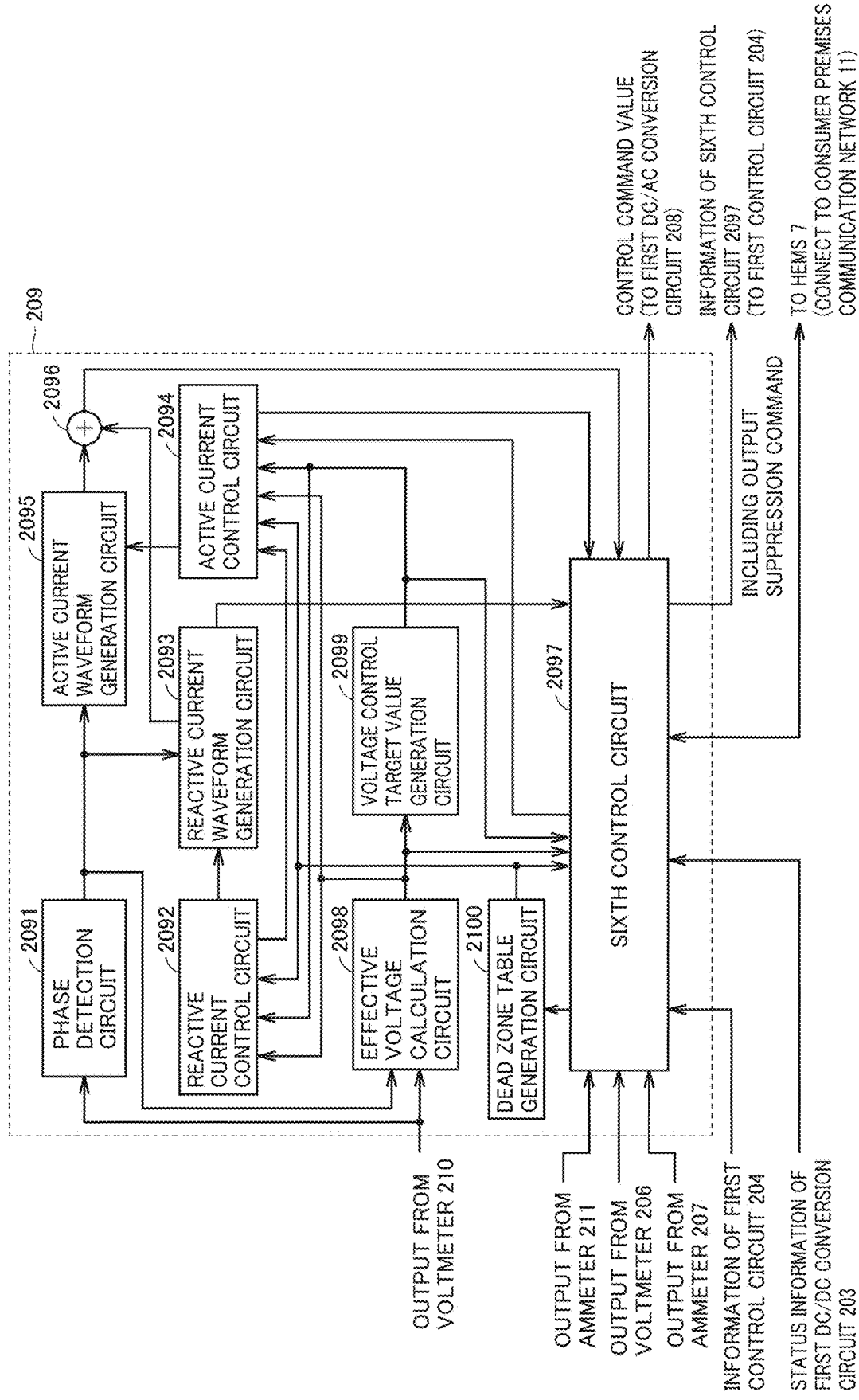
FIG. 5 is a block diagram illustrating a configuration of a second control circuit that controls a first DC/AC conversion circuit in the solar cell power conversion device.

FIG. 5 is a block diagram illustrating the configuration of second control circuit 209 that controls first DC/AC conversion circuit 208 in solar cell power conversion device 2, as shown in FIG. 3.

Referring to FIG. 5, second control circuit 209 includes a phase detection circuit 2091, a reactive current control circuit 2092, a reactive current waveform generation circuit 2093, an active current control circuit 2094, an active current waveform generation circuit 2095, an adder 2096, a sixth control circuit 2097, an effective voltage calculation circuit 2098, a voltage control target value generation circuit 2099, and a dead zone table generation circuit 2100.

Phase detection circuit 2091 detects a phase from the voltage waveform of the alternating current measured by voltmeter 210. Reactive current control circuit 2092 generates an amplitude command of the reactive current output from first DC/AC conversion circuit 208 based on the effective voltage of the AC voltage in the distribution system that is output from effective voltage calculation circuit 2098, the voltage control target value generated by voltage control target value generation circuit 2099, and the dead zone width information generated by dead zone table generation circuit 2100. The details of reactive current control circuit 2092 will be described later.

Reactive current waveform generation circuit 2093 generates a reactive current waveform output from first DC/AC conversion circuit 208 based on the phase detection information about the AC voltage output from phase detection circuit 2091 and the amplitude command value generated by reactive current control circuit 2092.

Active current control circuit 2094 generates an amplitude command value of the active current to be output from first DC/AC conversion circuit 208 based on the voltage on DC bus 205 measured by voltmeter 206, the current flowing through DC bus 205 and measured by ammeter 207, the AC effective voltage in consumer premises distribution system 10 that is output from effective voltage calculation circuit 2098, the voltage control target value generated by voltage control target value generation circuit 2099, the reactive current amplitude information output from reactive current control circuit 2092, and the dead zone width information generated by dead zone table generation circuit 2100, each of which is notified through sixth control circuit 2097. Active current waveform generation circuit 2095 generates an active current waveform output from first DC/AC conversion circuit 208 based on the phase detection information of the AC voltage output from phase detection circuit 2091 and the amplitude command value generated by active current control circuit 2094.

Adder 2096 adds the reactive current waveform output from reactive current waveform generation circuit 2093 and the active current waveform output from active current waveform generation circuit 2095 to thereby generate an AC current target value to be output from first DC/AC conversion circuit 208. From the AC current target value output from adder 2096 and the result of measuring the AC current output from ammeter 211, sixth control circuit 2097 generates a control command value of first DC/AC conversion circuit 208 for controlling the output current from first DC/AC conversion circuit 208 to be set at an AC current target value.

Effective voltage calculation circuit 2098 calculates an AC effective voltage from the AC voltage in consumer premises distribution system 10 that is output from voltmeter 210. Voltage control target value generation circuit 2099 generates a control target value of the AC voltage (AC effective voltage) from the AC effective voltage output from effective voltage calculation circuit 2098. Dead zone table generation circuit 2100 generates dead zone width information.

At the time of reactive power generation, sixth control circuit 2097 calculates apparent power. When the calculated apparent power exceeds the capacity of first DC/AC conversion circuit 208, sixth control circuit 2097 corrects the AC current target value output from adder 2096 to thereby control the output power (output current) from first DC/AC conversion circuit 208 to become equal to or less than the capacity of first DC/AC conversion circuit 208.

Figure 6:
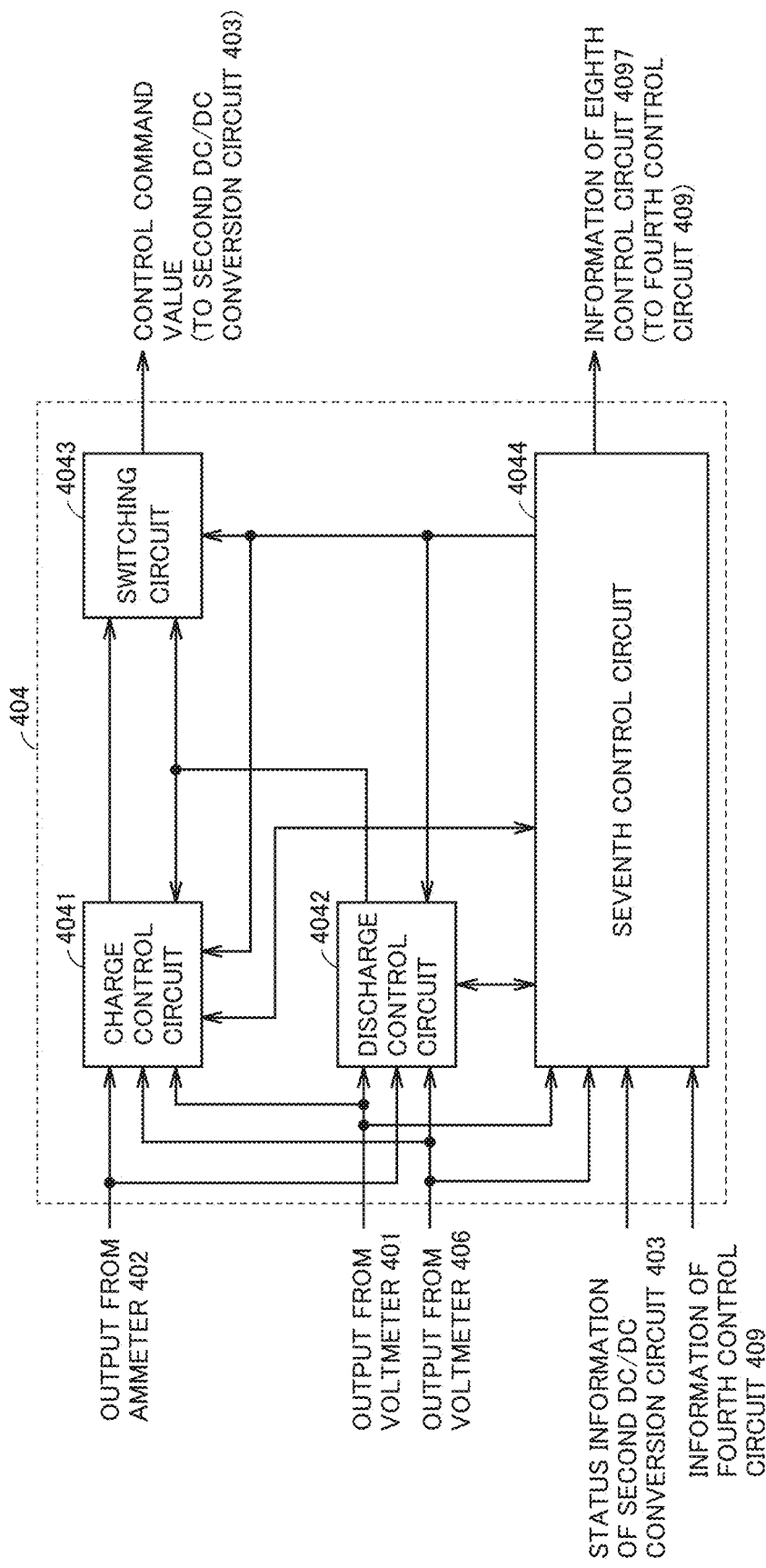
FIG. 6 is a block diagram illustrating a configuration of a third control circuit that controls a second DC/DC conversion circuit in the storage battery power conversion device.

FIG. 6 is a block diagram illustrating a configuration of third control circuit 404 that controls second DC/DC conversion circuit 403 in storage battery power conversion device 4, as shown in FIG. 3.

Referring to FIG. 6, third control circuit 404 includes a charge control circuit 4041, a discharge control circuit 4042, a switching circuit 4043, and a seventh control circuit 4044.

Charge control circuit 4041 generates a control command value of second DC/DC conversion circuit 403 that is used when charging of storage battery 3 is controlled. Discharge control circuit 4042 generates a control command value of second DC/DC conversion circuit 403 that is used when discharging from storage battery 3 is controlled. Seventh control circuit 4044 outputs a control parameter, a control target value and the like to charge control circuit 4041 and discharge control circuit 4042, and also, manages the charge amount, the charge current, the discharge power amount and the like of storage battery 3. Seventh control circuit 4044 further outputs a control signal of switching circuit 4043.

According to the control signal from seventh control circuit 4044, switching circuit 4043 selectively outputs one of the outputs from charge control circuit 4041 and discharge control circuit 4042 as a control command value of second DC/DC conversion circuit 403.

Switching circuit 2043 is controlled to output the control command value generated by charge control circuit 4041 when receiving an instruction to charge storage battery 3, and to output the control command value generated by discharge control circuit 4042 when receiving an instruction to discharge storage battery 3.

Figure 7:
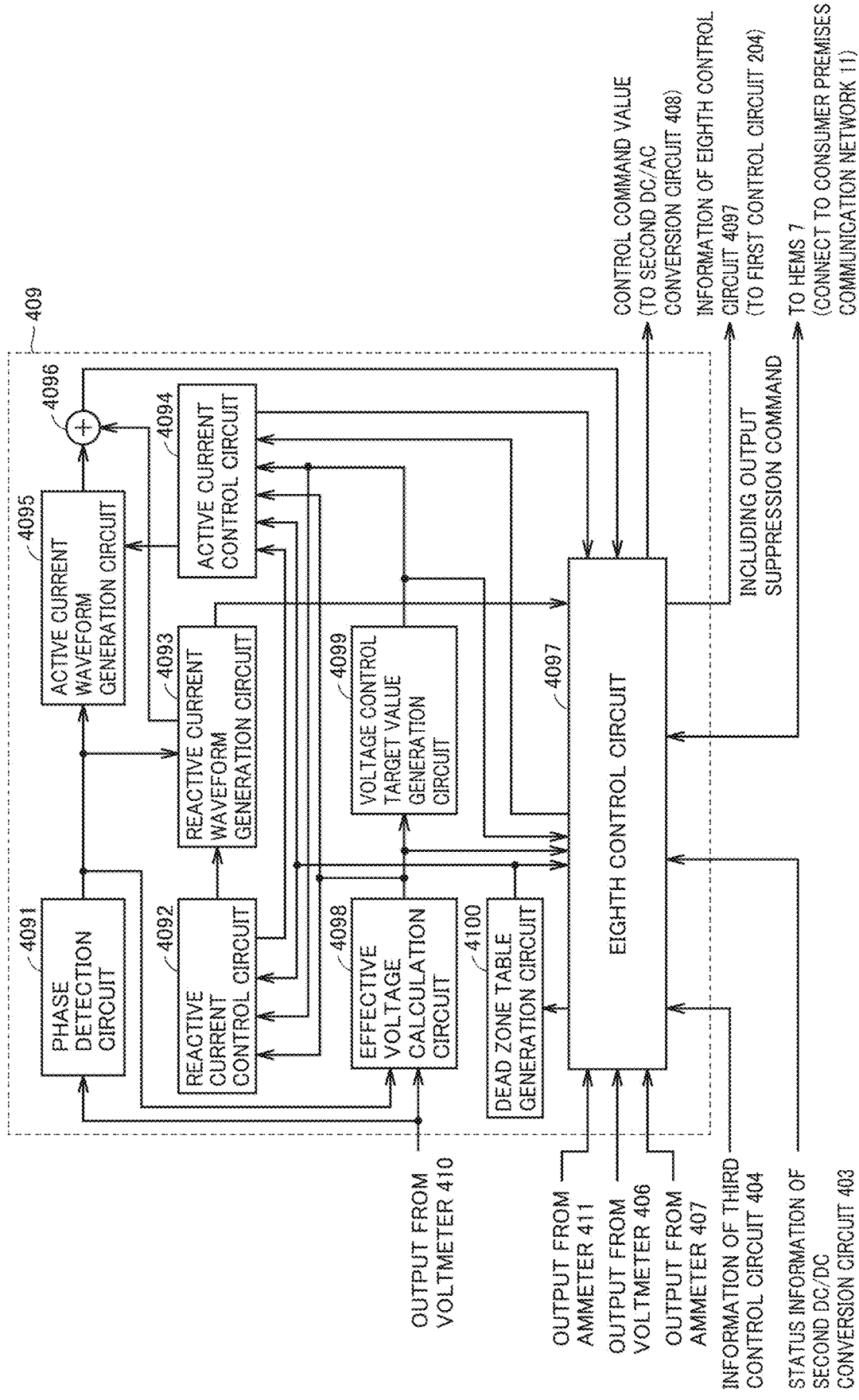
FIG. 7 is a block diagram illustrating a configuration of a fourth control circuit that controls a second DC/AC conversion circuit in the storage battery power conversion device.

FIG. 7 is a block diagram illustrating a configuration of fourth control circuit 409 that controls second DC/AC conversion circuit 408 in storage battery power conversion device 4.

Referring to FIG. 7, fourth control circuit 409 includes a phase detection circuit 4091, a reactive current control circuit 4092, a reactive current waveform generation circuit 4093, an active current control circuit 4094, an active current waveform generation circuit 4095, an adder 4096, an eighth control circuit 4097, an effective voltage calculation circuit 4098, a voltage control target value generation circuit 4099, and a dead zone table generation circuit 4100.

Phase detection circuit 4091 detects a phase from the AC voltage waveform measured by voltmeter 410. Reactive current control circuit 4092 generates an amplitude command of the reactive current output from second DC/AC conversion circuit 408 based on the effective voltage of the AC voltage in the distribution system that is output from effective voltage calculation circuit 4098, the voltage control target value generated by voltage control target value generation circuit 4099 (consumer premises distribution system 10), and the dead zone width information generated by dead zone table generation circuit 4100. The details of reactive current control circuit 4092 will be described later.

Reactive current waveform generation circuit 4093 generates a reactive current waveform to be output from second DC/AC conversion circuit 408, based on the phase detection information about the AC voltage output from phase detection circuit 4091 and the amplitude command value generated by reactive current control circuit 4092.

Active current control circuit 4094 generates an amplitude command value of the active current to be output from second DC/AC conversion circuit 408, based on the voltage on DC bus 405 measured by voltmeter 406 and notified through eighth control circuit 4097, the current flowing through DC bus 405 and measured by ammeter 407, the AC effective voltage in consumer premises distribution system 10 that is output from effective voltage calculation circuit 4098, the voltage control target value generated by voltage control target value generation circuit 4099 (consumer premises distribution system 10), the reactive current amplitude information output from reactive current control circuit 4092, and the dead zone width information generated by dead zone table generation circuit 4100. Active current waveform generation circuit 4095 generates an active current waveform to be output from second DC/AC conversion circuit 408, based on the phase detection information about the AC voltage output from phase detection circuit 4091 and the amplitude command value generated by active current control circuit 4094.

Adder 4096 adds the reactive current waveform output from reactive current waveform generation circuit 4093 and the active current waveform output from active current waveform generation circuit 4095, to thereby generate an AC current target value to be output from second DC/AC conversion circuit 408. Based on the AC current target value output from adder 4096 and the result of measuring the AC current output from ammeter 411, eighth control circuit 4097 generates a control command value of second DC/AC conversion circuit 408 for controlling the output current from second DC/AC conversion circuit 408 to be set at an AC current target value.

Effective voltage calculation circuit 4098 calculates an AC effective voltage from the AC voltage in consumer premises distribution system 10 that is output from voltmeter 410. Voltage control target value generation circuit 4099 generates a control target value of the AC voltage (AC effective voltage) based on the AC effective voltage output from effective voltage calculation circuit 4098. Dead zone table generation circuit 4100 generates dead zone width information.

At the time of reactive power generation, eighth control circuit 4097 calculates apparent power. When the calculated apparent power exceeds the capacity of second DC/AC conversion circuit 408, eighth control circuit 4097 corrects the AC current target value output from adder 4096 to thereby control the output power (output current) from second DC/AC conversion circuit 408 to become equal to or less than the capacity of second DC/AC conversion circuit 408.

Then, the details of main blocks in FIGS. 5 and 7 will be further described.

Figure 8:
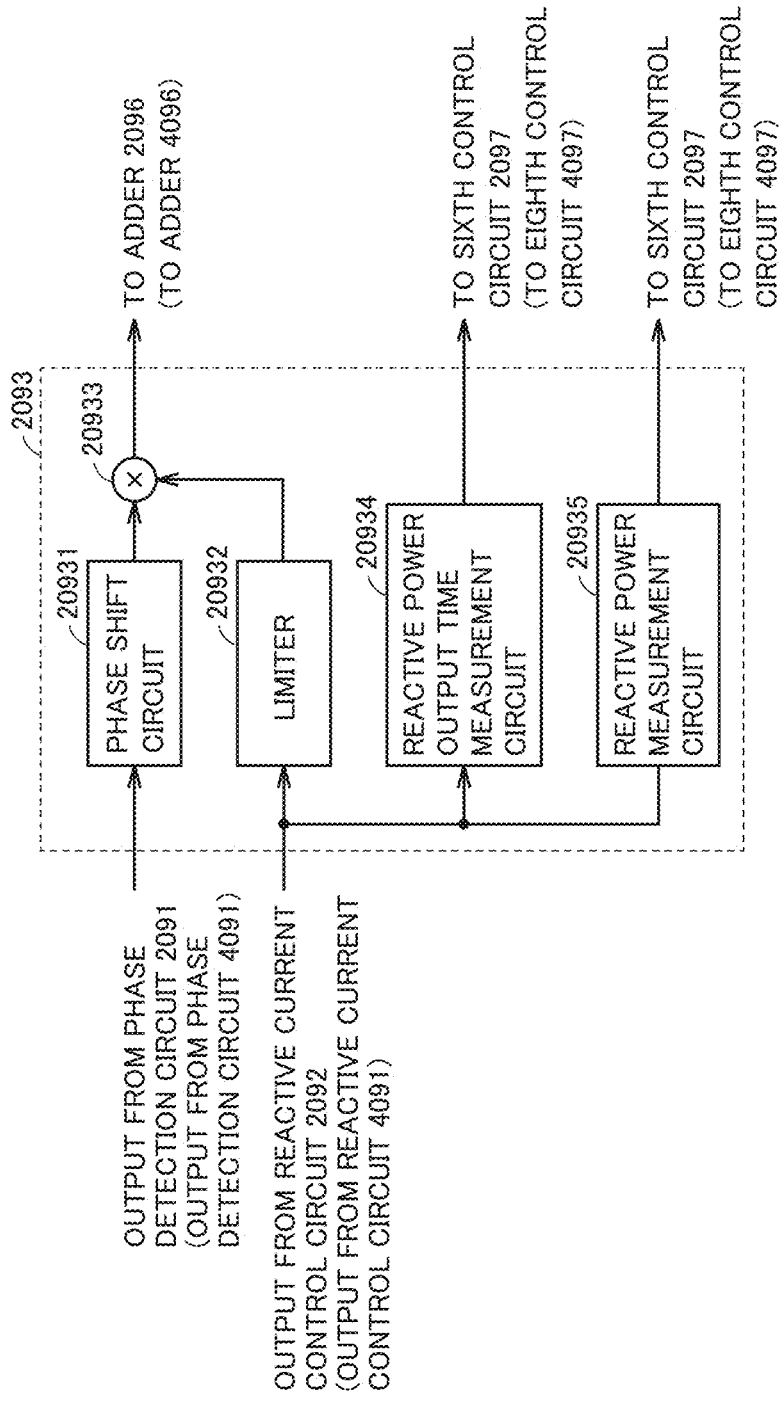
FIG. 8 is a block diagram illustrating a configuration of a reactive current waveform generation circuit shown in FIGS. 5 and 7.

FIG. 8 is a block diagram illustrating configurations of reactive current waveform generation circuits 2093 and 4093 shown in FIGS. 5 and 7, respectively. Since reactive current waveform generation circuits 2093 and 4093 have the same configuration, reactive current waveform generation circuit 2093 will be hereinafter representatively described.

Reactive current waveform generation circuit 2093 includes a phase shift circuit 20931, a limiter 20932, a multiplier 20933, a reactive power output time measurement circuit 20934, and a reactive power measurement circuit 20935.

Phase shift circuit 20931 shifts, by $\pi/2$ (90°), the phase information output from phase detection circuit 2091, to generate a cosine wave (COS waveform) used as a reference when generating a reactive current. Limiter 20932 limits the reactive current amplitude output from reactive current control circuit 2092 so as not to exceed a predetermined upper limit value. When the reactive current amplitude from reactive current control circuit 2092 does not exceed the upper limit value, this reactive current amplitude is not limited by limiter 20932 but is output to multiplier 20933 as it is. On the other hand, when the reactive current amplitude from reactive current control circuit 2092 exceeds the upper limit value, limiter 20932 outputs the above-mentioned upper limit value to multiplier 20933. Multiplier 20933 multiplies the reference cosine wave (COS waveform) output from phase shift circuit 20931 by the amplitude information about the reactive current having passed through limiter 20932, to generate a reactive current command value.

Reactive power output time measurement circuit 20934 measures the output time of the reactive power based on the amplitude information about the reactive current output from reactive current control circuit 2092. Reactive power measurement circuit 20935 measures the reactive power output from first DC/AC conversion circuit 208 based on the amplitude information about the reactive current output from reactive current control circuit 2092.

Figure 9:
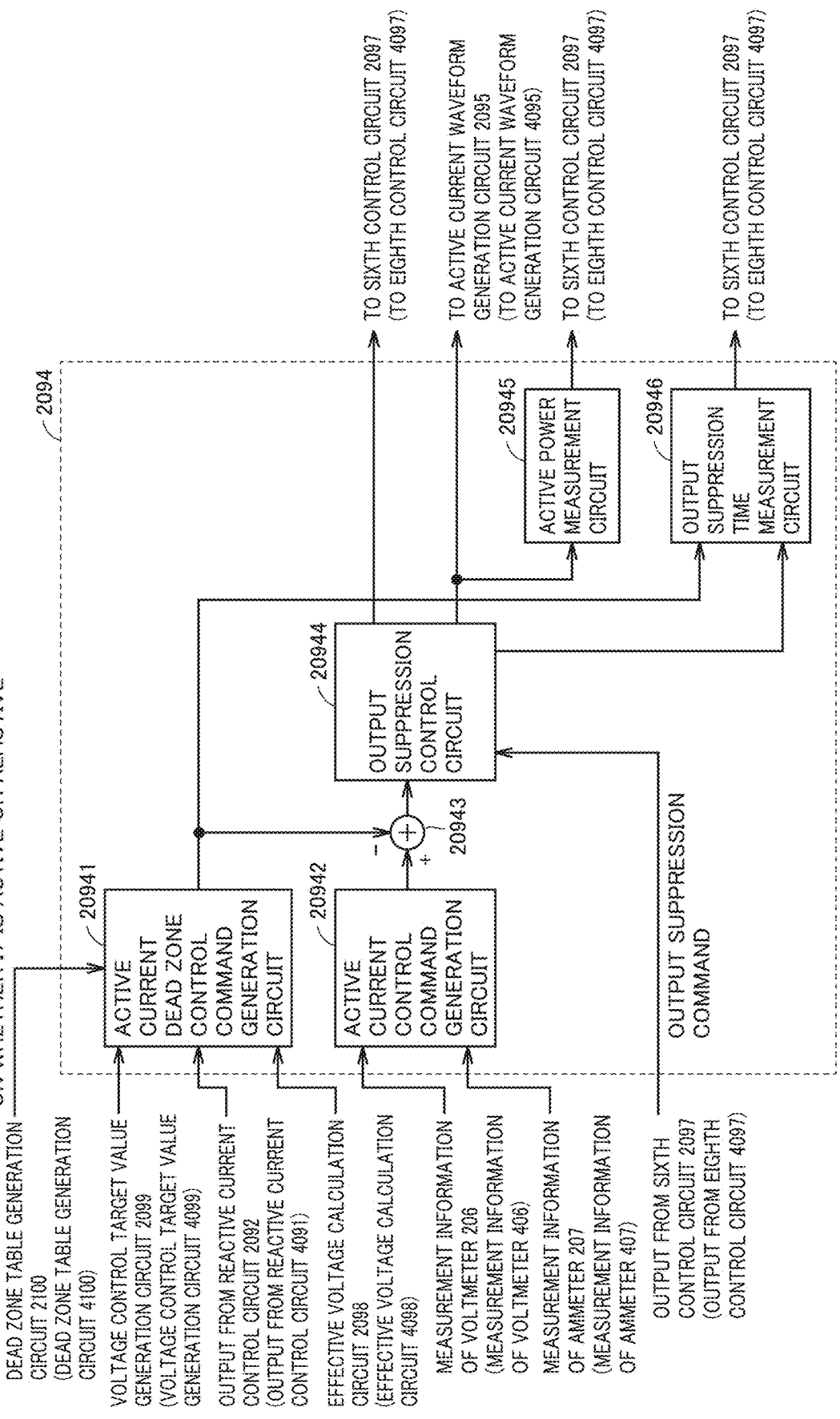
FIG. 9 is a block diagram illustrating a configuration of an active current waveform generation circuit shown in FIGS. 5 and 7.

FIG. 9 is a block diagram illustrating configurations of active current generation circuits 2094 and 4094 shown in FIGS. 5 and 7, respectively. Since active current control circuits 2094 and 4094 have the same configuration, active current control circuit 2094 will be hereinafter representatively described.

Referring to FIG. 9, active current control circuit 2094 includes an active current dead zone control command generation circuit 20941, an active current control command generation circuit 20942, a subtractor 20943, an output suppression control circuit 20944, an active power measurement circuit 20945, and an output suppression time measurement circuit 20496.

Active current dead zone control command generation circuit 20941 generates a command value for suppressing the active power based on the voltage control target value output from voltage control target value generation circuit 2099, the reactive current amplitude information output from reactive current control circuit 2092, the effective voltage calculation result output from effective voltage calculation circuit 2098, and the dead zone width information output from dead zone table generation circuit 2100. Active current control command generation circuit 20942 generates an active current command value for controlling the active power based on the measurement result by voltmeter 206 and the measurement result by ammeter 207 that are input through sixth control circuit 2097.

Subtractor 20943 subtracts the output of active current dead zone control command generation circuit 20941 from the output of active current control command generation circuit 20942 to thereby generate an active current command value. Based on the output suppression command output from sixth control circuit 2097, output suppression control circuit 20944 suppresses the active current command value output from subtractor 20943 when suppression of the output power is required. This output suppression command is notified from distribution automation system 25 through CEMS 15 and HEMS 7.

Active power measurement circuit 20945 measures the active power amount based on the active current command value that has passed through output suppression control circuit 20944. Based on the output from active current dead zone control command generation circuit 20941 and the output from output suppression control circuit 20944, output suppression time measurement circuit 20946 measures the time during which the output of active power is suppressed.

Figure 10:
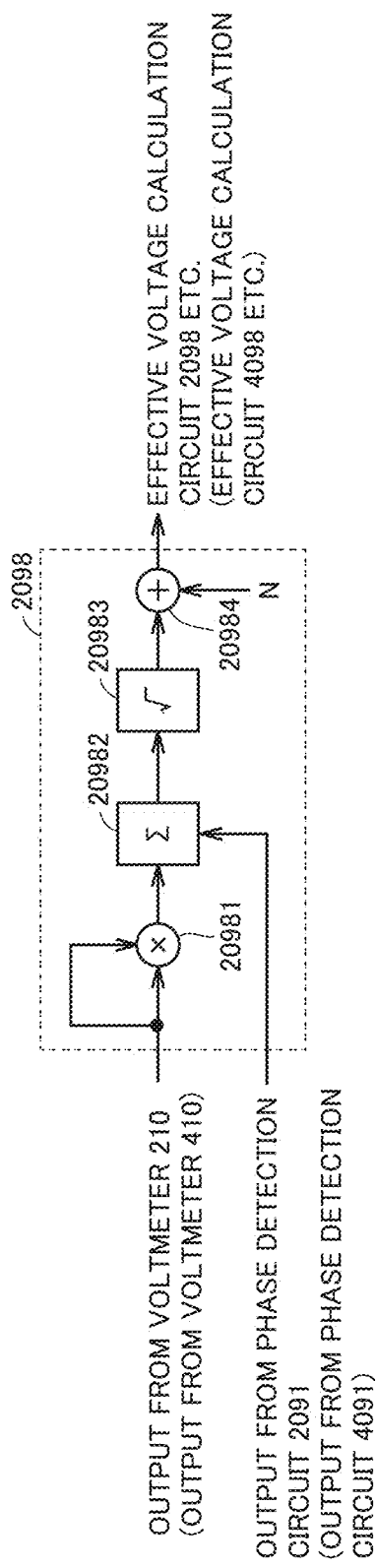
FIG. 10 is a block diagram illustrating a configuration example of an effective voltage calculation circuit shown in FIGS. 5 and 7.

FIG. 10 is a block diagram illustrating configuration examples of effective voltage calculation circuits 2098 and 4098 shown in FIGS. 5 and 7, respectively. Since effective voltage calculation circuits 2098 and 4098 have the same configuration, effective voltage calculation circuit 2098 will be hereinafter representatively described.

Referring to FIG. 10, effective voltage calculation circuit 2098 includes a multiplier 20981, an integrator 20982, a square root calculator 20983, and a divider 20984.

Multiplier 20981 multiplies the measurement values of the AC voltages in the consumer premises distribution system by voltmeter 210 to calculate a voltage square value. The output from multiplier 20981 is input into integrator 20982. Thereby, a total sum of the voltage square values is calculated. Specifically, based on the phase detection information output from phase detection circuit 2091, for example, in each one cycle of the distribution AC system, the total sum calculated by integrator 20982 is latched into a register (not shown) and the integrated value is reset to zero.

The output from integrator 20982 (i.e., the register output (not shown)) is input into square root calculator 20983 to calculate the square root of the total sum of the voltage square values. Furthermore, divider 20984 divides the output value from square root calculator 20983 by an integration sample number N (N: natural number) obtained by integrator 20982 and corresponding to one cycle period of the distribution AC system. As a result, the output value from divider 20984 corresponds to the AC effective voltage in consumer premises distribution system 10.

Figure 11:
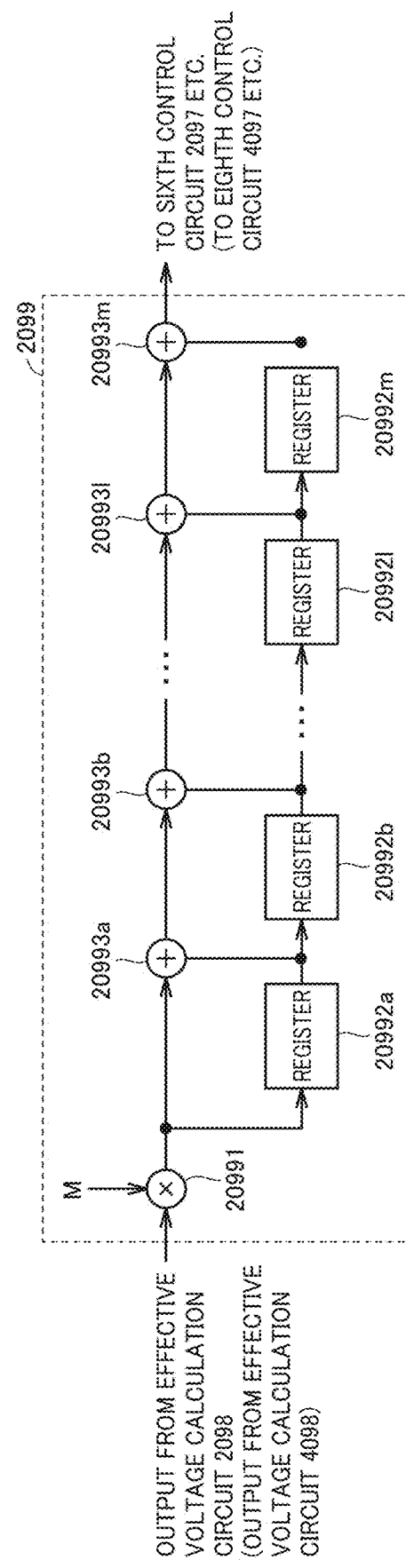
FIG. 11 is a block diagram illustrating a configuration of a voltage control target value generation circuit shown in FIGS. 5 and 7.

FIG. 11 is a block diagram illustrating configurations of voltage control target value generation circuits 2099 and 4099 shown in FIGS. 5 and 7, respectively. Since voltage control target value generation circuits 2099 and 4099 have the same configuration, voltage control target value generation circuit 2099 will be hereinafter representatively described.

Referring to FIG. 11, voltage control target value generation circuit 2099 includes a multiplier 20991, registers 20992$a$ to 20992$m$ in a plurality of stages, and adders 20993$a$ to 20993$m$ in a plurality of stages, which form a finite impulse response (FIR) filter.

Voltage control target value generation circuit 2099 receives an input of the AC effective voltage in consumer premises distribution system 10 that is calculated by effective voltage calculation circuit 2098, and calculates the moving average value of the AC effective voltage. For example, in the first embodiment, the moving average value for 1 minute is calculated. The moving average value of the AC effective voltage in consumer premises distribution system 10 that is calculated by voltage control target value generation circuit 2099 is transmitted as a voltage control target value in consumer premises distribution system 10 to active current control circuit 2094 and sixth control circuit 2097.

The present first embodiment is described with regard to the case where solar cell 1 that harnesses natural energy is used as an "energy creation device" as illustrated in FIG. 1, but the present disclosure is not limited thereto, and a fuel cell, a wind power generation facility and the like may also be used, for example. Alternatively, a combination of solar cell 1 and another energy creation device may be disposed as an "energy creation device" in a consumer.

Storage battery 3 as an "energy storage device" will be described with regard to the case where a fixed stationary battery is used, but the present disclosure is not limited thereto, and an on-vehicle battery for an electric vehicle may be used as a storage battery, for example. Alternatively, a combination of the stationary battery and the on-vehicle battery may be used as an "energy storage device". Furthermore, when a lithium-ion battery is used, strictly speaking, a battery management unit incorporated in the battery side manages the power storage amount, the possibility of charge and discharge, the maximum charge current during charging, and the like, and notifies third control circuit 404 about the management results. For simplifying the description, the present embodiment will be described assuming that third control circuit 404 collectively manages the power storage amount, the possibility of charge and discharge, the maximum charge current during charging, and the like. Furthermore, for simplifying the description, the present embodiment will be described assuming that various types of control functions exercised by the respective blocks shown in block diagrams in FIGS. 3 to 11 are executed by hardware, but the control functions described in the present embodiment do not necessarily need to be implemented only by hardware, as will be described later.

The following is an explanation about a specific operation of the power conversion device in the first embodiment.

Again referring to FIG. 1, an explanation will be given with regard to the case where, in a smart town equipped with a distributed power supply system to which the power conversion device according to the first embodiment is applied, each consumer house 18 is provided as a ZEH house, and solar cell 1 (for example, having a capacity of about 4 kW to 6 kW) is installed in each house. In this case, a so-called "mega solar" system is formed in the entire smart town.

For each consumer house 18, electric power is supplied from pole-mounted transformer 9 through smart meter 8 to consumer premises distribution system 10. Furthermore, CEMS 15 is connected to HEMS 7 through outside premises communication network 13. The following is an explanation about system voltage stabilization control of consumer premises distribution system 10 using the power conversion device constituted of solar cell power conversion device 2 and storage battery power conversion device 4.

Again referring to FIG. 2, when HEMS 7 is started, HEMS 7 checks the statuses of various load devices such as solar cell power conversion device 2, storage battery power conversion device 4, heat storage device 51, and air conditioner 52, which are connected to consumer premises communication network 11. In this case, when CEMS 15 notifies each conversion device about the target voltage information, the threshold voltage (dead zone width information) and the like for control, HEMS 7 processes part of the information and notifies solar cell power conversion device 2 and storage battery power conversion device 4 about the processed information through consumer premises communication network 11.

As a protocol of consumer premises communication network 11, Echonet Light (registered trademark) can be used. As a physical layer, Ethernet (registered trademark) can be used. It is to be noted that the protocol of consumer premises communication network 11 is not limited to Echonet Light, but other protocols or original protocols may be applicable.

Similarly, an applicable physical layer is also not limited to Ethernet but may be a wireless network such as Wi-SUN (Wireless Smart Utility Network) or specified low power radio, a power line communication (PLC) network using electric-light wiring, an optical network, or the like.

Furthermore, outside premises communication network 13 connects between CEMS 15 and HEMS 7. Transmission and reception of the information between CEMS 15 and HEMS 7 will be described later. After checking the status of each device, HEMS 7 monitors the operation of each device. Specifically, the measurement values of the electric power consumed by each device, the electric power generated by solar cell 1 and the charge/discharge power of storage battery 3 are monitored. Furthermore, upon reception of a command from CEMS 15, HEMS 7 gives an instruction to each device according to the command. Alternatively, HEMS 7 transmits various types of measurement values (power consumption amount and the like) and the status information to CEMS 15.

The following is an explanation about a specific operation principle of stabilization control for the system voltage in distribution system 14 (on the secondary side of the pole-mounted transformer) by the power conversion device according to the first embodiment.

When the amount of electric power generated by the distributed power supply such as solar cell 1 increases and the AC voltage (the AC effective voltage) in distribution system 14 that corresponds to an interconnection point with the consumer premises rises, reactive power is output from solar cell power conversion device 2, and thereby, a rise in AC voltage (AC effective voltage) can be suppressed. Thus, solar cell power conversion device 2 is configured to have a function of monitoring the AC effective voltage value of the AC voltage in consumer premises distribution system 10, and outputting reactive power when the AC effective voltage value rises.

Figure 12:
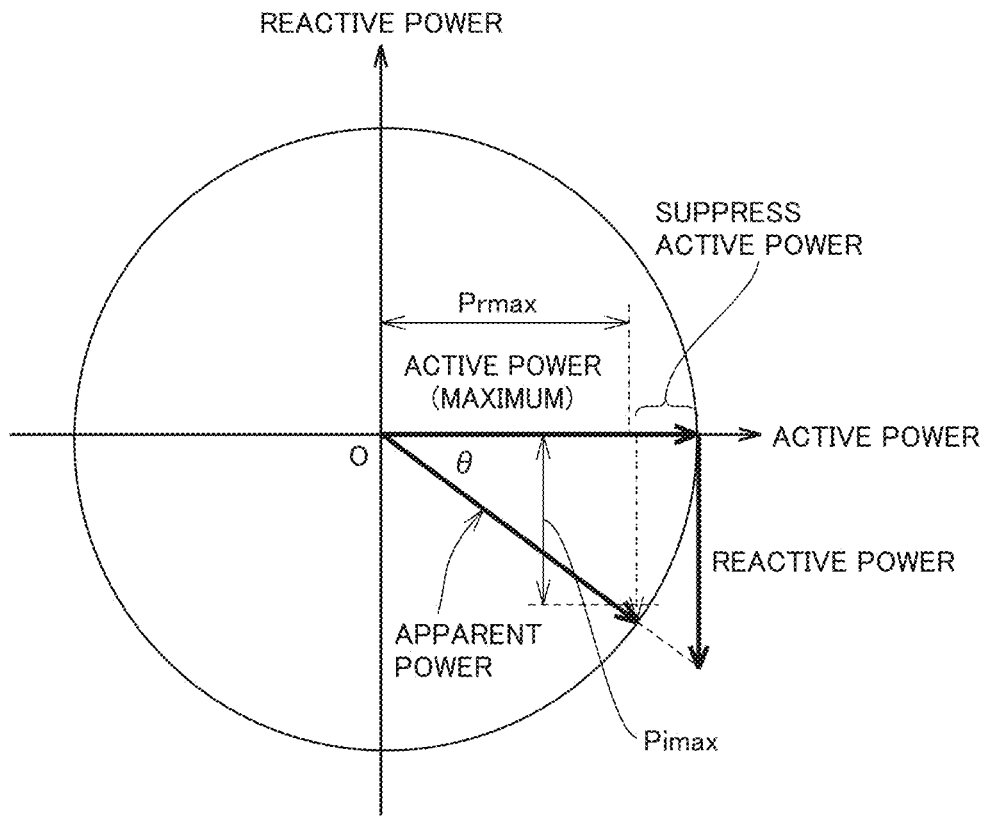
FIG. 12 is a conceptual diagram illustrating the principle of system voltage stabilization control for suppressing a rise in AC effective voltage value by output of a reactive current.

FIG. 12 shows a circle graph for illustrating the principle of system voltage stabilization control for suppressing a rise in AC effective voltage value by output of the reactive current.

Referring to FIG. 12, the circle graph having an origin point 0 at its center has a horizontal axis representing active power (or an active current) and a vertical axis representing reactive power (or a reactive current). In general, the capacity (the maximum power or the maximum current that can be output) of solar cell power conversion device 2 connected to solar cell 1 is often equal to the maximum electric power generated by solar cell 1. For example, when 4-kW solar cell 1 is installed, solar cell power conversion device 2 is also generally designed to have a capacity of 4 kW.

The circle graph in FIG. 12 shows the maximum electric power (equivalent to the radius of the circle graph) that can be output from solar cell power conversion device 2. In other words, solar cell power conversion device 2 can supply electric power in a range inside the circle graph to consumer premises distribution system 10.

The circle graph in FIG. 12 will be hereinafter further described. For example, when reactive power is zero, solar cell power conversion device 2 can output the maximum electric power generated by solar cell 1. The output power in this case is equivalent to the magnitude of the vector represented as active power (maximum) in FIG. 12.

However, when reactive power is output for suppressing a rise of the system voltage in the state where solar cell 1 generates maximum electric power, the end point of the vector to which reactive power and active power are added is located on the outside of the circle graph as shown in FIG. 12. Such electric power cannot be output from solar cell power conversion device 2.

Thus, when the reactive power is output, the reactive power needs to be added in the state where the output of active power is suppressed as shown in FIG. 12. The Grid-interconnection Code specifies that the power factor is 0.85 or more. Thus, θ in FIG. 12 represents a phase difference between the active power and the reactive power in which cos θ=0.85. Thus, the maximum value (Pimax in FIG. 12) of the reactive power that can be output from solar cell power conversion device 2 is a product of the rated capacity of solar cell power conversion device 2 and sine.

In the present first embodiment, when solar cell power conversion device 2 needs to suppress the active power in order to output the reactive power, the reactive power is output not from solar cell power conversion device 2 but from storage battery power conversion device 4, thereby suppressing a rise in AC voltage in distribution system 14 (consumer premises distribution system 10). Thereby, system voltage stabilization control by the output of reactive power is performed in the state where the electric power generated by solar cell 1 is ensured to the maximum extent.

Specifically, when the electric power generated by solar cell 1 is equal to or less than 85% of the rated power (the maximum output power) of solar cell power conversion device 2, the end point of the vector sum of the active power and the reactive power falls inside the circle graph in FIG. 12 even if solar cell power conversion device 2 outputs reactive power. Thus, the electric power generated by solar cell 1 is not suppressed. In this case, solar cell power conversion device 2 outputs reactive power to thereby perform system voltage stabilization control.

On the other hand, when the electric power generated by solar cell 1 exceeds 85% of the rated power (maximum output power) of solar cell power conversion device 2, generation of reactive power by solar cell power conversion device 2 may cause the end point of the vector sum of active power and reactive power to exist on the outside of the circle graph in FIG. 12. In this case, in order to avoid suppression of the active power of solar cell power conversion device 2, i.e., the amount of electric power generated by solar cell 1, storage battery power conversion device 4 is controlled so as to output the reactive power within the range to the rated power (maximum output power) of storage battery power conversion device 4, thereby executing system voltage stabilization control.

In this way, the reactive power for system voltage stabilization control is basically output from solar cell power conversion device 2 except for the case where suppression of the electric power (active power) generated by solar cell 1 is required. This allows suppression of power consumption as will be described below.

For example, when solar cell 1 generates sufficient electric power and storage battery 3 is in a fully-charged state, storage battery power conversion device 4 is set in a standby mode (an operation mode in which almost no standby power occurs) in order to suppress its own power consumption, and thus, stops charging and discharging. Assuming that storage battery power conversion device 4 in this state is started to generate reactive power, also in the standby mode, it becomes necessary to supply electric power to a relay circuit (not shown) disposed between storage battery 3 and storage battery power conversion device 4, and between consumer premises distribution system 10 and storage battery power conversion device 4, and also to supply electric power to third control circuit 404 and fourth control circuit 409 that control storage battery power conversion device 4. This leads to a concern that the standby power may increase. Furthermore, also when storage battery power conversion device 4 in a standby state is used, second DC/AC conversion circuit 408 is operated for generating reactive power, which causes switching loss and conduction loss, thereby unnecessarily consuming electric power.

Thus, when the generated electric power output from solar cell 1 is not suppressed, the reactive power is controlled to be output from solar cell power conversion device 2 prioritized over storage battery power conversion device 4, thereby allowing system voltage stabilization control to be performed without causing the above-mentioned unnecessary power consumption.

On the other hand, when the electric power generated by solar cell 1 is equal to or greater than a predetermined reference value, storage battery power conversion device 4 is started to generate reactive power, thereby suppressing a rise in AC effective voltage of consumer premises distribution system 10. Thereby, the reactive power for suppressing a rise in AC effective voltage can be output without unnecessarily suppressing the generated electric power output from the energy creation device such as solar cell 1. For example, when the power factor is set to be 0.85 or more as described above, the above-mentioned reference value can be set in accordance with the numerical value that is 0.85 times as high as the rated power of solar cell power conversion device 2 in consideration of errors in measurement devices such as a voltmeter and an ammeter, and loss in solar cell power conversion device 2, and the like.

By suppressing the voltage rise in consumer premises distribution system 10 by system voltage stabilization control by solar cell power conversion device 2 and/or storage battery power conversion device 4, the voltage rise in distribution system 14 (on the secondary side of the pole-mounted transformer) can also be suppressed. In other words, the above-mentioned system voltage stabilization control can stabilize the voltage in each of consumer premises distribution system 10 and distribution system 14. In this way, by the distributed power supply system disposed in each consumer house, the voltage rise in distribution system 14 can be suppressed, without having to provide distribution system 14 with expensive distribution system stabilization facilities such as SVC and a system storage battery, or while reducing distribution system stabilization in capacity, so that the cost can be reduced.

Furthermore, although the first embodiment is described with regard to system voltage stabilization control targeting the AC voltage in consumer premises distribution system 10, if measurable, any AC voltage in other parts, for example, the AC voltage on the input side of smart meter 8 or directly below pole-mounted transformer 9 can also be targeted for system voltage stabilization control.

In the first embodiment, a dead zone described below is set as a condition for starting the above-described system stabilization control. In the first embodiment, solar cell power conversion device 2 and storage battery power conversion device 4 are operated without directly exchanging information with each other through a communication line. Thus, HEMS 7 processes the dead zone width information received from CEMS 15, and notifies solar cell power conversion device 2 and storage battery power conversion device 4 about the processed information.

Figure 13:
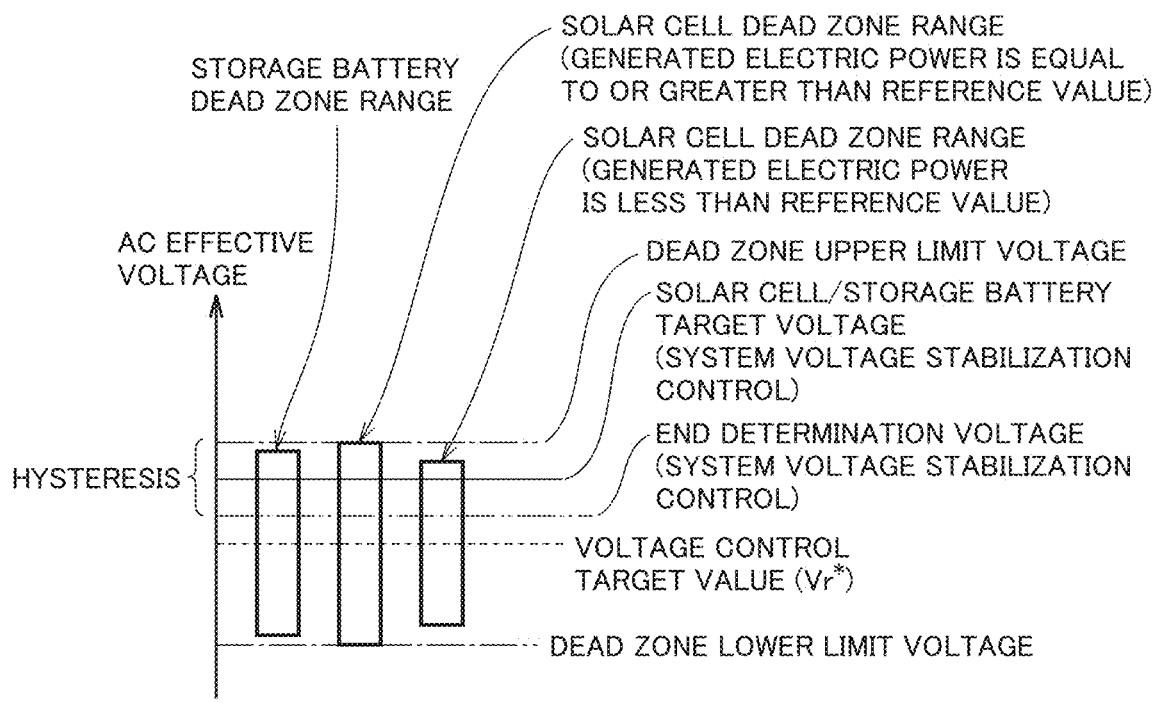
FIG. 13 is a conceptual diagram illustrating an example of dead zone width information notified to the solar cell power conversion device and the storage battery power conversion device.

FIG. 13 is a conceptual diagram illustrating an example of the dead zone width information notified to solar cell power conversion device 2 and storage battery power conversion device 4. The vertical axis in FIG. 13 shows an AC effective voltage in consumer premises distribution system 10 as a target of system voltage stabilization control.

A broken line in FIG. 13 represents a voltage control target value output from voltage control target value generation circuit 2099 (equivalent to the moving average value of the AC effective voltage in consumer premises distribution system 10 as described above). Furthermore, a dashed-dotted line represents a dead zone upper limit voltage and a dead zone lower limit voltage that are generated from the dead zone width information notified from CEMS 15.

In the first embodiment, when the AC effective voltage deviates from the dead zone upper limit voltage, HEMS 7 processes the range of the dead zone such that "the dead zone width in the case where electric power generated by solar cell 1 is less than a reference value"<"the dead zone width of storage battery 3"<"the dead zone width in the case where electric power generated by solar cell 1 is equal to or greater than the reference value". Each dead zone width information thus processed is notified from HEMS 7 to solar cell power conversion device 2 (two types of notifications) and storage battery power conversion device 4.

The reference value of generated electric power is 0.85 times as high as the rated power in the first embodiment. The relation of the dead zone width is not limited to the above. By the setting as described above, when the electric power generated by solar cell 1 is less than the reference value, solar cell power conversion device 2 starts system voltage stabilization control (reactive power output), and when solar cell 1 generates electric power equal to or greater than the reference value, storage battery power conversion device 4 starts system voltage stabilization control (reactive power output). The details of the operation will be described later.

Then, the operation principle of the power conversion device in the first embodiment will be described with reference to FIG. 1 and FIGS. 14 to 16. In the first embodiment, for an abrupt change in the electric power generated by an energy creation device such as solar cell 1, the power conversion device in the distributed power supply installed in each consumer is utilized to stabilize the system voltage, and the voltage fluctuation in a long cycle is regulated by tap changing of automatic voltage regulator (SVR) 23 installed in distribution system 16 (on the primary side of the pole-mounted transformer) as in the conventional case.

Figure 14:
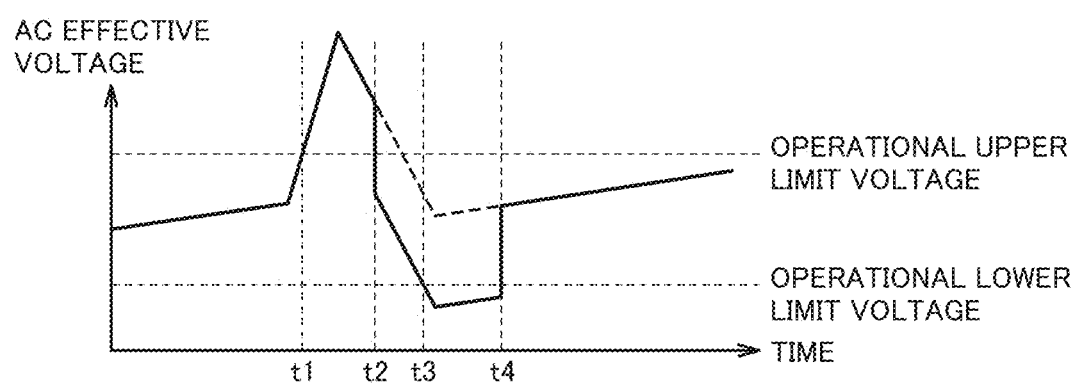
FIG. 14 is a conceptual diagram for illustrating system voltage control by a step voltage regulator (SVR) (an automatic voltage regulator).

First, referring to FIG. 14, the operation image of the system voltage control by SVR (automatic voltage regulator) will be described. FIG. 14 shows a horizontal axis representing a time axis and a vertical axis representing the AC effective voltage in consumer premises distribution system 10 that is measured by power measurement circuit 61 in power switchboard 6.

When the AC effective voltage (distribution system voltage) in distribution system 16 (on the secondary side of pole-mounted transformer 9) deviates from the upper limit voltage or the lower limit voltage of the operational voltage of SVR 23 in distribution system 16 for a predetermined time period (for example, about 60 seconds), automatic voltage regulator (SVR) 23 shown in FIG. 1 is controlled to perform tap changing so as to automatically regulate the distribution system voltage to an appropriate value. For example, the operational voltage range of this SVR 23 can be set to be ±1.5% (6600V±100V) of the distribution system voltage (6600V).

FIG. 14 shows a dotted line representing the voltage obtained by converting the operational upper limit voltage and the operational lower limit voltage of the distribution system voltage for SVR 23 into an AC voltage of consumer premises distribution system 10. The following description will be made assuming that, when the AC effective voltage in consumer premises distribution system 10 rises above the operational upper limit voltage in the figure, the distribution system voltage also rises above the SVR operational upper limit voltage, and similarly, when the AC effective voltage in consumer premises distribution system 10 decreases below the operational lower limit voltage in the figure, the distribution system voltage also decreases below the SVR operational lower limit voltage.

Referring to FIG. 14, as the electric power generated by solar cell 1 installed in a town steeply rises due to an abrupt change of solar radiation, the AC effective voltage in consumer premises distribution system 10 rises. Due to a voltage rise in consumer premises distribution system 10, the distribution system voltage also rises. When the distribution system voltage exceeds the SVR operational upper limit voltage at time t1, SVR 23 performs tap changing for lowering the distribution system voltage at time t2 at which a predetermined time period (60 seconds) has elapsed since time t1. Thereby, the distribution system voltage decreases while the AC effective voltage in consumer premises distribution system 10 also decreases. For comparison, FIG. 14 shows a dotted line representing the voltage behavior in the case where tap changing is not performed at time t2.

On the other hand, at this point of time, the amount of solar radiation returns to its original amount, and thereby, the electric power generated by solar cell 1 is started to decrease, and the AC effective voltage in consumer premises distribution system 10 continues to gradually decrease also after it decreases by tap changing by SVR 23. Also, the distribution system voltage decreases. As a result, at time t3, the distribution system voltage decreases below the SVR operational lower limit voltage. Thus, at time t4 at which a predetermined time period (60 seconds) has elapsed since time t3, SVR 23 performs tap changing for raising the distribution system voltage. As a result, the tap by SVR 23 is set similarly to the tap to time t2. Thus, at and after time t4, the distribution system voltage and the AC effective voltage in consumer premises distribution system 10 shift in the same manner as in the case where tap changing is not performed at time t2.

In this way, when the distribution system voltage changes as the AC effective voltage in consumer premises distribution system 10 changes in accordance with the change in the electric power generated by solar cell 1, the distribution system voltage is statically set by tap changing of SVR 23 to fall within the SVR operational voltage range (the SVR operational lower limit voltage to the SVR operational upper limit voltage). On the other hand, in a control example in FIG. 14, SVR 23 performs two tap changing operations in a short time period in accordance with the change in amount of solar radiation, which may lead to a concern that the device lifetime of SVR 23 may become shortened. In general, in the distribution system into which no renewable energy or the like is introduced, the above-mentioned tap changing is performed about 20 times to 30 times in one day.

Accordingly, in the first embodiment, system voltage stabilization control by the above-mentioned power conversion device suppresses significant voltage fluctuations in consumer premises distribution system 10, thereby suppressing the number of tap changing by SVR 23, to stabilize the distribution system voltage. For example, as described above, when the operational voltage range of SVR 23 is ±1.5% (6600V±100V) of the distribution system voltage (6600V), the power conversion device (solar cell power conversion device 2 and/or storage battery power conversion device 4) in the distributed power supply on the consumer side is controlled such that the fluctuation width of the distribution system voltage resulting from the fluctuation of the electric power generated by solar cell 1 is suppressed to be narrower than the voltage width in the above-mentioned operational voltage range (for example, equal to or less than ±75V).

Figure 15:
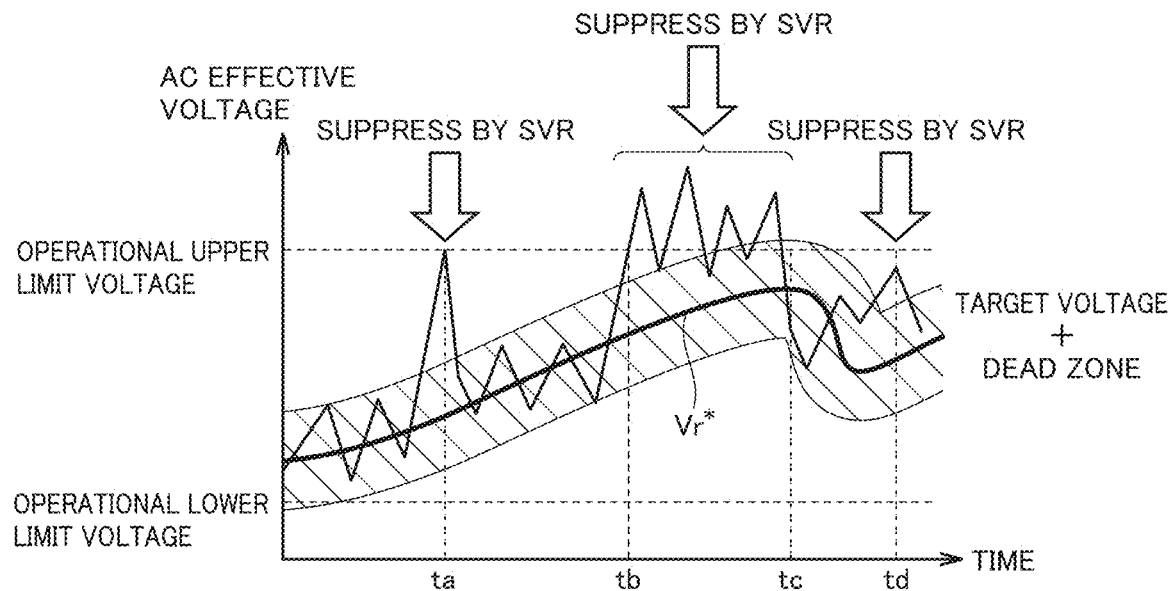
FIG. 15 is a conceptual diagram for illustrating the operation of distribution system voltage stabilization control using the dead zone width information according to the first embodiment of the present disclosure.

The following is an explanation with reference to FIG. 15 about an operation image of system voltage stabilization control utilizing the distributed power supply on the consumer side in the present first embodiment. As in FIG. 14, FIG. 15 shows a horizontal axis representing a time axis and a vertical axis representing the AC effective voltage in consumer premises distribution system 10. The operational upper limit voltage and the operational lower limit voltage of SVR 23 are also similar to those shown in FIG. 14.

Referring to FIG. 15, a voltage control target value Vr* of the AC effective voltage in consumer premises distribution system 10 shown by a thick line in the figure is set in accordance with the moving average value in one minute of the AC effective voltage measured by power measurement circuit 61 in power switchboard 6, as described with reference to FIG. 11. The method of setting voltage control target value Vr* is not limited thereto, but may be calculated by causing the AC effective voltage to pass through a low-pass filter (LPF). On the other hand, the AC effective voltage (an instantaneous value) in consumer premises distribution system 10 shown by a solid line changes sequentially in a shape of a line graph in accordance with a change in amount of solar radiation.

The diagonally shaded region in FIG. 15 shows the voltage range in the dead zone width centering on voltage control target value Vr* of the AC effective voltage at each point of time. When an abrupt change in solar radiation causes the AC effective voltage in consumer premises distribution system 10 to steeply change and thereby deviate from the voltage range of the dead zone width, system voltage stabilization control is performed for suppressing the AC effective voltage in consumer premises distribution system 10 to fall within the range of the dead zone width by control of the active power and the reactive power that are output from the power conversion device (solar cell power conversion device 2 and/or storage battery power conversion device 4).

Furthermore, when the system voltage stabilization control performed by the power conversion device cannot sufficiently suppress the voltage rise or decrease, SVR 23 performs tap changing as the AC voltage of the distribution system voltage (distribution system 16) deviates from the SVR operational voltage range, so that the distribution system voltage can be stabilized. In the example in FIG. FIG. 15, at time ta, time tb to time tc and time td, SVR 23 performs tap changing for suppressing the distribution system voltage, and, at this timing, the AC effective voltage in consumer premises distribution system 10 also decreases.

According to the combination of the system voltage stabilization control by the power conversion device and the tap changing of SVR 23 as shown in FIG. 15, the AC voltages in distribution system 16 and consumer premises distribution system 10 can be stabilized in the state where the number of times of operation (tap changing) by SVR 23 is suppressed, as compared with the case where the system voltage is stabilized only by tap changing of SVR 23 as described with reference to FIG. 14.

Then, a specific operation image will be hereinafter described. The dead zone width information notified from CEMS 15 to the distributed power supplies (solar cell power conversion device 2 and storage battery power conversion device 4) installed in each consumer is received once by HEMS 7, and thereafter, processed for a solar cell and a storage battery, and then notified to solar cell power conversion device 2 and storage battery power conversion device 4. The details will be described later.

Upon reception of the dead zone information from HEMS 7, each of solar cell power conversion device 2 and storage battery power conversion device 4 calculates the upper limit voltage value and the lower limit voltage value of the dead zone width that is not subjected to system voltage stabilization control and shown by diagonal lines in FIG. 15, based on the voltage control target values output from voltage control target value generation circuits 2099 and 4099 and the received dead zone width information.

Then, it is determined whether the AC effective voltage in consumer premises distribution system 10 falls within the range of these calculated upper limit voltage value and lower limit voltage or not. When it is determined that the AC effective voltage does not fall within the range, the system voltage stabilization control is started. A specific process flow will be described later.

Figure 16:
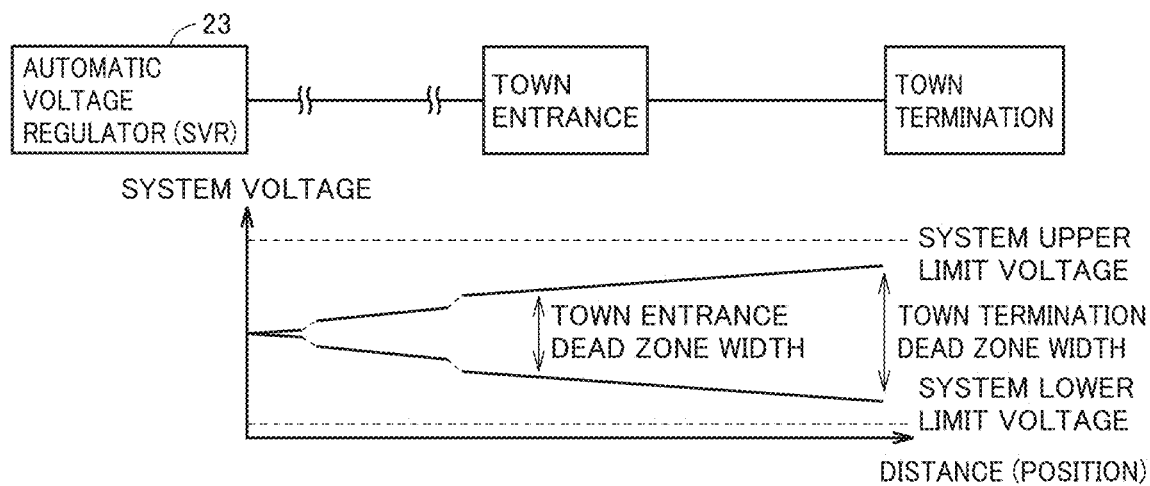
FIG. 16 is a conceptual diagram for illustrating a setting of a dead zone width in accordance with a consumer position in a town according to the first embodiment of the present disclosure.

FIG. 16 is a conceptual diagram for illustrating the setting of the dead zone width in accordance with a position of each consumer in a town. FIG. 16 shows a horizontal axis representing the distance from automatic voltage regulator (SVR) 23 and a vertical axis representing the AC effective voltage in consumer premises distribution system 10.

Referring to FIG. 16, the AC effective voltage in distribution system 14 (on the secondary side of pole-mounted transformer 9) changes in accordance with the position of each consumer. As compared with the entrance of a town, the AC effective voltage rises or lowers at the termination of the town. In other words, in consumer house 18 located at the termination of the town, the fluctuation width of the AC effective voltage in each of distribution system 14 and consumer premises distribution system 10 is relatively large.

Thus, when the distributed power supplies of the consumers are set to have the same dead zone width, the system voltage stabilization control by regulation of the active power and the reactive power is started from the consumer at the town termination at which the fluctuation width (the increasing or decreasing width) of the system voltage is relatively large. Accordingly, the suppression amount of the electric power generated by solar cell 1 is larger than that in the consumer on the entrance side of the town. Alternatively, for example, the power consumption amount increases due to power loss and the like in the power conversion device that occurs when reactive power is output. Thus, unfairness may occur that results from the different number of times of the system voltage stabilization control performed by the power conversion device depending on the position of consumer house 18 in a town. Accordingly, in the present first embodiment, the dead zone width that defines the condition for starting the system voltage stabilization control is changed for each consumer in order to suppress the problems as described above.

Specifically, based on the impedance information about the distribution system from automatic voltage regulator (SVR) 23 to each consumer house 18, the dead zone width is calculated by CEMS 15 such that system voltage stabilization control is started approximately at the same timing for a consumer house 18 at the town entrance and another consumer house 18. As a result, CEMS 15 notifies HEMS 7 of each consumer house 18 about the dead zone width calculated for each consumer house 18.

For example, as shown in FIG. 16, the dead zone width can be set to be narrow on the town entrance side while the dead zone width can be set to be gradually wider toward the town termination at which the fluctuation width of the system voltage is larger. Consequently, even if the distributed power supply of the consumer is connected to any position in the distribution system in the town, system voltage stabilization control can be started approximately at the same timing. Thus, the above-mentioned unfairness caused by the difference in position of consumer house 18 in the town can be suppressed.

Figure 17:
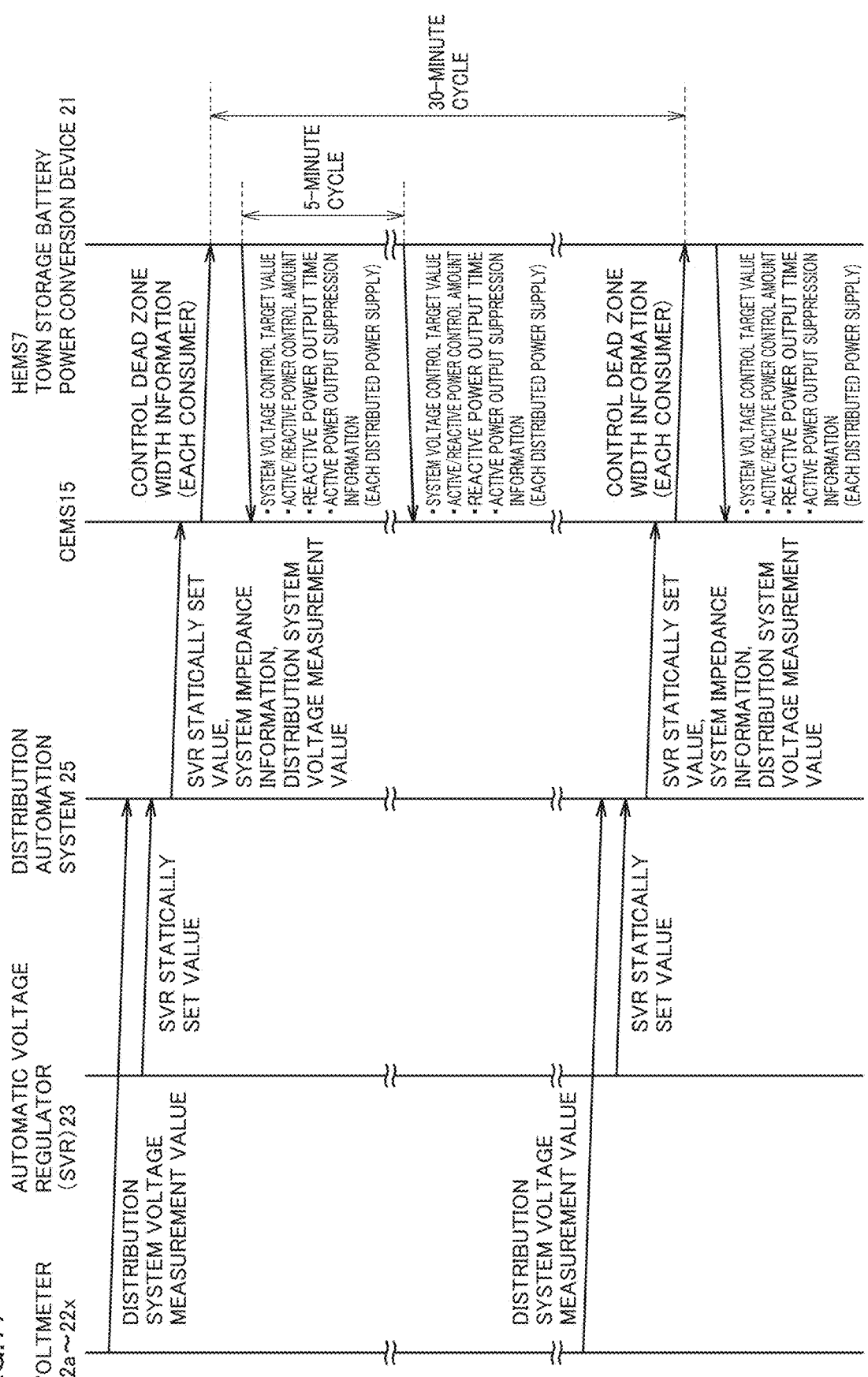
FIG. 17 is a diagram of an operation sequence among various devices involved in system voltage stabilization control according to the first embodiment of the present disclosure.

FIG. 17 is a diagram of the operation sequence among various devices involved in system voltage stabilization control according to the first embodiment of the present disclosure. The following is an explanation with reference to FIG. 17 about the process flow of generation and notification of the dead zone information for system voltage stabilization control centering on CEMS 15.

Referring to FIG. 17, the measurement results (AC effective voltage) by voltmeters 22a to 22x (FIG. 1) disposed in distribution system 16 are collected by distribution automation system 25 in a 30-minute cycle. Also, distribution automation system 25 is notified in a 30-minute cycle about the SVR statically set value of automatic voltage regulator 23 (the winding ratio information about the transformer that is currently used). Furthermore, the distribution system impedance information and the information about voltmeter 22 installed in the distribution system are collected once by distribution automation system 25 and then notified to CEMS 15. It is to be noted that the notification cycle is not limited to 30 minutes, but can be set at an any time length. In addition, different notification cycles may be set between the information related to voltmeter 22 and the information related to automatic voltage regulator (SVR) 23. Also, the information related to SVR 23 is not necessarily notified in a certain cycle, but may be notified for each execution of the above-mentioned tap changing.

Distribution automation system 25 notifies CEMS 15 in a 30-minute cycle about the voltage measurement result by voltmeter 22, the SVR statically set value information of automatic voltage regulator (SVR) 23, and additionally, the impedance information on the distribution system of this distribution automation system 25. On the other hand, CEMS 15 calculates the dead zone width information for each consumer based on: the above-mentioned information transmitted from distribution automation system 25; the system voltage control target value measured in each consumer and transmitted in a 5-minute cycle (specifically, the moving average value in 1 minute of the AC effective voltage value in the distribution system in the present first embodiment); the active and reactive power control amounts of each distributed power supply installed in a consumer (including active power and reactive power); the reactive power output time; and the active power output suppression information (this information is collected by HEMS 7 in a 5-minute cycle from solar cell power conversion device 2, storage battery power conversion device 4, and power measurement circuit 61). Although the method of calculating a dead zone width will not be described in detail, this dead zone width can be calculated by creating an any calculation formula or an any calculation table in advance. The dead zone width information on each consumer calculated by CEMS 15 is notified in a 30-minute cycle to HEMS 7 installed in each consumer house 18.

Furthermore, CEMS 15 calculates the dead zone width information also for town storage battery power conversion device 21 based on the system voltage control target values collected in a 5-minute cycle, the active and reactive power control amounts (including active power and reactive power), the reactive power output time, the active power output suppression information, and various types of information notified from distribution automation system 25. Then, CEMS 15 gives a notification of the calculated information in a 30-minute cycle.

The following is an explanation about the operations of solar cell power conversion device 2, storage battery power conversion device 4, and HEMS 7 with reference to FIGS. 1 to 24.

Figure 18:
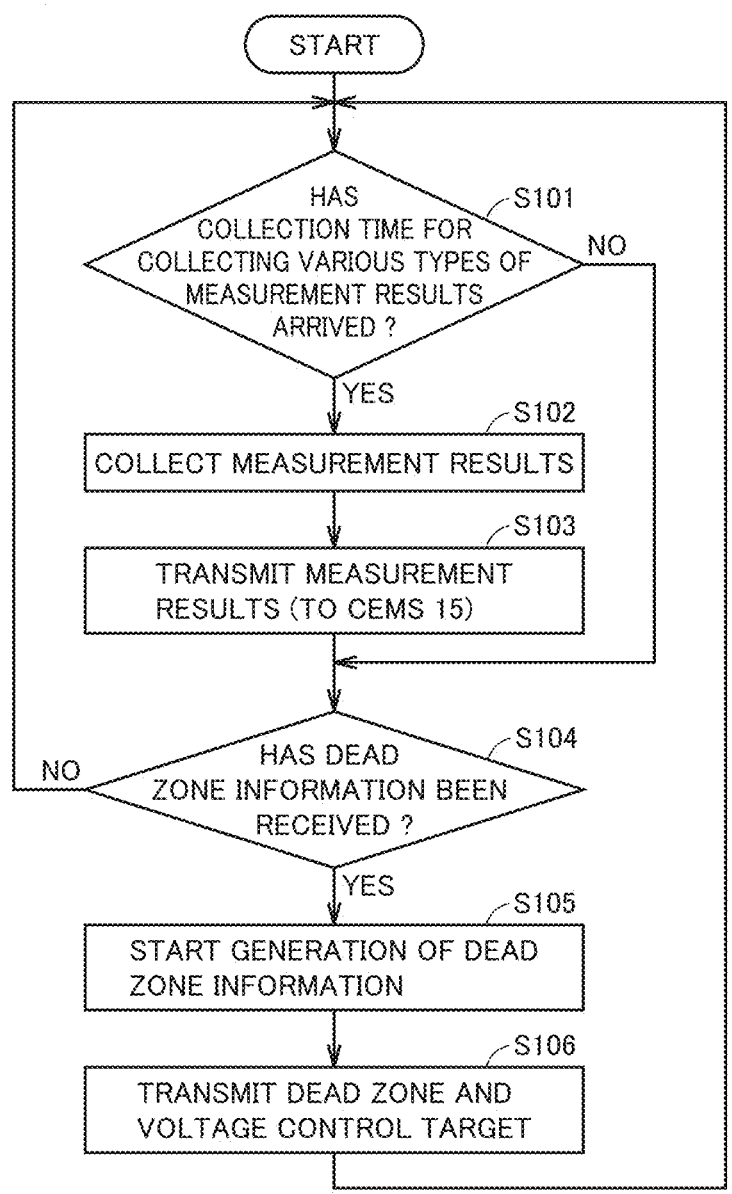
FIG. 18 is a flowchart illustrating a control process of an HEMS 7 related to system voltage stabilization control.

FIG. 18 is a flowchart illustrating a control process of HEMS 7 related to system voltage stabilization control.

Referring to FIG. 18, HEMS 7 checks in step (hereinafter also simply abbreviated as "S") 101 whether the collection time for collecting various types of measurement results (performed in a 5-minute cycle) has arrived or not. When the collection time has arrived (when it is determined as YES in S101), then in S102, HEMS 7 collects various types of measurement results. The results collected from solar cell power conversion device 2 and storage battery power conversion device 4 include: the voltage control target value (target voltage) of each power conversion device generated by voltage control target value generation circuit 2099 (4099); the output time of the reactive power measured by reactive power output time measurement circuit 20934 in reactive current waveform generation circuit 2093 (4093); and the reactive power control amount generated based on the reactive current amplitude information output from reactive current control circuit 2092 (4092). Furthermore, the results collected from power measurement circuit 61 in power switchboard 6 include: the amount of electric power consumed by the load and measured by power measurement circuit 61; the amount of electric power generated by solar cell 1; and the amount of charge/discharge power for storage battery 3 (5 minutes).

When collection of various types of data completes, then in S103, HEMS 7 notifies CEMS 15 through outside premises communication network 13 about the collected measurement results. When the notification to CEMS 15 completes in S103, or when it is determined as NO in S101, then in S104, HEMS 7 checks whether new dead zone information is notified or not from CEMS 15.

When no notification is given (when it is determined as NO in S104), the process is returned to S101. On the other hand, when the dead zone information is notified (when it is determined as YES in S104), then in S105, HEMS 7 generates dead zone width information that is to be notified to solar cell power conversion device 2 and storage battery power conversion device 4.

Figure 19:
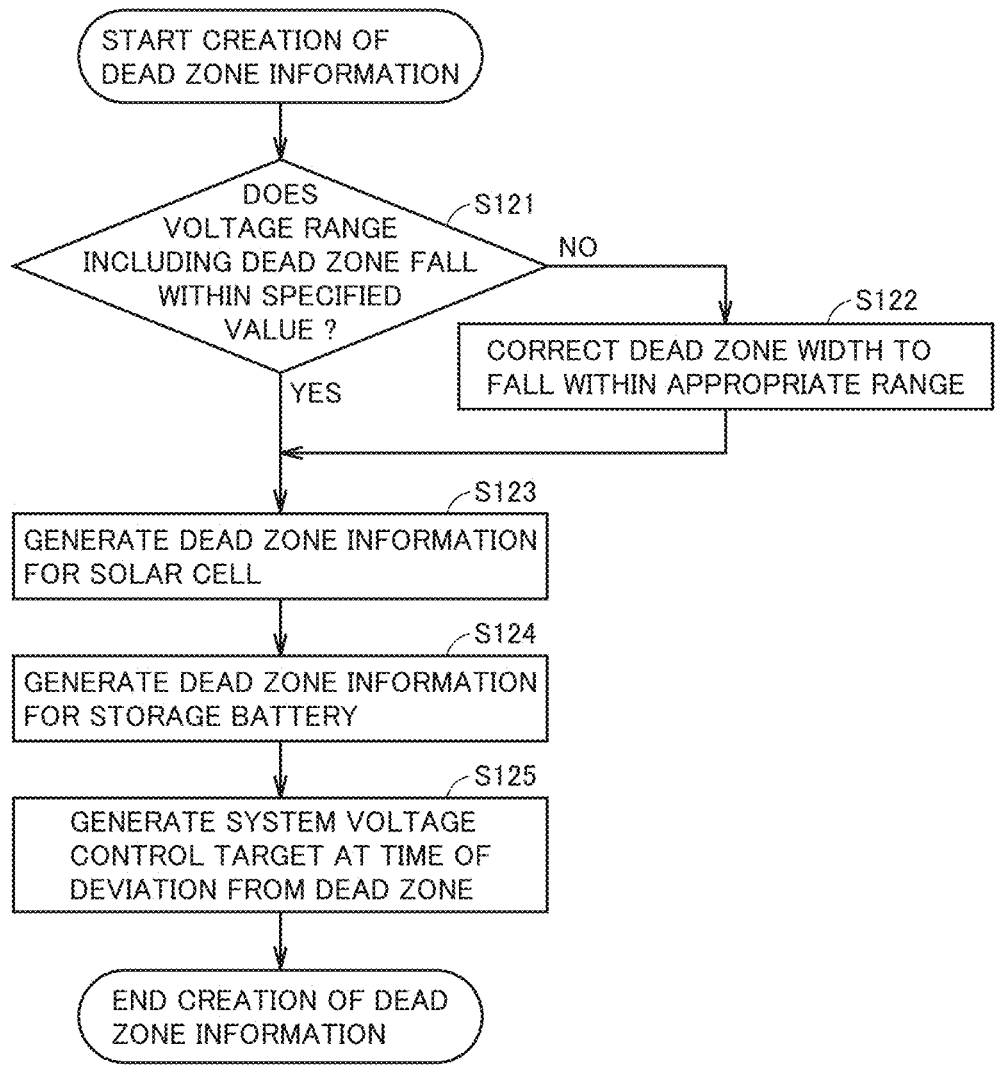
FIG. 19 is a flowchart illustrating details of a control process for generating dead zone width information in FIG. 18.

FIG. 19 is a flowchart illustrating details of the control process for generating dead zone width information in S105 in FIG. 18.

Referring to FIG. 19, when generation of dead zone width information is started, then in S121, HEMS 7 checks whether the voltage range of the dead zone width is appropriate or not. In the present first embodiment, as described with reference to FIG. 15, the voltage control target value in consumer premises distribution system 10 is set in accordance with the moving average value in 1 minute of the AC effective voltage of consumer premises distribution system 10, and therefore, changes as time passes. Thus, when the voltage control target value is close to the upper and lower limit specified values of the system voltage in consumer premises distribution system 10, the dead zone width needs to be corrected.

Figure 20:
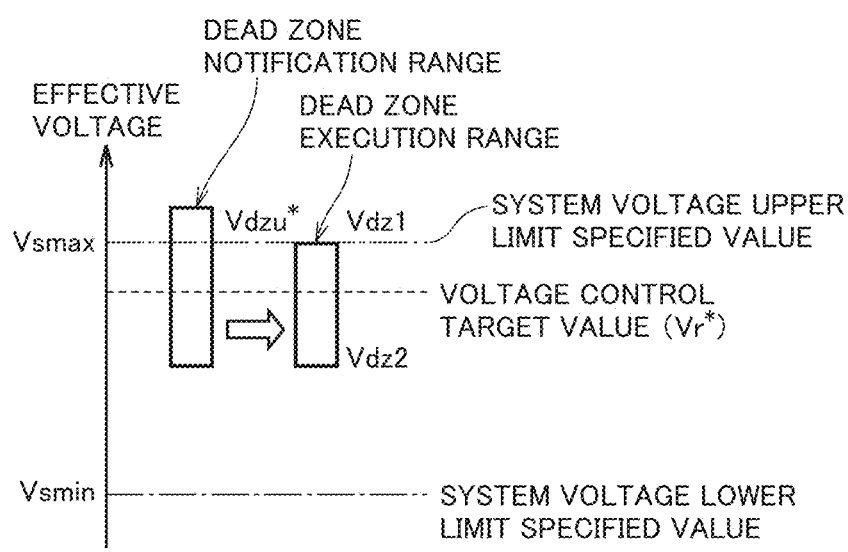
FIG. 20 is a conceptual diagram illustrating correction of the dead zone width.

FIG. 20 is a conceptual diagram illustrating correction of the dead zone width. The vertical axis in FIG. 20 shows the AC effective voltage in consumer premises distribution system 10.

Referring to FIG. 20, for the AC effective voltage in consumer premises distribution system 10, a system voltage upper limit specified value Vsmax and a system voltage lower limit specified value Vsmin are set. Thus, an upper limit voltage Vdz1 and a lower limit voltage Vdz2 in the dead zone width are also set to fall within a range of $Vsmin \leq Vdz2 < Vdz1 \leq Vsmax$.

On the other hand, CEMS 15 gives a notification about, as dead zone width information, the voltage difference ($\Delta Vdz$) between upper limit voltage Vdz1 and lower limit voltage Vdz2 in the dead zone with respect to voltage control target value Vr*. Then, by calculation of $Vr^* \pm \Delta Vdz$, HEMS 7 calculates upper limit voltage Vdz1 and lower limit voltage Vdz2 in the dead zone.

Thus, as shown on the left side in FIG. 20, when the upper limit voltage ($Vr^* + \Delta Vdz$) in the dead zone based on the notified dead zone information exceeds system voltage upper limit specified value Vsmax, the upper limit voltage needs to be corrected. For example, as shown on the right side in FIG. 20, the upper limit voltage is corrected to be limited to Vdz1=Vsmax. On the other hand, lower limit voltage Vdz2 in the dead zone does not have to be corrected and can be set such that $Vr^* - \Delta Vdz$.

Again referring to FIG. 19, in S121, HEMS 7 determines whether or not the dead zone according to the notified dead zone width information is equal to or less than a specified value, and specifically, whether or not the upper limit voltage and the lower limit voltage in the dead zone width fall within the range of system voltage upper limit specified value Vsmax to system voltage lower limit specified value Vsmin.

When the upper limit voltage and the lower limit voltage deviate from the range of Vsmax to Vsmin (when it is determined as NO in S121), then in step S122, HEMS 7 corrects the dead zone width to fall within an appropriate range (on the right side in FIG. 20). The upper limit voltage and the lower limit voltage in the dead zone width after correction fall within the range of Vsmax to Vsmin. When the upper limit voltage and the lower limit voltage fall within the range of Vsmax to Vsmin (when it is determined as YES in S121), the process in S122 is skipped and the notified dead zone width is maintained.

Then, in S123 and S124, HEMS 7 generates dead zone information for each of solar cell power conversion device 2 and storage battery power conversion device 4.

Again referring to FIG. 13, in the present first embodiment, the dead zone information used in solar cell power conversion device 2 is switched in accordance with the electric power generated by solar cell 1. Specifically, as described with reference to FIG. 12, when the generated electric power output from solar cell 1 is not suppressed in a case where solar cell power conversion device 2 generates and outputs reactive power, the dead zone width information is processed such that the reactive power is output from solar cell power conversion device 2 earlier than from storage battery power conversion device 4.

On the other hand, when the output of reactive power from solar cell power conversion device 2 suppresses the electric power generated by solar cell 1, the dead zone width is processed such that the reactive power is output from storage battery power conversion device 4 earlier than from solar cell power conversion device 2. As a result, in the present first embodiment, two types of dead zone width information is created for solar cell power conversion device 2. Then, one type of dead zone width information is created for storage battery power conversion device 4.

Specifically, in S123 and S124, HEMS 7 generates dead zone information for each of solar cell power conversion device 2 and storage battery power conversion device 4 such that "the dead zone width of the solar cell (the power generation amount is equal to or less than a reference value)">"the dead zone width information of the storage battery">"the dead zone width of the solar cell (the power generation amount exceeds a reference value)", as shown in FIG. 13.

Again referring to FIG. 19, when generation of the dead zone width information in S123 and S124 completes, then in S125, HEMS 7 generates control target voltages for solar cell power conversion device 2 and storage battery power conversion device 4 which are applied at the time of deviation from the dead zone width.

In the present first embodiment, in order to suppress a hunting operation in which start/stop of the system voltage stabilization control is continuously switched in a short time period, HEMS 7 sets the voltage between the voltage control target value (consumer premises distribution system 10) and the minimum value of the upper limit voltage in the dead zone range set in S123 and S124 as a target voltage that is applied at the time of deviation from the dead zone width, as shown in FIG. 13, for example, when the AC effective voltage of in consumer premises distribution system 10 deviates from the upper limit voltage of the dead zone width.

As described above, voltage control target value Vr* of the AC effective voltage in consumer premises distribution system 10 has a moving average value of the AC effective voltage and therefore changes as time passes. Thus, the control target voltage is to be defined in accordance with the voltage difference from the above-mentioned voltage control target value. Furthermore, in S125, the condition for ending the system voltage stabilization control is also determined. In the present first embodiment, as shown in FIG. 13, HEMS 7 generates a reactive power control end voltage and notifies solar cell power conversion device 2 and storage battery power conversion device 4 about the generated voltage. The details of the system voltage stabilization control in each distributed power supply will be described later.

As described above, HEMS 7 generates dead zone width information, a system voltage control target value at the time of deviation from the dead zone, and a reactive power control end voltage as one of the conditions for ending system voltage stabilization control, and then, notifies solar cell power conversion device 2 and storage battery power conversion device 4 about the generated results. Thereby, when solar cell 1 generates less electric power and thus solar cell power conversion device 2 does not have to suppress the electric power generated by solar cell 1 for performing system voltage stabilization control, solar cell power conversion device 2 can be preferentially utilized for system voltage stabilization control. On the other hand, when solar cell 1 generates much electric power, and thus, output of reactive power from solar cell power conversion device 2 requires suppression of the electric power generated by solar cell 1, the reactive power from storage battery power conversion device 4 can be preferentially utilized for system voltage stabilization control. In other words, system voltage stabilization control can be performed without unnecessarily suppressing the electric power generated by solar cell 1.

Furthermore, when system voltage stabilization control can be performed without suppressing the electric power generated by solar cell 1, solar cell power conversion device 2 outputs reactive power so as to stabilize the system voltage, thereby further allowing suppression of power loss (switching loss, standby power and the like) occurring when storage battery power conversion device 4 outputs reactive power.

Furthermore, by generating the system voltage control target value at the time of deviation from the dead zone and the reactive power control end voltage as one of the conditions for ending system voltage stabilization control as described above, hysteresis can be included in the conditions for starting/ending the system voltage stabilization control. As a result, the hunting operation of the system voltage stabilization control can be suppressed.

Then, the operation of solar cell power conversion device 2 will be described.

Again referring to FIGS. 1 and 2, when power generation by solar cell 1 is started, solar cell power conversion device 2 is started for supplying the DC power generated by solar cell 1 to consumer premises distribution system 10. Specifically, in the first embodiment, solar cell power conversion device 2 is started when the DC voltage output from solar cell 1 becomes equal to or greater than a predetermined determination value.

Again referring to FIGS. 3 and 4, when solar cell power conversion device 2 is started, fifth control circuit 2044 in first control circuit 204 normally instructs MPPT control circuit 2041 to start MPPT control so as to maximize the output power from solar cell 1. Furthermore, fifth control circuit 2044 outputs a control signal to switching circuit 2043 so as to select the output from MPPT control circuit 2041.

On the other hand, in FIG. 5, sixth control circuit 2097 in second control circuit 209 causes active current control circuit 2094 to calculate the amplitude of the active current and causes active current waveform generation circuit 2095 to generate a current command value such that the DC voltage on DC bus 205 output from voltmeter 206 becomes constant.

Figure 21:
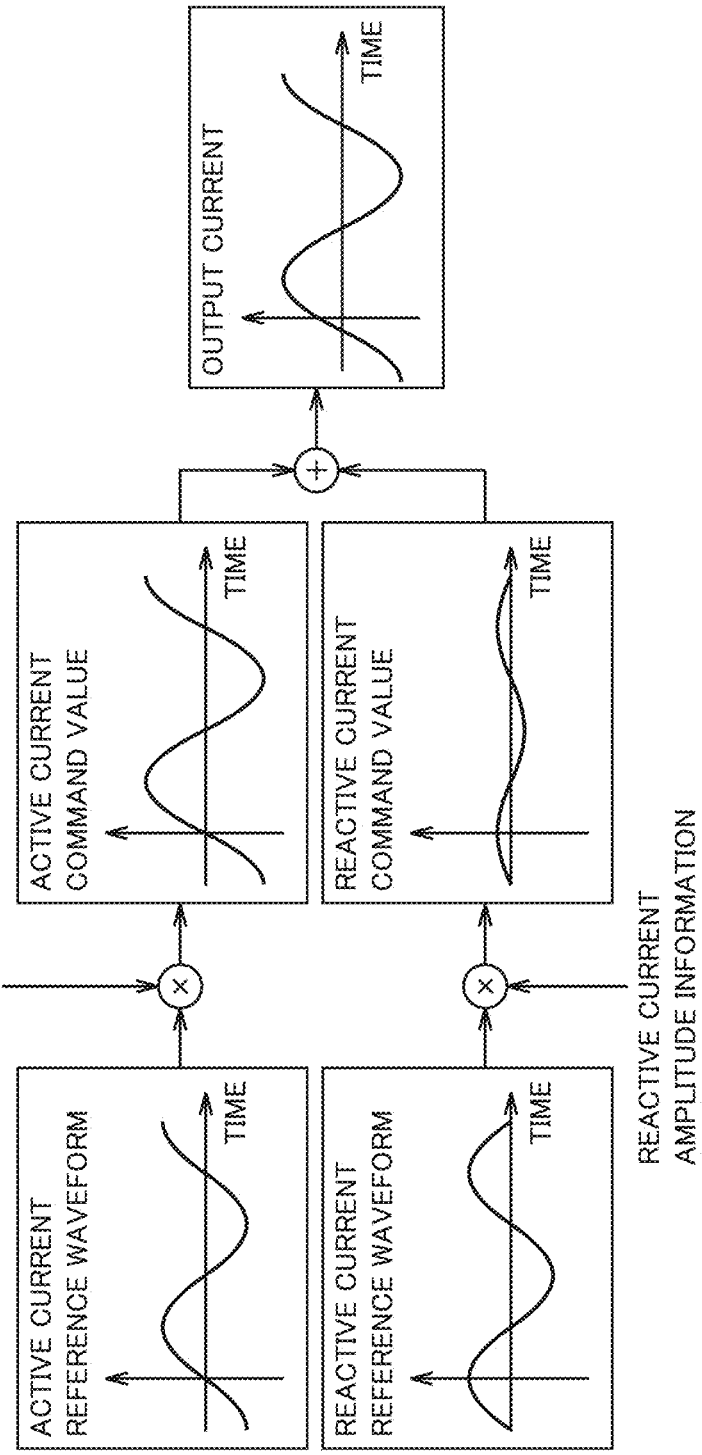
FIG. 21 is a conceptual diagram for illustrating generation of a current command value for controlling an active current and a reactive current.

FIG. 21 is a conceptual diagram for illustrating generation of a current command value for controlling the active current and the reactive current.

Referring to FIGS. 21 and 7, active current waveform generation circuit 2095 generates an active current reference waveform based on the zero cross point information on the AC voltage detected in phase detection circuit 2091. The active current reference waveform is a sinusoidal wave having the same frequency and the same phase as those of the AC voltage. The active current reference waveform is multiplied by the active current amplitude information output from active current control circuit 2094, to thereby generate an active current command value.

Similarly, reactive current waveform generation circuit 2093 generates a reactive current reference waveform based on the zero cross point information on the AC voltage detected in phase detection circuit 2091. The reactive current reference waveform is a cosine wave that is different in phase by ($\pi/2$) from the active current reference waveform. The reactive current reference waveform is multiplied by the reactive current amplitude information output from reactive current control circuit 2092 to thereby generate a reactive current command value.

These calculated active current command value and reactive current command value are added by adder 2096, and thereby an output current command value is generated in accordance with composition of trigonometric functions and then input into sixth control circuit 2097. Based on the received output current command value, sixth control circuit 2097 calculates apparent power (apparent current) to be output from first DC/AC conversion circuit 208. When the calculated apparent power exceeds rated power, the output current command value is processed so as to fall within the rated power. The output current command value set in this way is input into first DC/AC conversion circuit 208.

Figure 22:
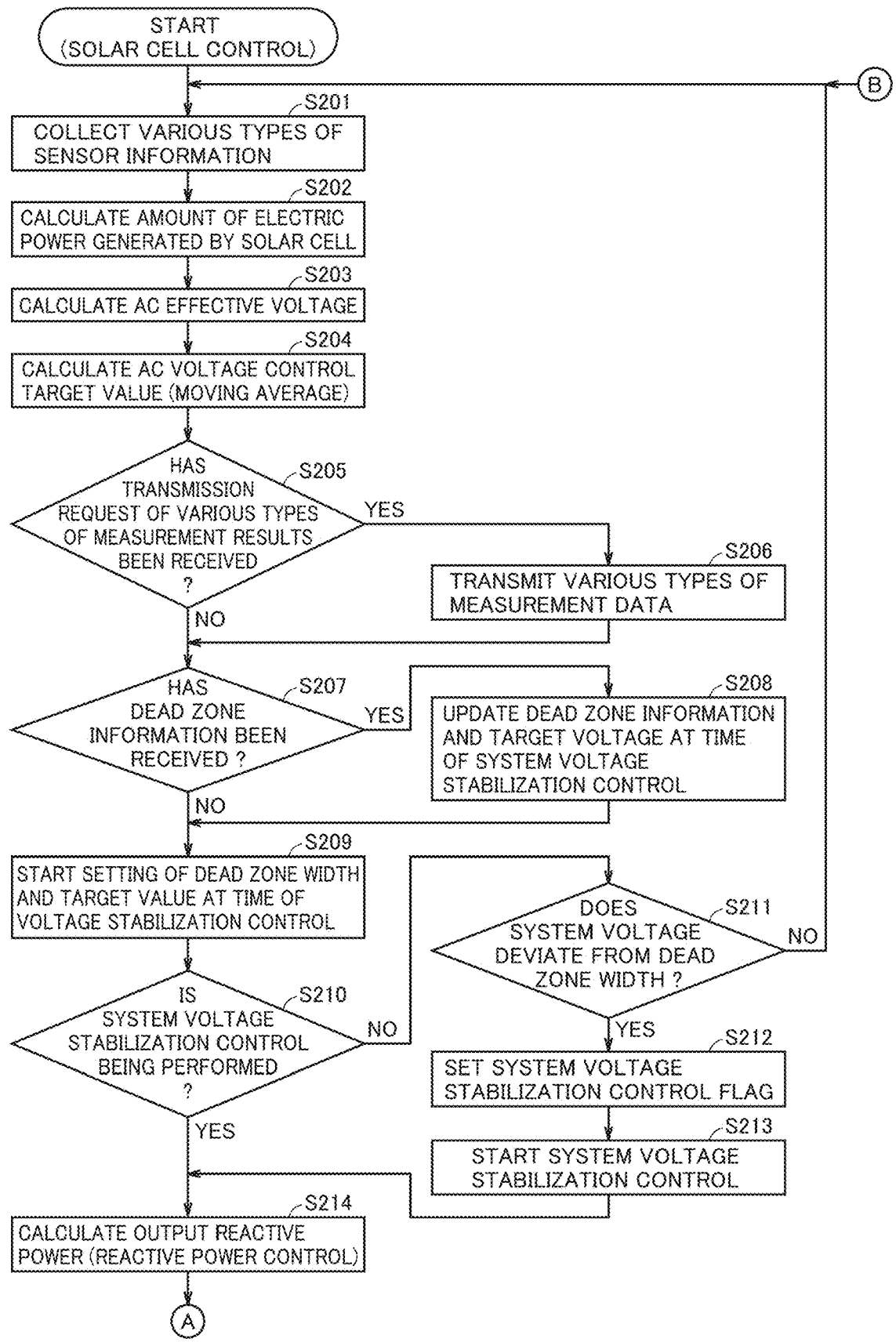
FIG. 22 is the first flowchart illustrating a control process of a solar cell power conversion device according to the first embodiment.
Figure 23:
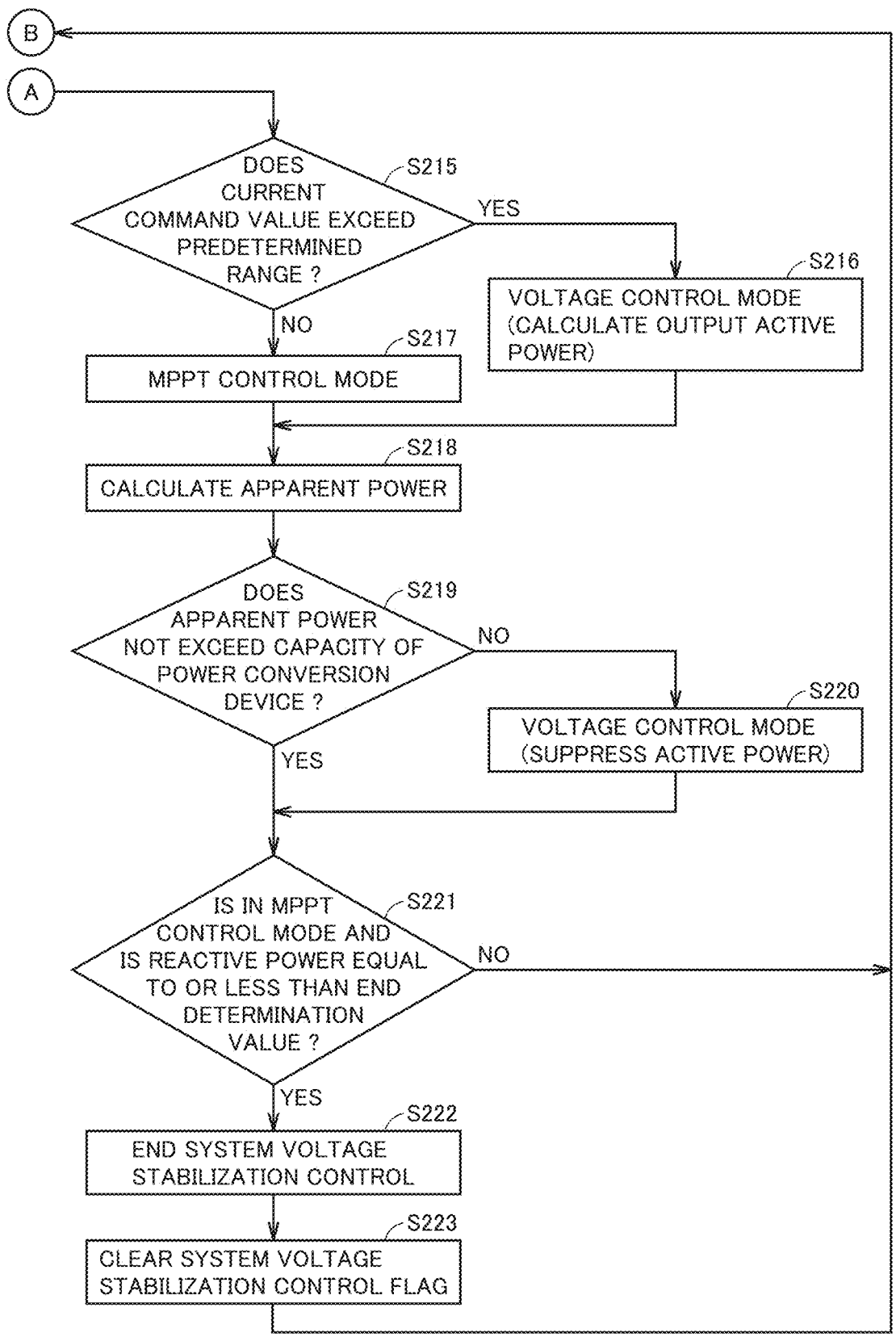
FIG. 23 is the second flowchart illustrating the control process of the solar cell power conversion device according to the first embodiment.

FIGS. 22 and 23 each show a flowchart illustrating the control process of solar cell power conversion device 2 according to the first embodiment. Each of the steps shown in FIGS. 22 and 23 is continuously performed by first control circuit 204 and second control circuit 209 during the operation of solar cell power conversion device 2.

Referring to FIG. 22, when solar cell power conversion device 2 is started, various types of sensor information is collected in S201. Specifically, the voltage and the current of solar cell 1 that are measured by voltmeter 201 and ammeter 202 are input into MPPT control circuit 2041 in first control circuit 204. Also, a DC bus bar voltage on DC bus 205 collected by voltmeter 206 is input into voltage control circuit 2042 in first control circuit 204 and sixth control circuit 2097 in second control circuit 209. Furthermore, the current flowing through the DC bus and measured by ammeter 207 and the result of measuring the AC current flowing through consumer premises distribution system 10 and measured by ammeter 211 are input into sixth control circuit 2097 in second control circuit 209. Furthermore, the AC voltage in consumer premises distribution system 10 measured by voltmeter 210 is input into effective voltage calculation circuit 2098 and phase detection circuit 2091 in second control circuit 209.

When collection of the measurement results from various sensors end, then in S202, MPPT control circuit 2041 calculates the electric power generated by solar cell 1. The calculation result is notified to fifth control circuit 2044. Upon reception of the generated electric power, fifth control circuit 2044 notifies sixth control circuit 2097 in second control circuit 209 about the received result.

On the other hand, the result of measuring the AC voltage by voltmeter 210 is input into phase detection circuit 2091 and effective voltage calculation circuit 2098. Phase detection circuit 2091 detects a zero cross point of the input AC voltage, and outputs the detection result to reactive current waveform generation circuit 2093, active current waveform generation circuit 2095, and effective voltage calculation circuit 2098. In S203, effective voltage calculation circuit 2098 calculates the AC effective voltage based on the received AC voltage by the configuration as described with reference to FIG. 10.

The AC effective voltage in consumer premises distribution system 10 calculated by effective voltage calculation circuit 2098 is input into reactive current control circuit 2092, active current control circuit 2094, sixth control circuit 2097, and voltage control target value generation circuit 2099.

In S204, upon reception of the AC effective voltage, voltage control target value generation circuit 2099 calculates a voltage control target value for solar cell power conversion device 2. In the present first embodiment, the moving average value in 1 minute that is calculated by using a FIR filter shown in FIG. 11 is set at a voltage control target value of consumer premises distribution system 10.

As shown in FIG. 11, the AC effective voltage input from effective voltage calculation circuit 2098 is multiplied by a predetermined coefficient M by multiplier 20991, and thereafter supplied to register 20992*a* and adder 20993*a*. A set of register 20992 and adder 20993 is prepared by the number of samples for which the moving average is calculated. Register 20992 is connected in a shift register configuration as shown in FIG. 11. Coefficient M to be multiplied is provided as a reciprocal of the number of samples of the AC effective voltage for which the moving average is calculated. The AC voltage control target value calculated by voltage control target value generation circuit 2099 is input into reactive current control circuit 2092, active current control circuit 2094, and sixth control circuit 2097.

When calculation of the AC voltage control target value in S204 ends, then in S205, sixth control circuit 2097 in second control circuit 209 checks whether or not communication interface circuit 212 has received a transmission request of the measurement result from HEMS 7. When the transmission request has been received (when it is determined as YES in S205), then in S206, HEMS 7 is notified through communication interface circuit 212 about the above-mentioned electric power generated by solar cell 1, the control mode of solar cell 1 (two types of an MPPT control mode and a voltage control mode as will be described later in detail), and the AC effective voltage and the AC voltage control target value in consumer premises distribution system 10, and additionally, as will be described later in detail, the result of measuring the reactive power output time, the result of measuring the reactive power control amount, the output active power amount, and the information of time during which output is suppressed. After transmission of the measurement data in S206, the result of measuring the output time of reactive power, the result of measuring the reactive power control amount, the output active power amount, and the information of time during which output is suppressed are cleared once.

Then, in S207, sixth control circuit 2097 in second control circuit 209 checks whether the dead zone width information has been received or not from HEMS 7. When the dead zone width information has been received (when it is determined as YES in S207), then in S208, updates are made to the dead zone width information, the system voltage control target value at the time of system voltage stabilization control, and the voltage at the end of reactive power control.

When the dead zone width information has not been received (when it is determined as NO in S207), or when update in S208 ends, then in S209, based on the information output from sixth control circuit 2097, dead zone table generation circuit 2100 starts creation of a dead zone width, a target voltage at the time of system voltage stabilization control, and an end determination voltage for the system stabilization control by the reactive power. In the first embodiment, as described with reference to FIGS. 13 and 20, the dead zone voltage range is generated based on the voltage control target value output from voltage control target value generation circuit 2099, and two types of the notified reactive power width information. Specifically, two types of dead zone voltage ranges shown in the center and on the right side in FIG. 13 are generated based on: the first dead zone width information used when the electric power generated by solar cell 1 is equal to or less than a reference value; and the second dead zone information used when the electric power generated by solar cell 1 exceeds the reference value.

In this case, two types of simultaneously transmitted system voltage control target values used when performing system voltage stabilization control (two types of values applied in the cases of deviation upward and downward from the dead zone voltage range) are generated, and two types of simultaneously transmitted reactive power control end voltages used when performing system voltage stabilization control (two types of voltages applied in the cases of deviation upward and downward from the dead zone voltage range) are generated.

Figure 24:
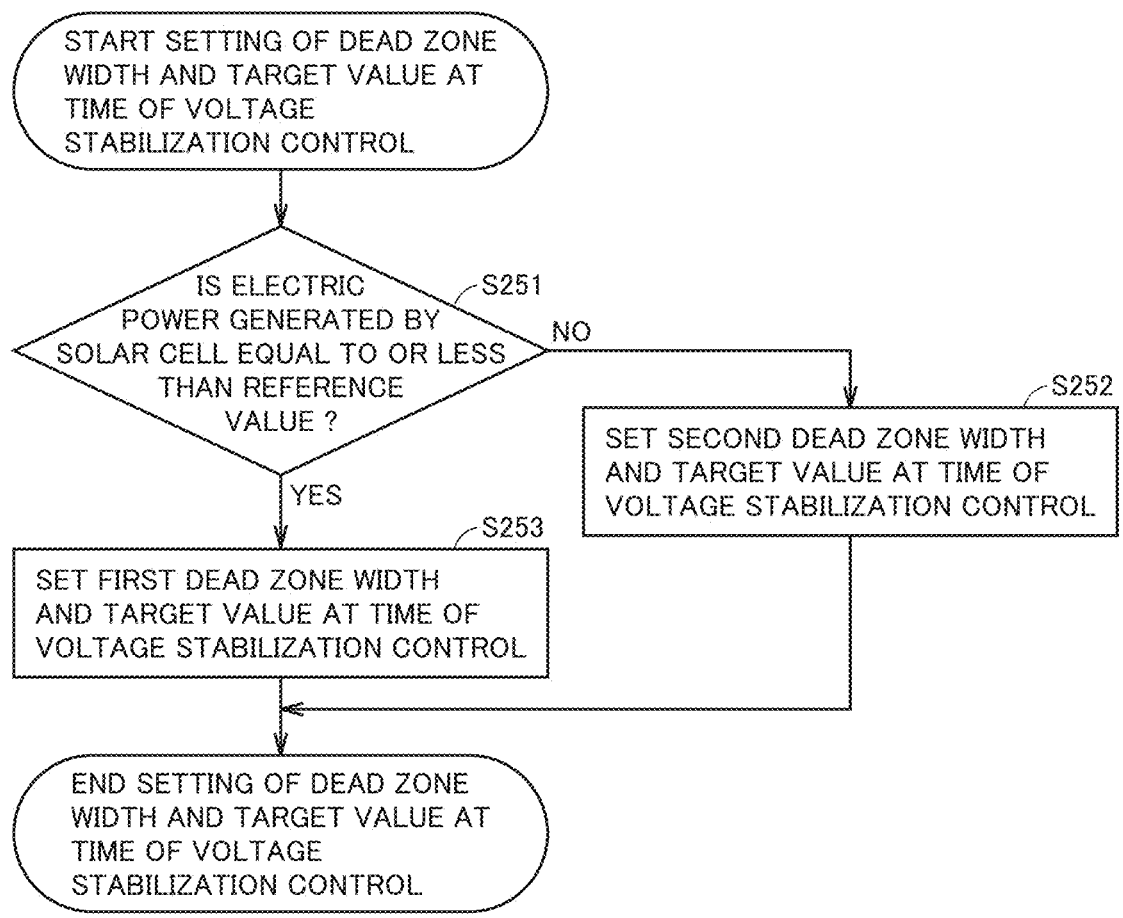
FIG. 24 is a flowchart illustrating a process of calculating: dead zone width information about the solar cell power conversion device according to the first embodiment of the present disclosure; a target voltage at the time of system voltage stabilization control; and an end determination voltage for system voltage stabilization control by reactive power output.

FIG. 24 is a flowchart illustrating a process of calculating: dead zone width information; a system voltage control target value at the time of system voltage stabilization control, and a reactive power control end voltage. FIG. 24 shows the details of the process in S209 in FIG. 22.

Referring to FIG. 24, it is determined in S251 whether or not the electric power generated by solar cell 1 and measured in S202 is equal to or less than a reference value. When the electric power generated by solar cell 1 is equal to or less than the reference value (when it is determined as YES in S251), then in S253, the dead zone voltage range, the target voltage at the time of system voltage stabilization control, and the AC effective voltage value used when determining the end of reactive power control are calculated based on the first dead zone width information, the system voltage control target value at the time of system voltage stabilization control, the reactive power control end voltage, and the output from voltage control target value generation circuit 2099.

On the other hand, when the electric power generated by solar cell 1 exceeds the reference value (when it is determined as NO in S251), then in S252, the dead zone voltage range, the target voltage at the time of system voltage stabilization control, and the AC effective voltage value used when determining the end of the reactive power control are calculated based on the second dead zone width information, the system voltage control target value at the time of system voltage stabilization control, the reactive power control end voltage, and the output from voltage control target value generation circuit 2099. In the present first embodiment, the target voltage at the time of system voltage stabilization control and the AC effective voltage value used when determining the end of the reactive power control are switched by the electric power generated by solar cell 1.

Again referring to FIG. 22, when S209 ends, then in S210, sixth control circuit 2097 checks based on a flag value stored in a register (not shown) whether first DC/AC conversion circuit 208 performs system voltage stabilization control or not. When the system voltage stabilization control is not performed (when it is determined as NO in S210), the process proceeds to S211, in which it is determined whether the AC effective voltage in consumer premises distribution system 10 deviates or not from the dead zone voltage range set in S209.

When no deviation from the dead zone voltage range occurs (when it is determined as NO in S211), the process is returned to S201. In other words, while the AC effective voltage in consumer premises distribution system 10 is in the dead zone voltage range, the process in S201 to S211 is repeated without performing the system voltage stabilization control.

In contrast, when the AC effective voltage (consumer premises distribution system 10) deviates from the dead zone voltage range (when it is determined as YES in S211), then in S212, sixth control circuit 2097 sets a system voltage stabilization control flag in the register (not shown), and in S213, starts system voltage stabilization control.

When system voltage stabilization control is started (S213) or when system voltage stabilization control is being performed (when it is determined as YES in S210), then in S214, reactive current control circuit 2092 calculates (controls) the amplitude of the reactive current to be output. For example, by PI (proportional integral) control for bringing the AC effective voltage of consumer premises distribution system 10 close to the control target voltage (S125 in FIG. 19) of solar cell power conversion device 2 at the time of deviation from the dead zone width, the current amplitude value of the reactive current can be calculated.

Active current control circuit 2094 can also calculate the current amplitude value of the active current by PI (proportional integral) control for bringing the voltage on DC bus 205 close to a predetermined target voltage (for example, 350V). As described with reference to FIG. 21, based on the current amplitude values of the reactive current and the active current, reactive current waveform generation circuit 2093 generates a reactive current command value while active current waveform generation circuit 2095 generates an active current command value. Furthermore, adder 2096 adds the reactive current command value and the active current command value to thereby calculate the current command value.

Referring to FIG. 23, in S215, sixth control circuit 2097 checks whether the current command value from adder 2096 exceeds the predetermined range or not. For example, in S215, it is determined as NO when the current command value exceeds the maximum current value, specifically, the maximum current value (rated value) of first DC/AC conversion circuit 208, but determined as YES when the current command value does not exceed the maximum current value.

When the current command value exceeds the maximum current value (when it is determined as YES in S215), then in S216, sixth control circuit 2097 notifies fifth control circuit 2044 in first control circuit 204 to change the control of solar cell 1 to a voltage control mode, together with a notification about the electric power generated by solar cell 1. In addition, so as not to repeatedly switch the operation between MPPT control and voltage control in a short time period (so as to prevent hunting), in the present first embodiment, within a predetermined time period since switching between MPPT control and voltage control, switching to new control is masked, and also, as to the maximum current value determined in S215, it is preferable that the maximum current value used when determining switching from the voltage control mode to the MPPT control mode is set smaller than the maximum current value used when determining switching from the MPPT control mode to the voltage control mode. Thereby, the control mode (the MPPT control mode and the voltage control mode) of solar cell 1 can be prevented from switching frequently in a short time period, to thereby allow stable execution of the system voltage stabilization control.

Upon reception of the instruction to change the control mode of solar cell 1 to the voltage control mode, fifth control circuit 2044 outputs an instruction to stop the control when MPPT control circuit 2041 is operating, and then, captures the information such as a present command value. Then, fifth control circuit 2044 transmits, to voltage control circuit 2042, the information about the generated electric power notified from sixth control circuit 2097, and if the operation is not being performed, additionally transmits the information such as a present command value received from MPPT control circuit 2041. Upon reception of the information about the generated electric power from fifth control circuit 2044, voltage control circuit 2042 generates a control command value so as to attain the received power generation amount. When voltage control circuit 2042 is not started, control is started using the information such as the present command value received from MPPT control circuit 2041 as an initial value. Furthermore, sixth control circuit 2097 notifies voltage control circuit 2042 about the generated electric power information and the like, and outputs a control signal for selecting the output of voltage control circuit 2042 to switching circuit 2043.

When the current command value does not exceed the maximum current value (when it is determined as NO in S215), then in S217, sixth control circuit 2097 instructs fifth control circuit 2044 to operate in the MPPT control mode. When fifth control circuit 2044 receives the instruction to operate in the MPPT control mode and when the operation is performed in the voltage control mode, fifth control circuit 2044 reads the information such as the present command value from voltage control circuit 2042 and notifies MPPT control circuit 2041 about the read control information. Furthermore, fifth control circuit 2044 gives an instruction to start MPPT control based on the notified information as an initial value, and outputs a control signal for selecting the output of MPPT control circuit 2041 to switching circuit 2043. When the operation is performed in the MPPT control, the same control is continued.

When the process in S216 or S217 ends, then in S218, sixth control circuit 2097 calculates the apparent power (apparent current) based on the current command value output from adder 2096. In S219, it is determined whether or not the apparent power (apparent current) calculated in S218 does not exceed the capacity of solar cell power conversion device 2. When the apparent power exceeds the capacity (when it is determined as NO in S219), the process proceeds to S220 to start suppression of the active power. Specifically, when the apparent power (apparent current) exceeds the capacity of solar cell power conversion device 2, sixth control circuit 2097 notifies fifth control circuit 2044 to suppress the electric power generated by solar cell 1, together with a notification about the power generation amount. Upon reception of this notification, fifth control circuit 2044 checks the present control mode of solar cell 1. When the operation is performed in the MPPT control mode, the control mode shifts to a voltage control mode.

Specifically, as described above, fifth control circuit 2044 outputs a control stop instruction to MPPT control circuit 2041 and captures the information such as the present command value. Then, fifth control circuit 2044 transmits, to voltage control circuit 2042, the generated electric power information notified from sixth control circuit 2097 and, if the operation is not being performed, additionally transmits the information such as the present command value obtained from MPPT control circuit 2041. Upon reception of the generated electric power information from fifth control circuit 2044, voltage control circuit 2042 generates a control command value so as to attain the generated electric power that has been received. In this case, when voltage control circuit 2042 is not started, the control is started using the information such as the present command value obtained from MPPT control circuit 2041 as an initial value. Furthermore, fifth control circuit 2044 notifies voltage control circuit 2042 about the generated electric power information and the like and also outputs a control signal for selecting the output of voltage control circuit 2042 to switching circuit 2043.

On the other hand, when the operation is performed in the voltage control mode, fifth control circuit 2044 notifies voltage control circuit 2042 about the generated electric power that has been received. Voltage control circuit 2042 generates a control command value so as to attain the generated electric power that has been received. The generated control command value is output to first DC/DC conversion circuit 203 through switching circuit 2043.

When an instruction to suppress the active power (the electric power generated by solar cell 1) in S220 is accomplished or when the apparent power does not exceed the capacity of solar cell power conversion device 2 (when it is determined as YES in S219), sixth control circuit 2097 checks the condition for ending the system voltage stabilization control.

In S221, sixth control circuit 2097 checks fifth control circuit 2044 whether the present control of solar cell 1 is performed in the MPPT control mode or not. When the control is performed in the MPPT control mode, sixth control circuit 2097 compares the result of measuring the reactive power notified from reactive power measurement circuit 20935 in reactive current waveform generation circuit 2093 with a predetermined end determination value. Then, when the control is not performed in the MPPT control mode or when the result of measuring the reactive power is equal to or greater than the end determination value, it is determined as NO in S221, and the process is returned to S201. Thereby, the system voltage stabilization control is continued.

On the other hand, when solar cell 1 is operating in the MPPT control mode and when the result of measuring the reactive power is less than the end determination value, it is determined as YES in S221. Then, in S222, it is determined to end the system voltage stabilization control. Furthermore, in S223, the system voltage stabilization control flag is cleared, and then, the process is returned to S201.

The following is an explanation about the reason why the condition for ending the system voltage stabilization control (S221) is determined.

During the system interconnection operation, solar cell 1 normally operates in the MPPT control mode in order to extract the generated electric power to the greatest extent. Thus, when solar cell 1 is operating in the voltage control operation mode, regenerative power flows in large quantity through consumer premises distribution system 10, and thereby, it is conceivable that the system voltage rises. Furthermore, the system voltage stabilization control in consumer premises distribution system 10, distribution system 14 and the like may be more effective by the control with active power than by the control with reactive power depending on the configuration of the system impedance. Specifically, when the main element of the system impedance results from the influence of a reactor or a capacitor, the system voltage stabilization control by reactive power is more effective. On the other hand, when the main element of the system impedance is a resistance, the system voltage stabilization control by active power is more effective. Thus, in the first embodiment, both the control mode of solar cell 1 and the result of measuring the reactive power are used as the condition for ending the system voltage stabilization control, and thereby, the end of the system voltage stabilization control can be reliably determined.

The first embodiment has been described with regard to the case where the system voltage stabilization control by reactive power is preferentially performed. However, when the main element of the system impedance information notified from distribution automation system 25 is a resistance component, the system voltage stabilization control is performed while prioritizing active power control. Specifically, in the case where the main element of the system impedance is a reactor or a capacitor, comparison between the case where the active power is controlled and the case where the reactive power is controlled shows that the voltage amplitude of the distribution AC system is influenced significantly by the reactive power. On the other hand, when the main element of the system impedance is a resistance component, the system voltage is less influenced even when the reactive power is controlled. Thus, in the case where the main element of the system impedance is a reactor or a capacitor, it is preferable that, as shown in FIGS. 22 and 23, when the output of reactive power reaches the allowable maximum value, the process in S216 and S220 is performed to thereby perform the system voltage stabilization control while prioritizing reactive power. On the other hand, when the main element of the system impedance is a resistance component, it is preferable that the process in S216 and S220 is performed before the system voltage stabilization control is performed while prioritizing suppression of the active power.

In this way, by switching whether output of reactive power or suppression of active power is preferentially performed in accordance with the configuration of the system impedance information, the system voltage stabilization control can be further effectively performed. For example, based on the system impedance information notified through CEMS 15 from distribution automation system 25, HEMS 7 can determine the priority order between suppression of the system voltage by the output of reactive power and system voltage decrease by suppression of active power. HEMS 7 notifies solar cell power conversion device 2 and storage battery power conversion device 4 about the determination result, and thereby, the system voltage stabilization control can be performed effectively based on the impedance information on the distribution system.

Then, the operation of storage battery power conversion device 4 will be described.

Again referring to FIG. 3, in the first embodiment, storage battery power conversion device 4 normally operates based on the operation plan notified from HEMS 7. Specifically, there are four types of modes including: a "power selling priority mode" for selling the electric power generated by solar cell 1 to the greatest extent; a "charge priority mode" for charging with surplus electric power of the electric power generated by solar cell 1; a "peak cut mode" for suppressing the selling electric power to be equal to or less than a predetermined upper limit value; and a "standby mode" for performing only collection of the measurement results by various sensors and periodical communication of measurement data. The standby mode is characterized by extremely small power consumption.

When the power supply is turned on, storage battery power conversion device 4 is started in the standby mode and then operates in the standby mode until it receives an operation plan from HEMS 7. In the standby mode, storage battery power conversion device 4 collects various types of sensor information and performs only reception of the dead zone width information from HEMS 7 and transmission of the measurement results by various types of sensors to HEMS 7.

Figure 25:
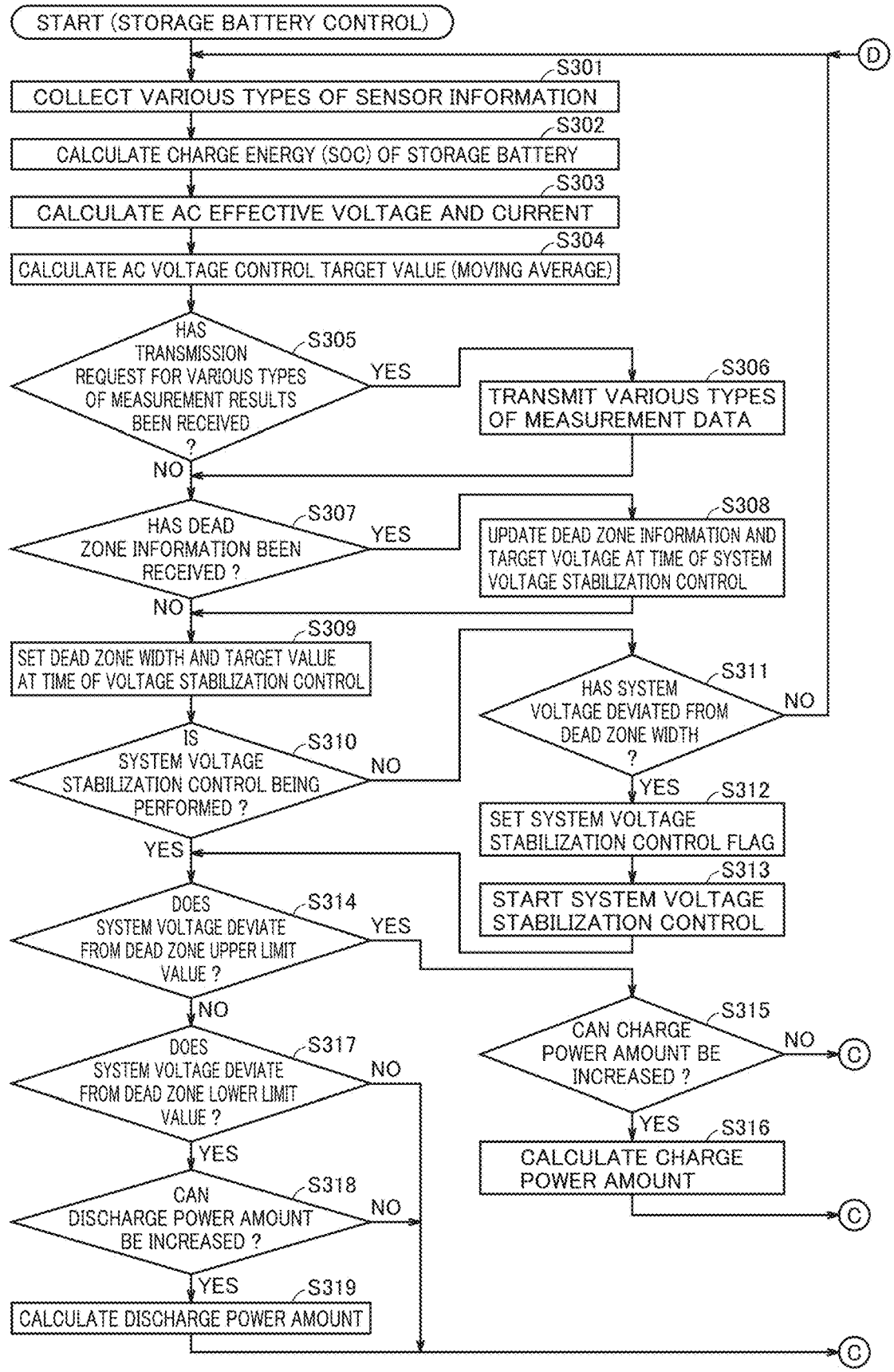
FIG. 25 is the first flowchart illustrating a control process of the storage battery power conversion device according to the first embodiment.
Figure 26:
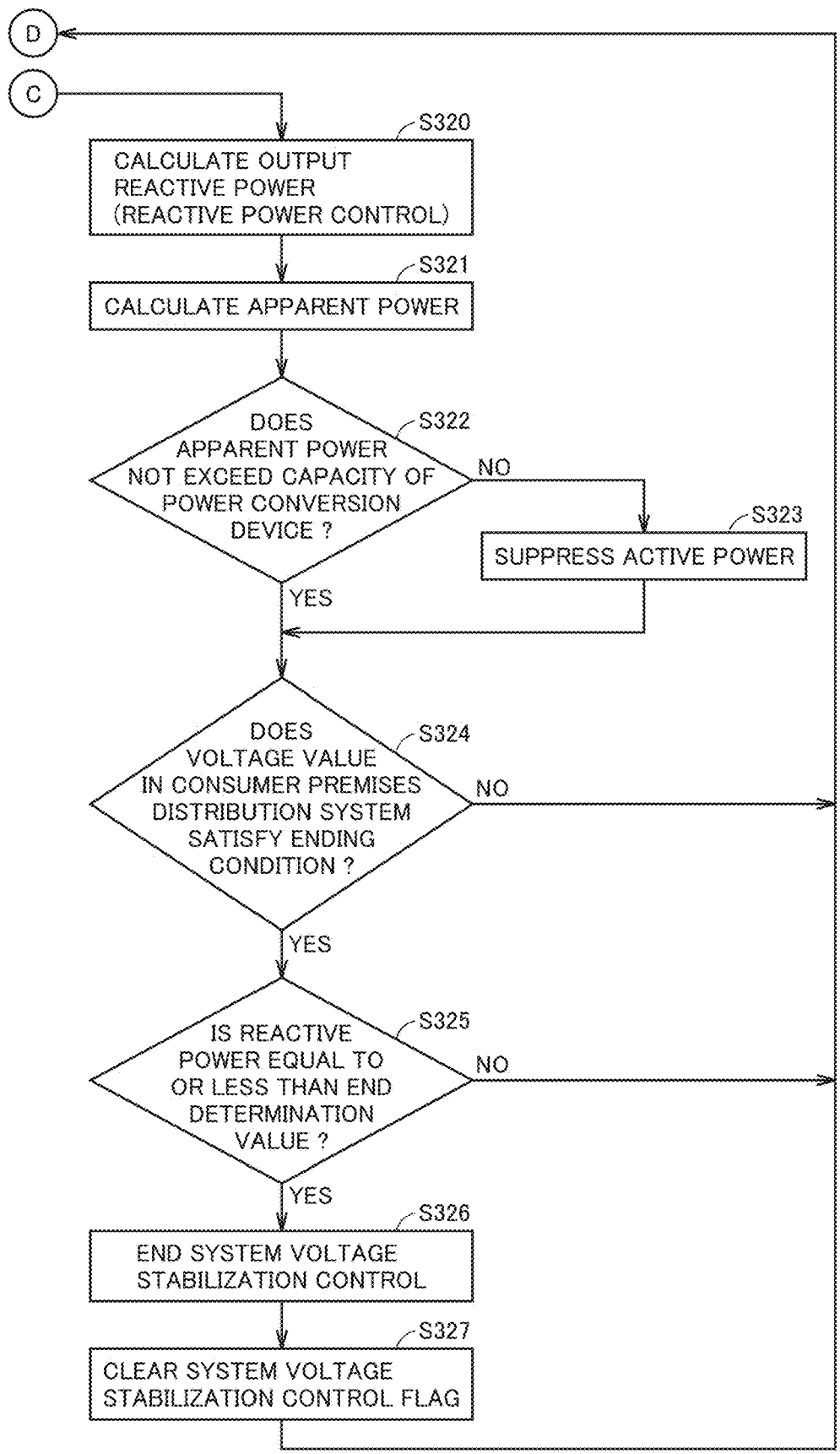
FIG. 26 is the second flowchart illustrating the control process of the storage battery power conversion device according to the first embodiment.

FIGS. 25 and 26 each are a flowchart illustrating the control process of storage battery power conversion device 4 according to the first embodiment. Each of the steps shown in FIGS. 25 and 26 is continuously performed by third control circuit 404 and fourth control circuit 409 during the operation of storage battery power conversion device 4.

Referring to FIG. 25 and FIGS. 3 to 5 and FIGS. 8 to 12, when storage battery power conversion device 4 is started, various types of sensor information is collected in S301. Specifically, the voltage and the current of storage battery 3 that are measured by voltmeter 401 and ammeter 402, and the DC bus bar voltage on DC bus 405 collected by voltmeter 406 are input into seventh control circuit 4044, charge control circuit 4041 and discharge control circuit 4042 in third control circuit 404. Furthermore, the current flowing through the DC bus and measured by ammeter 407 and the result of measuring the AC current flowing through the consumer premises distribution system and measured by ammeter 411 are input into eighth control circuit 4097 in fourth control circuit 409. Furthermore, the AC voltage in consumer premises distribution system 10 measured by voltmeter 410 is input into effective voltage calculation circuit 4098 and phase detection circuit 4091 in fourth control circuit 409.

When collection of the measurement results by various types of sensors ends, then in S302, seventh control circuit 4044 calculates the charge/discharge power amount from storage battery 3 based on the sensor information output from voltmeter 401 and ammeter 402. In this case, the charge energy (the state of charge: SOC) of storage battery 3 is also calculated. The present first embodiment will be continuously described assuming that the charge energy of storage battery 3 is calculated in seventh control circuit 4044, but calculation of the charge energy (SOC) of storage battery 3 can be performed by any elements. For example, the SOC may be calculated by a battery management unit (BMU) (not shown) provided in storage battery 3, and seventh control circuit 4044 may receive the calculation result of the SOC from the BMU in storage battery 3.

Upon completion of calculation of the charge/discharge power and the charge energy (SOC), seventh control circuit 4044 notifies eighth control circuit 4097 in fourth control circuit 409 about the received result. On the other hand, the result of measuring the AC voltage by voltmeter 410 is input into phase detection circuit 4091 and effective voltage calculation circuit 4098. Phase detection circuit 4091 detects a zero cross point of the input AC voltage and outputs the detection result to reactive current waveform generation circuit 4093, active current waveform generation circuit 4095, and effective voltage calculation circuit 4098.

In S303, effective voltage calculation circuit 4098 calculates the AC effective voltage in the distribution system based on the input AC voltage. As described above, effective voltage calculation circuit 4098 can be formed in the same configuration as that of effective voltage calculation circuit 2098 shown in FIG. 10. The AC effective voltage in consumer premises distribution system 10 calculated by effective voltage calculation circuit 4098 is input into reactive current control circuit 4092, active current control circuit 4094, eighth control circuit 4097, and voltage control target value generation circuit 4099.

In S304, upon reception of the AC effective voltage, voltage control target value generation circuit 4099 calculates the voltage control target value of storage battery power conversion device 4. Since the configuration and the operation of voltage control target value generation circuit 4099 are the same as those of voltage control target value generation circuit 2099 (FIG. 11), the detailed description thereof will not be repeated. In other words, voltage control target value generation circuit 4099 successively calculates the moving average value in a certain time period (for example, 1 minute) of the AC effective voltage (effective voltage calculation circuit 4098) in consumer premises distribution system 10 as an AC voltage control target value. The AC voltage control target value calculated by voltage control target value generation circuit 4099 is input into reactive current control circuit 4092, active current control circuit 4094, and eighth control circuit 4097.

When calculation of the AC voltage control target value completes in S304, then in S305, eighth control circuit 4097 checks communication interface circuit 412 whether a transmission request for the measurement result has been received or not from HEMS 7. When the transmission request has been received (when it is determined as YES in S305), then in S306, HEMS 7 is notified through communication interface circuit 412 about the charge/discharge power amount of storage battery 3, the charge energy (SOC) of storage battery 3, the AC effective voltage and the voltage control target value in the distribution system, and as in solar cell power conversion device 2, the result of measuring the output time of reactive power, the result of measuring the reactive power control amount, the output active power amount, and the information of the time during which the output is suppressed. After completion of transmission of the measurement data (S306), the result of measuring the output time of reactive power, the result of measuring the reactive power control amount, the output active power amount, and the information of the time during which the output is suppressed are cleared once.

Then, in S307, eighth control circuit 4097 checks whether the dead zone width information has been received or not from HEMS 7. When the dead zone width information has been received (when it is determined as YES in S307), then in S308, updates are made to the dead zone width information, the system voltage control target value used when performing system voltage stabilization control, and the reactive power control end voltage.

When it is determined as NO in S307 or when S308 ends, then in S309, dead zone table generation circuit 4100 starts to create the dead zone width, the target voltage used in system voltage stabilization control, and the reactive power control end voltage, based on the information output from eighth control circuit 4097. In the first embodiment, as shown on the left side in FIG. 13, the dead zone voltage range is created from the voltage control target value output from voltage control target value generation circuit 4099 and the notified reactive power width information. In this case, the system voltage control target value and the reactive power control end voltage used when performing system voltage stabilization control are also generated.

When S309 ends, then in S310, based on the flag value stored in the register (not shown), eighth control circuit 4097 checks whether second DC/AC conversion circuit 408 performs system voltage stabilization control or not. When the system voltage stabilization control is not performed (when it is determined as NO in S310), the process proceeds to S311, so as to check whether the AC effective voltage in consumer premises distribution system 10 deviates or not from the dead zone voltage range that is set in S309.

When no deviation occurs (when it is determined as NO in S311), the process is returned to S301. In other words, while the AC effective voltage in consumer premises distribution system 10 is in the dead zone voltage range, the process in S301 to S311 is repeated without performing the system voltage stabilization control.

In contrast, when the AC effective voltage (consumer premises distribution system 10) deviates from the dead zone voltage range (when it is determined as YES in S311), then in S312, eighth control circuit 4097 sets a system voltage stabilization control flag in the above-mentioned register (not shown), and then starts the system voltage stabilization control in S313.

When system voltage stabilization control is started (S313) or when system voltage stabilization control is being performed (when it is determined as YES in S310), then in S314, eighth control circuit 4097 checks whether the AC effective voltage in consumer premises distribution system 10 deviates from the upper limit value of the dead zone width or not. When the AC effective voltage in the system voltage deviates from the upper limit value of the dead zone width (when it is determined as YES in S314), eighth control circuit 4097 checks seventh control circuit 4044 for the present operating state (charge/discharge/standby). In this case, when storage battery 3 is charged/discharged, the charge/discharge power is also checked. Thereby, in S315, it is checked whether the charge power amount of storage battery 3 can be increased or not.

When storage battery 3 is discharged or when the charge power can be increased, it is determined as YES in S315 and the process proceeds to S316. Eighth control circuit 4097 calculates the charge/discharge power and notifies seventh control circuit 4044 about the calculation result. Upon reception of the calculation result of the charge/discharge power, seventh control circuit 4044 notifies discharge control circuit 4042 about the received result of discharge power as a target value when storage battery 3 is discharged. Thereby, in S316, discharge control circuit 4042 controls the discharge power from storage battery 3 while aiming at the received discharge power target.

On the other hand, when the charge power is notified from eighth control circuit 4097 while discharge is performed, then in S316, seventh control circuit 4044 instructs discharge control circuit 4042 to stop the discharge control and notifies charge control circuit 4041 about the charge power target. Upon reception of the charge power target, charge control circuit 4041 starts the charge control. In this case, seventh control circuit 4044 outputs a control signal for selecting the output of charge control circuit 4041 to switching circuit 4043.

In the present first embodiment, as described above, solar cell power conversion device 2 prioritizes the output of reactive power in order to minimize suppression of the electric power generated by solar cell 1, and when the system voltage cannot be suppressed to fall within an appropriate range even by the reactive power control, solar cell power conversion device 2 suppresses the active power. On the other hand, when the AC effective voltage in consumer premises distribution system 10 exceeds the upper limit voltage value of the dead zone width, storage battery power conversion device 4 suppresses the discharge power discharged from storage battery 3. Specifically, when storage battery 3 is discharged, discharge power is suppressed or discharging is switched to charging. In particular, by switching to charge control, the reverse direct current of the active power as a main cause of the system voltage rise is suppressed, so that the system voltage rise can be suppressed. Thereby, suppression of the electric power generated by solar cell 1 and output from solar cell power conversion device 2 can be minimized while unnecessary discharge from storage battery 3 can be suppressed. As a result, the electric power generated by solar cell 1 can be efficiently used.

In contrast, when the AC effective voltage in consumer premises distribution system 10 does not deviate from the upper limit value of the dead zone width in S314 (when it is determined as NO in S314), then in S317, eighth control circuit 4097 checks whether the AC effective voltage in consumer premises distribution system 10 deviates or not from the lower limit value (the lower limit voltage) of the dead zone width.

When no deviation from the lower limit value occurs (when it is determined as NO in S317), the process proceeds to S320 (FIG. 26) without prioritizing the system voltage stabilization control by discharge of storage battery 3. When deviation from the lower limit value occurs (when it is determined as YES in S317), then in S318, it is determined whether the discharge power from storage battery 3 can be increased or not. Specifically, eighth control circuit 4097 checks seventh control circuit 4044 for the present operating state (charge/discharge/standby). In this case, when storage battery 3 is charged/discharged, the charge/discharge power is also checked.

When the checking result shows that storage battery 3 is charged or that the discharge power can be increased, it is determined as YES in S318 and the process proceeds to S319. Eighth control circuit 4097 calculates the charge/discharge power, and notifies seventh control circuit 4044 about the calculation result. When seventh control circuit 4044 is notified about the charge/discharge power, and when storage battery 3 is discharged, seventh control circuit 4044 notifies discharge control circuit 4042 about the notified discharge power as a target value. Discharge control circuit 4042 controls the discharge power from storage battery 3 while aiming at the received discharge power target. On the other hand, upon reception of an instruction from eighth control circuit 4097 to suppress the charge power in the state where charging is performed, seventh control circuit 4044 instructs charge control circuit 4041 to perform charge control based on the charge power target received from eighth control circuit 4097 as target electric power. Charge control circuit 4041 controls second DC/DC conversion circuit 403 based on the instructed charge power target as a target value. Upon reception of an instruction from eighth control circuit 4097 to perform discharging in the state where charging is performed, seventh control circuit 4044 instructs charge control circuit 4041 to stop the charge control and notifies discharge control circuit 4042 about the discharge power target. Upon reception of the discharge power target, discharge control circuit 4042 starts the discharge control. In this case, seventh control circuit 4044 outputs a control signal for selecting the output of discharge control circuit 4042 to switching circuit 4043.

When it is determined as NO in S315, when S319 ends, when it is determined as NO in S317, when it is determined as NO in S318, or when S319 ends, then in S320 (FIG. 26), eighth control circuit 4097 calculates the amplitude of the reactive power to be output.

Referring to FIG. 26, in S320, in the same manner as in solar cell power conversion device 2, storage battery power conversion device 4 can also calculate the current amplitude value of the reactive current by means of PI control for bringing the AC effective voltage in consumer premises distribution system 10 close to the target voltage for storage battery power conversion device 4 at the time of deviation from the dead zone width (S125 in FIG. 19). As described with reference to FIG. 21, when the current amplitude of the reactive current is input, reactive current waveform generation circuit 4093 generates a reactive current command value. On the other hand, active current control circuit 4094 calculates the current amplitude of the active current based on the charge/discharge power from storage battery 3. Active current waveform generation circuit 4095 generates a command value of the active current based on the current amplitude information about the active current, as described above. Furthermore, adder 4098 adds the reactive current command value and the active current command value to thereby calculate a current command value. In S321, apparent power is calculated based on the calculated current command value (the apparent current).

In S322, it is determined whether or not the apparent power calculated in S321 does not exceed the capacity of storage battery power conversion device 4. When the apparent power exceeds the capacity (when it is determined as NO in S322), the process proceeds to S323, and suppression of the active power is started. Specifically, eighth control circuit 4097 instructs seventh control circuit 4044 to reduce the charge/discharge power. Seventh control circuit 4044 having received the instruction instructs charge control circuit 4041 or discharge control circuit 4042 to reduce the charge/discharge power amount. In this case, the charging operation is not shifted to the discharging operation or the discharging operation is not shifted to the charging operation.

When the instruction to suppress the active power (charge/discharge power of storage battery 3) in S323 completes or when the apparent power does not exceed the capacity of storage battery power conversion device 4 (when it is determined as YES in S322), then in S324, eighth control circuit 4097 checks the condition for ending the system voltage stabilization control.

In S324, eighth control circuit 4097 checks whether the present value of the AC effective voltage in consumer premises distribution system 10 is equal to or less than the reactive power control end voltage (FIG. 13) or is equal to or greater than the reactive power control end voltage (FIG. 13). In the case where the system voltage stabilization control is started due to deviation from the upper limit voltage of the dead zone width, it is determined as YES in S324 when the AC effective voltage becomes equal to or less than the reactive power control end voltage. On the other hand, in the case where the system voltage stabilization control is started due to deviation from the lower limit voltage of the dead zone width, it is determined as YES in S324 when the AC effective voltage becomes equal to or greater than the reactive power control end voltage.

When it is determined as NO in S324, the process is returned to S301 and the system voltage stabilization control is continued. On the other hand, when it is determined as YES in S324, the process proceeds to S325. In S325, eighth control circuit 4097 compares the result of measuring the reactive power notified from reactive power measurement circuit 20935 in reactive current waveform generation circuit 4093 with a predetermined end determination value. Then, when the result of measuring the reactive power is higher than the end determination value (when it is determined as NO in S325), the process is returned to S301 (FIG. 25), and the system voltage stabilization control is continued.

On the other hand, when the result of measuring the reactive power is equal to or less than the end determination value, it is determined as YES in S325, and then, it is determined in S326 to end the system voltage stabilization control. Furthermore, in S327, the system voltage stabilization control flag is cleared, and then, the process is returned to S301.

In this way, in the power conversion device according to the first embodiment, the command value calculated by first control circuit 204 is input into first DC/DC conversion circuit 203 and used for control of the output voltage of solar cell 1 so as to extract the electric power generated by solar cell 1. Similarly, the command value calculated by second control circuit 209 is input into first DC/AC conversion circuit 208 and used for the control for converting, into AC power, the electric power generated by solar cell 1 and output from first DC/DC conversion circuit 203. As a result, the electric power generated by solar cell 1 is output as AC power to consumer premises distribution system 10.

Similarly, the command value calculated by third control circuit 404 is input into second DC/DC conversion circuit 403, and used for the control of the charge/discharge power from storage battery 3. The command value calculated by fourth control circuit 409 is input into second DC/AC conversion circuit 408 and used for the control for converting, into AC power, the charge/discharge power of storage battery 3 output from second DC/DC conversion circuit 403. As a result, the electric power output from storage battery 3 is eventually output as AC power to consumer premises distribution system 10.

The following is an explanation about the reason why the condition for ending the system voltage stabilization control (S324, S325) is determined as described above.

Normally, when the system voltage stabilization control is not performed during the system interconnection operation, the AC effective voltage in consumer premises distribution system 10 reaches the value in the vicinity of the voltage control target value shown in FIG. 13. Thus, even in the case where the system voltage deviates from the SVR operational voltage range (see FIG. 14) under the present tap selection of automatic voltage regulator (SVR) 23 due to the influence of an abrupt change of solar radiation and the like, but in the case where the system voltage is controlled by the above-mentioned system voltage stabilization control, when the conditions such as solar radiation are returned to their original conditions, the system voltage in consumer premises distribution system 10 is controlled to change toward the target voltage even without output of the reactive power, with the result that this system voltage is returned to the vicinity of the voltage control target value.

For example, as described with reference to FIG. 13, when deviation from the upper limit value of the dead zone width occurs, the end determination voltage (condition) for system stabilization control is set at a value smaller than the target voltage in system voltage stabilization control and larger than the voltage control target value (moving average value). By such the setting, when the conditions such as solar radiation are returned to the original conditions, the AC effective voltage in consumer premises distribution system 10 becomes equal to or less than the target voltage by system voltage stabilization control even without performing system voltage stabilization control (even without output of the reactive power). By setting the ending condition in this way, the end of the system voltage stabilization control can be reliably determined. Furthermore, in the first embodiment, the condition for ending storage battery power conversion device 4 includes both comparison between the reactive power and the end determination value (S324) and comparison between the AC effective voltage and the end determination voltage (S325), whereas the condition for ending solar cell power conversion device 2 includes comparison between the reactive power and the end determination value (S221) but does not include comparison with the end determination voltage. Thereby, the reactive power output by solar cell power conversion device 2 can be ended earlier than the output of the reactive power by storage battery power conversion device 4.

In the present first embodiment, the operation of town storage battery power conversion device 21 is not described in detail. However, in the same manner as in storage battery power conversion device 4, CEMS 15 can perform processing of the dead zone width information notified from CEMS 15 (processing described with reference to FIGS. 13 and 20) and calculation of the system voltage control target value at the time of the system voltage stabilization control and the reactive power control end voltage. Furthermore, by the configuration in which CEMS 15 is notified about various types of measurement data measured by storage battery power conversion device 4 at the similar timing, town storage battery power conversion device 21 can be controlled in the same manner as with storage battery power conversion device 4. Furthermore, the control of town storage battery power conversion device 21 can also be determined based on the impedance information on the distribution system, the prediction of the power generation amount from solar cell 1, and the result of predicting power consumption in a load when CEMS 15 generates the dead zone width information. Thereby, the system voltage stabilization control by town storage battery power conversion device 21 can also be autonomously performed without establishing communication with the consumer-side distributed power supply. As a result, the voltage fluctuations in consumer premises distribution system 10 and distribution system 14 can be suppressed by the system voltage stabilization control in association with solar cell power conversion device 2 and storage battery power conversion device 4. This allows a reduction in the storage capacity of storage battery 3 and the storage capacity of town storage battery 20 that are disposed in each consumer house.

As described above, in the distributed power supply system equipped with the power conversion device according to the present first embodiment, when the distribution system voltage (consumer premises distribution system 10 or distribution system 14) temporarily rises or lowers due to an abrupt change of solar radiation or an abrupt change in load, the system voltage can be stabilized using the distributed power supply in each consumer house. For example, even when a mega-solar system is constituted of a collection of about 300 ZEH houses, the distribution system voltage can be stabilized without having to introduce system stabilization facilities such as expensive SVC. Specifically, the conventional automatic voltage regulator (SVR) disposed in distribution system 16 (on the primary side of pole-mounted transformer 9) is utilized to regulate the voltage fluctuations in a long cycle by the automatic voltage regulator (SVR). In contrast, for the voltage fluctuations in a short cycle resulting from an abrupt change of solar radiation or load fluctuations, a distributed power supply (power conversion device) in each consumer house 18 controls the active power and/or the reactive power to thereby allow stabilization of the system voltage without having to introduce new system stabilization facilities. Also, the storage battery for a distribution system (town storage battery 20) introduced in order to stabilize the distribution system voltage is operated in cooperation and coordination with storage battery 3 on the consumer side as described above, thereby allowing reduction of the storage battery capacity.

Furthermore, by setting the dead zone width information for each consumer based on the impedance information on the distribution system, prediction of the power generation amount from solar cell 1 and the result of predicting the power consumption of the load, system voltage stabilization control by the distributed power supplies in respective consumer houses 18 can be started at the same timing and ended at the same timing. This can prevent a burden difference among the consumers from occurring due to the difference in interconnection point among the consumers' distribution systems.

Also in the present first embodiment, in the case of an energy creation device such as solar cell 1 and solar cell power conversion device 2, the dead zone information is switched in accordance with the electric power generated by solar cell 1 (energy creation device), so that unnecessary suppression of the electric power generated by the energy creation device can be avoided. Specifically, in the case where the electric power generated by solar cell 1 (energy creation device) is equal to or greater than a reference value, and the case where the apparent power needs to be suppressed when solar cell power conversion device 2 as an energy creation device outputs reactive power, a relatively large dead zone width is set to make it difficult to start the system voltage stabilization control. Thereby, the system voltage stabilization control by other distributed power supplies such as storage battery power conversion device 4 as an energy storage device can be started before.

Furthermore, in the case where solar cell 1 (energy creation device) generates less electric power and the apparent power does not need to be suppressed even when solar cell power conversion device 2 as an energy creation device outputs reactive power, a relatively small dead zone width is set to make it easy to start the system voltage stabilization control, thereby making it difficult to start the system voltage stabilization control by storage battery power conversion device 4 and the like as an energy storage device, with the result that the power consumption in the entire system can be suppressed.

Second Embodiment

The first embodiment has been described with regard to an example in which the dead zone width information notified to solar cell power conversion device 2 is processed by HEMS 7 into two types and the dead zone width information notified to storage battery power conversion device 4 is also processed by HEMS 7, with the result that a total of three different types of dead zone width information is notified from the HEMS to the power conversion device.

In the second embodiment, the dead zone width information is not processed as in the first embodiment. Also, the target voltage of the system voltage (consumer premises distribution system 10) at the time of system voltage stabilization control and the end determination voltage for the system voltage stabilization control by reactive power output are differently calculated. In addition, as to the control configuration, the second embodiment is different from the first embodiment in the configurations of voltage control target value generation circuits 2099 and 4099. The second embodiment will be described in detail only with regard to the differences from the first embodiment, but no description will be made with regard to the same configuration and controlling process as those in the first embodiment.

Figure 27:
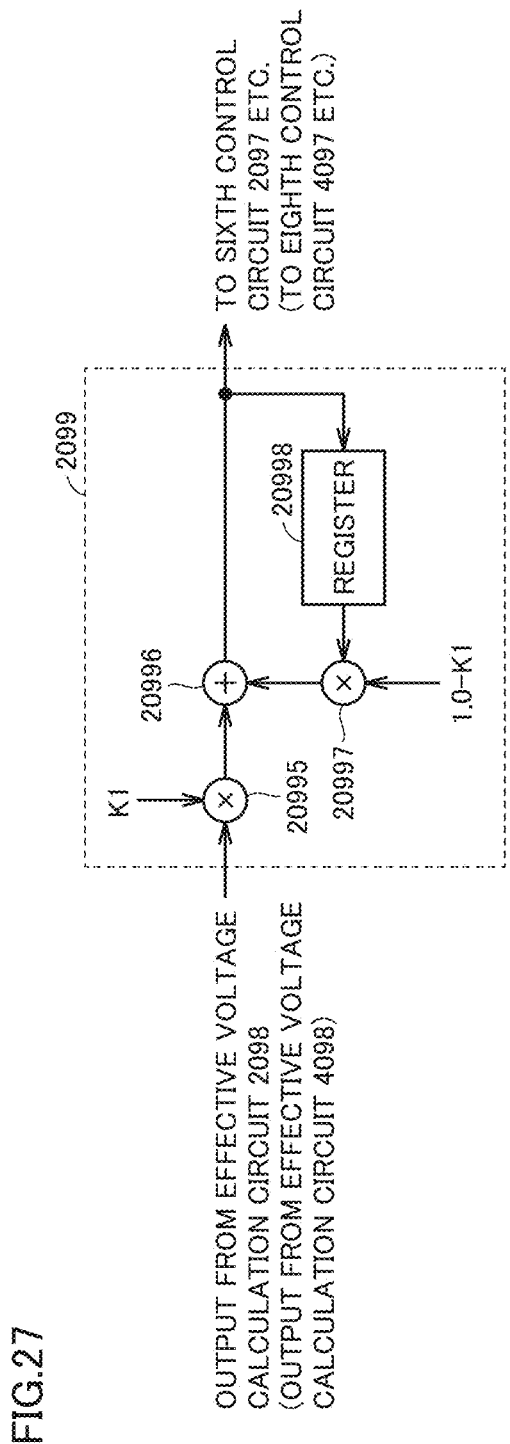
FIG. 27 is a block diagram illustrating a configuration of a voltage control target value generation circuit according to the second embodiment.

FIG. 27 is a block diagram illustrating a configuration of a voltage control target value generation circuit according to the second embodiment. Also in the second embodiment, since voltage control target value generation circuits 2099 and 4099 have the same configuration, voltage control target value generation circuit 2099 will be hereinafter representatively described.

Referring to FIG. 27, voltage control target value generation circuit 2099 includes a first multiplier 20995, an adder 20996, a second multiplier 20997, and a register 20998.

First multiplier 20995 multiplies the AC effective voltage calculated by effective voltage calculation circuit 2098 by a coefficient K1. The multiplied value output from first multiplier 20995 is input into adder 20996. Adder 20996 adds the output from first multiplier 20995 and the output from second multiplier 20997. The output from adder 20996 is output to sixth control circuit 2097 and the like and input also into register 20998 so as to apply a time delay for one sample. The output from register 20998 is input into second multiplier 20997 and multiplied by (1.0−K1) in second multiplier 20997 and then input into adder 20996 as described above.

In this way, voltage control target value generation circuit 2099 removes a high frequency component of the effective voltage with an infinite impulse response (IIR) filter, thereby generating a voltage control target value. By the configuration as described above, the number of registers and the number of adders can be reduced as compared with the configuration in the first embodiment (FIG. 11). Also, such a simple configuration can be implemented with software (S/W) by using a CPU and the like.

Figure 28:
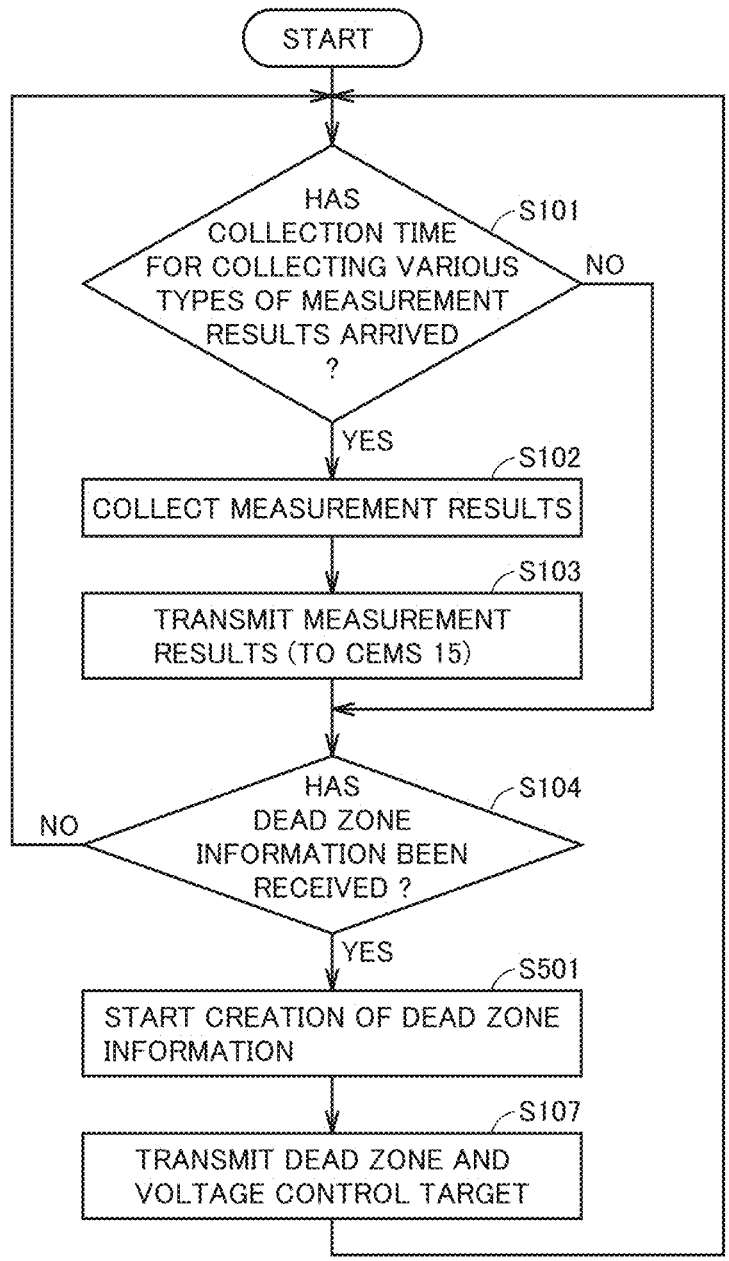
FIG. 28 is a flowchart illustrating a control process of an HEMS according to the second embodiment.
Figure 29:
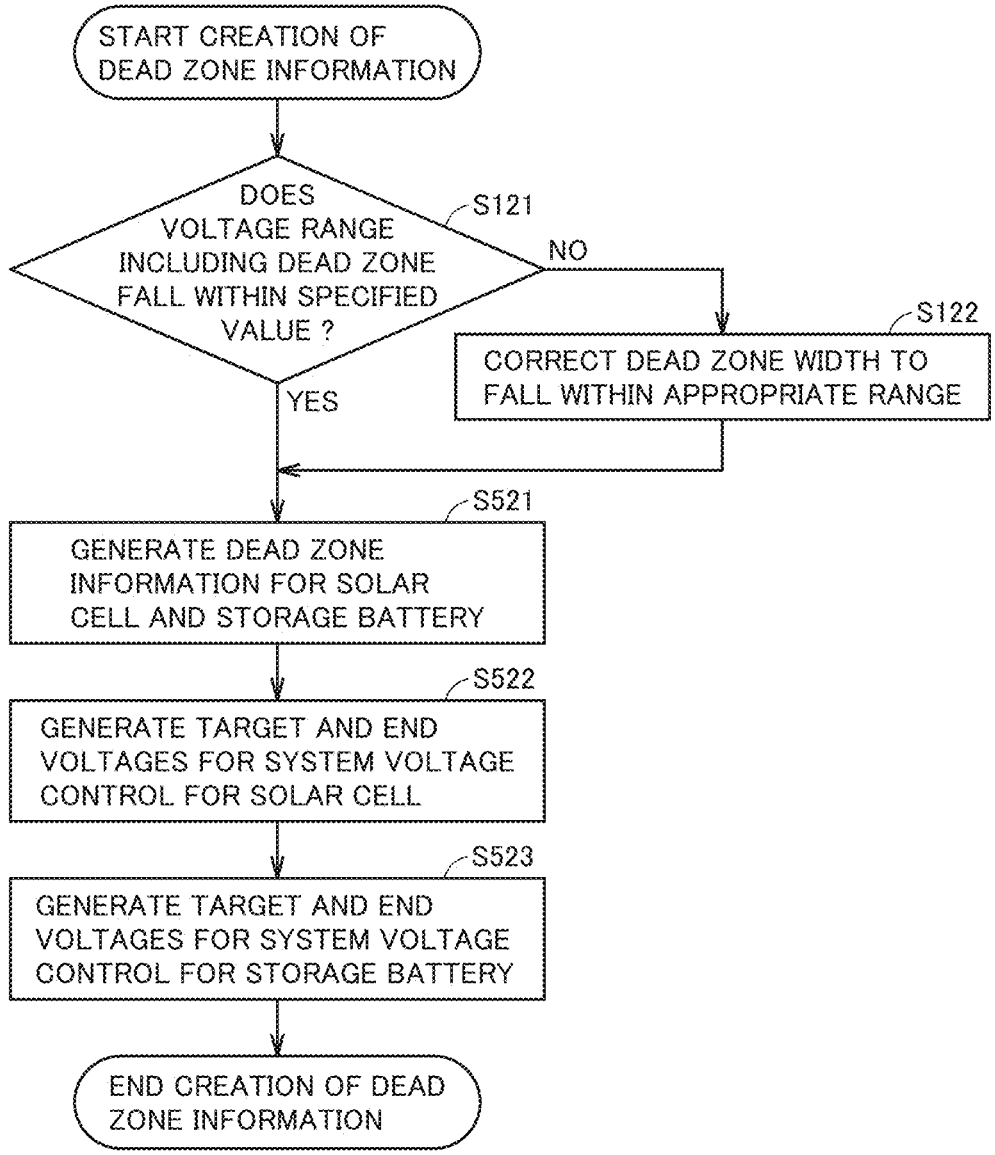
FIG. 29 is a flowchart illustrating details of a control process for generating dead zone width information according to the second embodiment.

The following is an explanation with reference to FIGS. 28 to 30 about calculation of: the dead zone width information; the system voltage control target of each power conversion device at the time of system voltage stabilization control (target voltage); and the end determination voltage for system voltage stabilization control by reactive power control of each power conversion device, in the second embodiment.

FIG. 28 is a flowchart illustrating a control process of HEMS 7 (FIG. 1) according to the second embodiment.

Referring to FIG. 28, HEMS 7 performs the process in S101 to S103 as in FIG. 18. Thereby, the HEMS collects, in a certain time cycle; the voltage control target values (target voltages) of solar cell power conversion device 2 and storage battery power conversion device 4; the output time of the reactive power measured by reactive power output time measurement circuit 20934 in reactive current waveform generation circuit 2093 (4093); the reactive power control amount generated from the reactive current amplitude information output from reactive current control circuit 2092 (4092); and the power consumption amount of the load measured by power measurement circuit 61 in power switchboard 6; the amount of electric power generated by solar cell 1; and the charge/discharge power amount of storage battery 3, which are then transmitted to CEMS 15.

Furthermore, HEMS 7 checks in S104 similar to that in FIG. 18 whether a notification of new dead zone information is given or not from CEMS 15. When no notification is given (when it is determined as NO in S104), the process is returned to S101. On the other hand, when dead zone information is notified (when it is determined as YES in S104), then in S501, HEMS 7 generates dead zone width information to be notified to solar cell power conversion device 2 and storage battery power conversion device 4.

FIG. 29 is a flowchart illustrating details of the control process in S501 in FIG. 28. FIG. 30 is a conceptual diagram illustrating the dead zone width information, the target voltage at the time of system voltage stabilization control and the end determination voltage of the system voltage stabilization control by the reactive power output in the second embodiment.

In the first embodiment, the dead zone information on solar cell power conversion device 2 (two types) and the dead zone information on storage battery power conversion device 4 (one type) are separately set (FIG. 13). In contrast, referring to FIG. 30, in the second embodiment, common dead zone information is set for solar cell power conversion device 2 and storage battery power conversion device 4.

Furthermore, in the second embodiment, the target voltage at the time of system voltage stabilization control and the end determination voltage for ending the system voltage stabilization control by the reactive power output are separately set for solar cell power conversion device 2 and storage battery power conversion device 4. Thus, in the second embodiment, the condition for ending the system voltage stabilization control in solar cell power conversion device 2 (S221) shown in FIG. 23 is set to additionally include the condition by comparison between the AC effective voltage and the end determination voltage as in S324 in FIG. 26.

Referring to FIG. 29, in S121 similar to that in FIG. 19, HEMS 7 checks whether the voltage range of the dead zone width is appropriate or not. In the second embodiment, as described above, the voltage control target value of consumer premises distribution system 10 is calculated by removing a high frequency component from the AC effective voltage in consumer premises distribution system 10 with a primary IIR filter shown in FIG. 26. Furthermore, the voltage control target value changes with time as in the first embodiment. As in the first embodiment, when the upper limit voltage and the lower limit voltage of the dead zone by the dead zone width information in common to solar cell power conversion device 2 and storage battery power conversion device 4 deviate from the range of the system voltage upper limit specified value to the system voltage lower limit specified value, then in S122, at least one of the upper limit voltage and the lower limit voltage of the dead zone is corrected to fall between the system voltage upper limit specified value and the system voltage lower limit specified value in the same manner as described in FIG. 20.

When it is determined as YES in S121 or when S122 ends, then in S521, HEMS 7 generates dead zone information that is common to solar cell power conversion device 2 and storage battery power conversion device 4. In this case, in the above-mentioned S121 and S122, the dead zone information notified from CEMS 15 is processed as required such that the upper limit voltage and the lower limit voltage of the dead zone fall between the system voltage upper limit specified value and the system voltage lower limit specified value.

FIG. 30(*a*) shows settings of the target voltage and the end determination voltage at the time of system voltage stabilization control for each of solar cell power conversion device 2 and storage battery power conversion device 4 in the case where deviation from the upper limit voltage of the dead zone width occurs.

As shown in FIG. 30(*a*), when deviation from the upper limit voltage of the dead zone width occurs, the target voltage and the end determination voltage for each of solar cell power conversion device 2 and storage battery power conversion device 4 are set so as to establish the relation of "the upper limit voltage of the dead zone width" "the target voltage for solar cell power conversion device 2 as an energy creation device" "the target voltage for storage battery power conversion device 4 as an energy storage device" "the end determination voltage for solar cell power conversion device 2 as an energy creation device" "the end determination voltage for storage battery power conversion device 4 as an energy storage device" "the voltage control target value for consumer premises distribution system 10".

FIG. 30(*b*) shows settings of the target voltage and the end determination voltage at the time of system voltage stabilization control for each of solar cell power conversion device 2 and storage battery power conversion device 4 in the case where deviation from the lower limit voltage of the dead zone width occurs.

As shown in FIG. 30(*b*), when deviation from the lower limit voltage of the dead zone width occurs, the target voltage and the end determination voltage for each of solar cell power conversion device 2 and storage battery power conversion device 4 are set so as to establish the relation of "the lower limit voltage of the dead zone width"≤"the target voltage for solar cell power conversion device 2 as an energy creation device"≤"the target voltage for storage battery power conversion device 4 as an energy storage device"≤"the end determination voltage for solar cell power conversion device 2 as an energy creation device"≤"the end determination voltage for storage battery power conversion device 4 as an energy storage device"≤"the voltage control target value for consumer premises distribution system 10".

By the settings as shown in FIGS. 30(*a*) and 30(*b*), system voltage stabilization control can be simultaneously started for solar cell power conversion device 2 as an energy creation device and storage battery power conversion device 4 as an energy storage device. Furthermore, when the AC effective voltage in consumer premises distribution system 10 deviates from the upper limit voltage of the dead zone width, the reactive power is output preferentially from storage battery power conversion device 4 since the target voltage for storage battery power conversion device 4 is lower than the target voltage for solar cell power conversion device 2. This can minimize the reactive power output from solar cell power conversion device 2, so that suppression of the electric power generated by solar cell 1 can be minimized. Similarly, when the AC effective voltage in consumer premises distribution system 10 deviates from the lower limit voltage of the dead zone width, the reactive power is output preferentially from storage battery power conversion device 4 since the target voltage for storage battery power conversion device 4 is higher than the target voltage for solar cell power conversion device 2. This can minimize the reactive power output from solar cell power conversion device 2, so that suppression of the electric power generated by solar cell 1 can be minimized.

Furthermore, the end determination voltage for system voltage stabilization control in the case where the AC effective voltage of the system voltage deviates from the upper limit voltage of the dead zone width is set higher than the end determination voltage for storage battery power conversion device 4. Thereby, the output of reactive power from solar cell power conversion device 2 can be preferentially ended. This can minimize the reactive power output from solar cell power conversion device 2, so that suppression of the electric power generated by solar cell 1 can be minimized. Similarly, the end determination voltage for system voltage stabilization control in the case where the effective voltage of the system voltage deviates from the lower limit voltage of the dead zone width is set lower than the end determination voltage for solar cell power conversion device 2 than the end determination voltage for storage battery power conversion device 4. Thereby, the output of reactive power from solar cell power conversion device 2 can be preferentially ended. This can minimize the reactive power output from solar cell power conversion device 2, so that suppression of the electric power generated by solar cell 1 can be minimized.

Again referring to FIG. 29, in S522, HEMS 7 generates the target voltage at the time of system voltage stabilization control and the end determination voltage for the system voltage stabilization control by the output of reactive power, each of which is notified to solar cell power conversion device 2, as described with reference to FIGS. 30(*a*) and 30(*b*). Similarly, in S523, HEMS 7 generates the target voltage at the time of system voltage stabilization control and the end determination voltage for the system voltage stabilization control by the output of reactive power, each of which is notified to storage battery power conversion device 4, as described with reference to FIGS. 30(*a*) and 30(*b*).

Again referring to FIG. 28, when S523 ends, then in S107, HEMS 7 transmits the dead zone width information as well as the target voltage and the end determination voltage at the time of system voltage stabilization control that are generated in S521 to S523 (FIG. 29), to solar cell power conversion device 2 and storage battery power conversion device 4.

As described above, in the present second embodiment, HEMS 7 generates the dead zone width information as well as the voltage target and the end determination voltage at the time of system voltage stabilization control, so that the reactive power output from solar cell power conversion device 2 can be minimized. As a result, suppression of the electric power generated by solar cell 1 can be minimized. Furthermore, by the settings of the target voltage for system voltage stabilization control and the end determination voltage as one of the conditions for ending the system voltage stabilization control as shown in FIGS. 30(a) and 30(b), hysteresis can be included in the conditions for starting/ending the system voltage stabilization control. This can prevent a hunting operation in which system voltage stabilization control is repeatedly started/stopped in a short time.

Third Embodiment

The third embodiment will be described with regard to the case where, in contrast to the first embodiment, HEMS 7 generates one type of dead zone width information to be notified to solar cell power conversion device 2 and also generates two types of dead zone width information to be notified to storage battery power conversion device 4, thereby obtaining a total of three different types of dead zone width information, which is then notified to each power conversion device.

Figure 31:
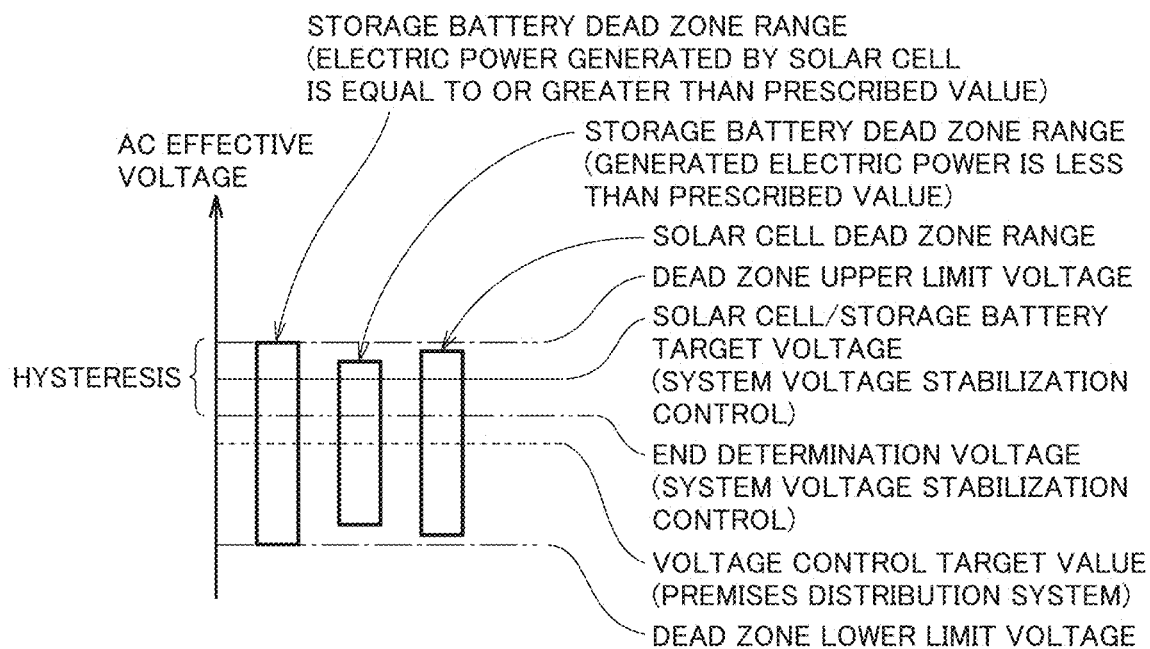
FIG. 31 is a conceptual diagram illustrating dead zone width information, a target voltage at the time of system voltage stabilization control, and an end determination voltage for system voltage stabilization control by reactive power output in the third embodiment.

FIG. 31 is a conceptual diagram illustrating the dead zone width information, the target voltage at the time of system voltage stabilization control, and the end determination voltage for system voltage stabilization control by reactive power output in the third embodiment.

Referring to FIG. 31, in the third embodiment, HEMS 7 sets two types of dead zone widths of storage battery power conversion device 4 in accordance with the comparison between the electric power generated by solar cell 1 and the reference value. Specifically, the range of the dead zone width is processed such that "the dead zone width of storage battery power conversion device 4 in the case where the electric power generated by solar cell 1 is less than the reference value"<"the dead zone width of solar cell power conversion device 2"<"the dead zone width of storage battery power conversion device 4 in the case where the electric power generated by solar cell 1 is equal to or greater than the reference value". Each dead zone width information thus processed is notified to solar cell power conversion device 2 and storage battery power conversion device 4 (notification of two types).

The above-mentioned reference value related to the electric power generated by solar cell 1 can be set to be 0.85 times as large as the rated power as in the first embodiment. Furthermore, the type and the relation of the dead zone width are not limited to the above. For example, two types of dead zone width information on solar cell power conversion device 2 can also be generated as in the first embodiment. Alternatively, system voltage stabilization control can be performed while switching the dead zone width information further in multiple stages in accordance with the electric power generated by solar cell 1.

Furthermore, in the third embodiment, the target voltage at the time of system voltage stabilization control and the end determination voltage for ending the system voltage stabilization control by the reactive power output are set in common to solar cell power conversion device 2 and storage battery power conversion device 4, as in the first embodiment.

According to the third embodiment, when the electric power generated by solar cell 1 is less than the reference value, system voltage stabilization control can be started by the output of the reactive power from solar cell power conversion device 2. On the other hand, when the electric power generated by solar cell 1 is equal to or greater than the reference value, system voltage stabilization control can be started by the output of the reactive power from storage battery power conversion device 4.

As a result, in the same manner as described in the first embodiment (FIG. 13), in the case of the generated electric power (solar cell 1) that does not suppress the electric power generated by solar cell 1 when the reactive power is output from solar cell power conversion device 2, the dead zone width information is processed such that the reactive power is output from solar cell power conversion device 2 before the output of the reactive power from storage battery power conversion device 4 is started. In contrast, in the case of the generated electric power (solar cell 1) that suppresses the electric power generated by solar cell 1 when the reactive power is output from solar cell power conversion device 2, the dead zone width is processed such that the reactive power is output from storage battery power conversion device 4 before the reactive power is output from solar cell power conversion device 2.

As described above, according to the present third embodiment, as shown in FIG. 31, for storage battery power conversion device 4, two types of dead zone width information is generated in accordance with the electric power generated by solar cell 1, to thereby appropriately select the output of the reactive power from solar cell power conversion device 2 and the output of the reactive power by storage battery power conversion device 4 depending on whether the electric power generated by solar cell 1 is high or low, with the result that the system voltage stabilization control can be performed without unnecessarily suppressing the electric power generated by solar cell 1. Furthermore, when the system voltage stabilization control can be performed without suppressing the electric power generated by solar cell 1, the reactive power is output from solar cell power conversion device 2. This can suppress the power consumption (switching loss, standby power and the like) occurring when the reactive power is output from storage battery power conversion device 4.

Furthermore, by setting the target voltage for system voltage stabilization control at the time of dead zone deviation and the end determination voltage as one of the conditions for ending the system voltage stabilization control as shown in FIG. 31, hysteresis can be included in the conditions for starting/ending the system voltage stabilization control. This consequently can prevent a hunting operation in which system voltage stabilization control is repeatedly started/stopped in a short time.

Fourth Embodiment

In the fourth embodiment, as compared with the second embodiment, two types of target voltages for storage battery power conversion device 4 (the AC effective voltage in consumer premises distribution system 10) at the time of system voltage stabilization control are set in accordance with the electric power generated by solar cell 1.

FIG. 32 is a conceptual diagram illustrating the dead zone width information as well as the target voltage at the time of system voltage stabilization control and the end determination voltage for system voltage stabilization control by reactive power output in the fourth embodiment.

Referring to FIG. 32, in the fourth embodiment, HEMS 7 sets two types of target voltages for storage battery power conversion device 4 in accordance with the comparison between the electric power generated by solar cell 1 and a reference value. Specifically, when deviation from the upper limit voltage of the dead zone width occurs, the target voltage and the end determination voltage for each of solar cell power conversion device 2 and storage battery power conversion device 4 are set such that "the upper limit voltage of the dead zone width" "the target voltage for solar cell power conversion device 2 (energy creation device)" and such that "the target voltage for storage battery power conversion device 4 (energy storage device) in the case where the electric power generated by solar cell 1 is less than the reference value" "the target voltage for storage battery power conversion device 4 (energy storage device) in the case where the electric power generated by solar cell 1 is equal to or greater than the reference value" "the end determination voltage for solar cell power conversion device 2 (energy creation device)" "the end determination voltage for storage battery power conversion device 4 (energy storage device)" "the voltage control target value for consumer premises distribution system 10".

On the other hand, although not shown, when deviation from the lower limit voltage of the dead zone width occurs, the target voltage and the end determination voltage for each of solar cell power conversion device 2 and storage battery power conversion device 4 are set such that "the lower limit voltage of the dead zone width"≤"the target voltage for solar cell power conversion device 2 (energy creation device)", and such that "the target voltage for storage battery power conversion device 4 (energy storage device) in the case where the electric power generated by solar cell 1 is less than the reference value" "the target voltage for storage battery power conversion device 4 (energy storage device) in the case where the electric power generated by solar cell 1 is equal to or greater than the reference value"≤"the end determination voltage for solar cell power conversion device 2 (energy creation device)"≤"the end determination voltage for storage battery power conversion device 4 (energy storage device)"≤"the voltage control target value for consumer premises distribution system 10".

By the setting as described above, as in the second embodiment, when the AC effective voltage of consumer premises distribution system 10 deviates from the upper limit voltage of the dead zone width, the reactive power is output preferentially from storage battery power conversion device 4 since the target voltage for storage battery power conversion device 4 in the case where the electric power generated by solar cell 1 is equal to or greater than the reference value is lower than the target voltage for solar cell power conversion device 2. This can minimize the reactive power output from solar cell power conversion device 2, so that suppression of the electric power generated by solar cell 1 can be minimized.

Similarly, when the AC effective voltage in consumer premises distribution system 10 deviates from the lower limit voltage of the dead zone width, the reactive power is output preferentially from storage battery power conversion device 4 since the target voltage for storage battery power conversion device 4 in the case where the electric power generated by solar cell 1 is equal to or greater than the reference value is higher than the target voltage for solar cell power conversion device 2. This can minimize the reactive power output from solar cell power conversion device 2, so that suppression of the electric power generated by solar cell 1 can be minimized.

As a result, also in the fourth embodiment, as in the second embodiment, the reactive power output from solar cell power conversion device 2 can be minimized, so that suppression of the electric power generated by solar cell 1 can be minimized. Also as in the second embodiment, hysteresis can be included in the starting/ending conditions applied when performing system voltage stabilization control, so that a hunting operation in the system voltage stabilization control can be prevented.

According to the configuration in the present first to fourth embodiments, when voltage control target value generation circuit 2099 (4099) generates a voltage control target value of the AC voltage, it uses the moving average value of the AC effective voltage output from effective voltage calculation circuit 2098 (4098) or uses the value obtained by removing a high frequency component with a low pass filter (LPF) by an IIR filter, but the present disclosure is not limited thereto. For example, the similar effect can be achieved even by using a signal with an FIR filter or a signal having passed through an analog filter. Moreover, the time length for calculating the moving average value is not limited to 1 minute, but may be any time length such as 5 minutes or 30 seconds. Furthermore, the configurations of the IIR filter and the FIR filter each are not limited to the primary configurations illustrated in FIGS. 11 and 27, but may be a secondary filter or a higher order filter.

Furthermore, in the present first to fourth embodiments, various types of measurement results obtained by measurements with the distributed power supply and output from communication interface circuit 212 (412) may be at least one of: the control target voltage of the AC voltage generated in voltage control target value generation circuit 2099 (4099); the active power amount suppressed for controlling the AC voltage; the time during which the active power is suppressed; the reactive power amount supplied from first DC/AC conversion circuit 208 or second DC/AC conversion circuit 408; and the time during which the reactive power is output. Furthermore, the above-mentioned measurement results may also include the stored charge energy (SOC) of storage battery 3, the electric power generated by solar cell 1, and the power consumption of the load.

Furthermore, in the present first to fourth embodiments, HEMS 7 sets the target voltages for solar cell power conversion device 2 and storage battery power conversion device 4 at the time of system voltage stabilization control, as shown in FIG. 13 and FIGS. 30 to 32, but the setting of the voltage control target value is not limited to such examples. As long as the voltage control target value of the AC voltage applied when controlling the active power and the reactive power in first DC/AC conversion circuit 208 or second DC/AC conversion circuit 408 is set to fall between the control target voltage of the AC voltage output from voltage control target value generation circuit 2099 (4099) and at least one of the upper limit voltage and the lower limit voltage of the dead zone width, the system voltage in consumer premises distribution system 10 can be set to fall within the range corresponding to the SVR operational upper and lower limit voltage values, so that the similar effect can be achieved.

Furthermore, the present first to fourth embodiments each can achieve the similar effect even by controlling the system voltage stabilization control to be ended in the case where both the active power and the reactive power for controlling the AC voltage by second control circuit 209 or fourth control circuit 409 become less than a predetermined determination value when performing the system voltage stabilization control by second control circuit 209 or fourth control circuit 409.

Furthermore, in the present first to fourth embodiments, a plurality of distributed power supplies such as solar cell power conversion device 2 and storage battery power conversion device 4 are connected to the distribution system. In the case where the plurality of distributed power supplies include a plurality of energy creation devices and a plurality of energy storage devices as described in the embodiments, the dead zone width information is used among the energy creation devices and the energy storage devices. Thereby, as described above, by changing the dead zone width information in the power generation state of the energy creation device or the operating state (charge or discharge) of the power storage device or the operating state (heat storage or standby) of the heat storage device, unnecessary suppression of the electric power generated by the energy creation device or generation of reactive power can be avoided. For example, when the power storage device is operating while the system voltage rises, the operations that can be preferentially performed is to reduce discharge power, to increase charge power, or to start the heat storage device. On the other hand, when the power storage device is operating while the system voltage decreases, the operation that can be preferentially performed is to decrease charge power or to increase discharge power. Also, when the heat storage device is operating while the system voltage decreases, the operation that can be preferentially performed is to stop the heat storage device.

Moreover, in the present first to fourth embodiments, a plurality of distributed power supplies such as solar cell power conversion device 2 and storage battery power conversion device 4 are connected to the distribution system. In the case where the plurality of distributed power supplies include a plurality of energy creation devices and a plurality of energy storage devices as described in the embodiments, the condition for ending the system voltage stabilization control applied when the AC effective voltage in the distribution system deviates from the voltage range indicated by the dead zone width information is controlled to be different between solar cell power conversion device 2 (first DC/AC conversion circuit 208) and storage battery power conversion device 4 (second DC/AC conversion circuit 408). Thereby, the apparent power increases by the output of reactive power. Thus, when the energy creation device (solar cell 1) and the like suppress generated electric power, the system voltage stabilization control by the energy creation device side (solar cell power conversion device 2) can be preferentially ended while the system voltage stabilization control by the energy storage device side (storage battery power conversion device 4) can be continued. As a result, the system voltage is stabilized by the system voltage stabilization control while excessive suppression of the electric power generated by the energy creation device can be prevented.

In the present first to fourth embodiments, when the system voltage deviates from the voltage range indicated by the dead zone width information, the target voltage for the system voltage stabilization control performed by first DC/AC conversion circuit 208 and second DC/AC conversion circuit 408 is set to fall within the dead zone width information, and also, the condition for ending the system voltage stabilization control includes a condition that the reactive power amount output from first DC/AC conversion circuit 208 or second DC/AC conversion circuit 408 becomes equal to or less than the end determination value. This can prevent a hunting operation in which system voltage stabilization control is repeatedly started/stopped in a short time period.

Furthermore, regarding the condition for ending the system voltage stabilization control, in the configuration in which a plurality of distributed power supplies connected to a distribution system include a plurality of energy creation devices and a plurality of energy storage devices as described in the embodiments, the output of the reactive power on the energy creation device side (solar cell power conversion device 2) is set to be ended earlier than the output of the reactive power on the energy storage device side (storage battery power conversion device 4). Thereby, excessive suppression of electric power generated by the energy creation device can be prevented.

In the present first to fourth embodiments, solar cell power conversion device 2 preferentially performs the system voltage stabilization control by control of the reactive power, but the present disclosure is not limited thereto. For example, the priority order of active power control (S216 in FIG. 23) and reactive power control (in S214 in FIG. 23) may be determined for each consumer based on the system impedance. Specifically, it is preferable that, in the case where the main element of the system impedance is a reactor or a capacitor, as described in the first to fourth embodiments, the system voltage stabilization control by reactive power is prioritized, whereas, in the case where the main element of the system impedance is a resistance, the system voltage stabilization control is performed while prioritizing active power control. In this case, based on the system impedance information notified from distribution automation system 25 through CEMS 15, HEMS 7 can determine the priority order of the reactive power control and the active power control. Thus, by notifying solar cell power conversion device 2 and storage battery power conversion device 4 about the determination result by HEMS 7, the system voltage stabilization control can be effectively performed based on the impedance information on the distribution system.

Moreover, in the present first to fourth embodiments, when the dead zone width information of storage battery power conversion device 4 is determined, and in the case where the electric power generated by solar cell 1 is not suppressed even by the reactive power output from solar cell power conversion device 2, the system voltage stabilization control is performed such that solar cell power conversion device 2 outputs reactive power while storage battery power conversion device 4 is not operated. Thereby, a system voltage rise can be suppressed without unnecessarily causing power loss resulting from switching loss or conduction loss that is caused by operating storage battery power conversion device 4. Moreover, when storage battery power conversion device 4 does perform charging and discharging, storage battery power conversion device 4 can be operated in the standby mode in which the standby power can be reduced, thereby allowing suppression of unnecessary power consumption.

In the present first to fourth embodiments, HEMS 7 processes the dead zone width information and the like and notifies storage battery power conversion device 4 and solar cell power conversion device 2 in consumer house 18 about the processed information. Thus, voltage rise in consumer premises distribution system 10 can be suppressed in cooperation and coordination without direct exchange of data through consumer premises communication network 11 and the like between storage battery power conversion device 4 and solar cell power conversion device 2. For example, when the electric power generated by solar cell 1 is equal to or greater than a reference value, the dead zone is processed to allow storage battery power conversion device 4 to output reactive power to start system voltage stabilization control before the electric power generated by solar cell 1 is suppressed. This can prevent excessive suppression of the electric power generated by solar cell 1 without requiring communication between storage battery power conversion device 4 and solar cell power conversion device 2.

Similarly, CEMS 15 generates dead zone information based on the impedance information on the distribution system notified from distribution automation system 25, the prediction of the power generation amount from solar cell 1, and the result of predicting the power consumption of the load. Thus, the distributed power supplies (power conversion devices) in respective consumer houses 18 can perform system voltage stabilization control in autonomous cooperation and coordination with one another without direct communication among the distributed power supplies in respective consumer houses 18. The first to fourth embodiments have been described with regard to the control by which the dead zone information notified from CEMS 15 is processed by HEMS 7 and notified to each distributed power supply, but the present disclosure is not limited thereto, and the dead zone information can also be processed within each distributed power supply, i.e., in storage battery power conversion device 4 and solar cell power conversion device 2 in each consumer house 18.

Moreover, in the first to fourth embodiments, for controlling the output of the reactive power in solar cell power conversion device 2 and storage battery power conversion device 4, the dead zone information is processed and hysteresis is included in the conditions for starting and ending the system voltage stabilization control. This can prevent a hunting operation in which the system battery stabilization control is repeatedly started and ended in a short time period. In particular, hunting of storage battery power conversion device 4 between the standby mode and another operation mode can be prevented, and a relay and the like for conduction in a main circuit (not shown) can be prevent from being unnecessarily turned on and off, so that shortening of the device lifetime can be prevented.

Moreover, in the present first to fourth embodiments, when the electric power generated by solar cell 1 is not suppressed but can be output to consumer premises distribution system 10, the reactive power can be generated by first DC/AC conversion circuit 208 in solar cell power conversion device 2 without utilizing storage battery power conversion device 4. Thus, a voltage rise in consumer premises distribution system 10 can be suppressed without causing the above-mentioned unnecessary power consumption. Furthermore, when the electric power generated by solar cell 1 is equal to or greater than a reference value, the dead zone information can be processed such that storage battery power conversion device 4 is started to generate reactive power to thereby suppress a voltage rise in consumer premises distribution system 10. This can avoid unnecessary suppression of the generated electric power output from the energy creation device such as solar cell 1.

Furthermore, the voltage rise in consumer premises distribution system 10 and distribution system 14 can be suppressed by the power conversion device of the distributed power supply disposed in each consumer house 18. Thus, for distribution system 14, expensive system stabilization facilities such as SVC and a system storage battery can be reduced in capacity or the need to provide the system stabilization facilities can be eliminated, which leads to an effect of allowing cost reduction. Furthermore, in the present first to fourth embodiments, the AC voltage as a target for system voltage stabilization control is defined as a voltage in consumer premises distribution system 10, but, if measurable, any AC voltage in other parts, for example, the AC voltage on the input side of smart meter 8 or directly below pole-mounted transformer 9 can also be targeted for system voltage stabilization control.

Moreover, the present first to fourth embodiments have been described assuming that storage battery 3 is a fixed type storage battery in consumer house 18, but storage battery 3 may be an on-vehicle storage battery in an electric vehicle (EV), a plug-in hybrid vehicle (PHEV), a fuel cell vehicle (FCV) or the like. In addition, only reactive power is generated at the time of system voltage stabilization control. Thus, even in the state where an on-vehicle storage battery in EV, PHEV, FCV or the like is not electrically connected to storage battery power conversion device 4, system voltage stabilization control can be performed using storage battery power conversion device 4.

Furthermore, the first embodiment has been described with regard to the case where one fixed-type battery is used as storage battery 3, but the present disclosure is not limited thereto, and an "energy storage device" can also be configured in cooperation with two or more storage batteries or other distributed power supply devices. In the case where a plurality of storage batteries are used in cooperation with one another, one storage battery or two or more storage batteries among these storage batteries can be configured of the above-mentioned on-vehicle storage battery.

Description of Modification

The present first to fourth embodiments have been described with regard to the case where the control circuits in solar cell power conversion device 2 and storage battery power conversion device 4 are configured by hardware (H/W) as shown in FIGS. 3 to 11 and FIG. 27 for easy understanding of the description. However, the similar control function can be implemented even when the function of each block or some of the blocks shown in each block is implemented by software (S/W) mounted on a central processing unit (CPU). Alternatively, for at least some of the blocks, the similar control function can also be implemented by dividing the function of software and hardware.

It should be understood that the embodiments disclosed herein are illustrative and non-restrictive in every respect. The scope of the present invention is defined by the terms of the claims, rather than the description above, and is intended to include any modifications within the meaning and scope equivalent to the terms of the claims.

REFERENCE SIGNS LIST 1 solar cell, 2 solar cell power conversion device, 3 storage battery, 4 storage battery power conversion device, 5 load, 6 power switchboard, 7 HEMS, 8 smart meter, 9 pole-mounted transformer, 10 consumer premises distribution system, 11 consumer premises communication network, 12 signal line, 13 outside premises communication network, 14 distribution system downstream from pole-mounted transformer, 15 CEMS, 18 consumer, 19 section, 20 town storage battery, 21 town storage battery power conversion device, 22 voltmeter, 23 automatic voltage regulator, 24 substation, 25 distribution automation system, 61 power measurement circuit, 201, 206, 210, 401, 406, 410 voltmeter, 202, 207, 211, 402, 407, 411 ammeter, 203 first DC/DC conversion circuit, 204 first control circuit, 205 DC bus, 208 first DC/AC conversion circuit (first inverter), 209 second control circuit, 212 communication interface, 403 second DC/DC conversion circuit, 404 second control circuit, 405 DC bus, 408 second DC/AC conversion circuit (second inverter), 409 fourth control circuit, 412 communication interface, 2041 MPPT control circuit, 2042 voltage control circuit, 2043 switching circuit, 2044 fifth control circuit, 2091 phase detection circuit, 2092 reactive current control circuit, 2093 reactive current waveform generation circuit, 2094 active current control circuit, 2095 active current waveform generation circuit, 2096 adder, 2097 sixth control circuit, 2098 effective voltage calculation circuit, 2099 voltage control target value generation circuit, 2100 dead zone table generation circuit, 4041 charge control circuit, 4042 discharge control circuit, 4043 switching circuit, 4044 seventh control circuit, 4091 phase detection circuit, 4092 reactive current control circuit, 4093 reactive current waveform generation circuit, 4094 active current control circuit, 4095 active current waveform generation circuit, 4096 adder, 4097 eighth control circuit, 4098 effective voltage calculation circuit, 4099 voltage control target value generation circuit, 4100 dead zone table generation circuit, 20931 phase shift circuit, 20932 limiter, 20933 multiplier, 20934 reactive power output time measurement circuit, 20935 reactive power measurement circuit, 20941 active current dead zone control command generation circuit, 20942 active current control command generation circuit, 20943 adder, 20944 output suppression control circuit, 20945 active power measurement circuit, 20946 output suppression time measurement circuit, 20981 multiplier, 20982 integrator, 20983 square root calculator, 20984 divider, 20991 multiplier, 20992, 20992a to 20992m, 20998 register, 20993 adder, 20995 first multiplier, 20996 adder, 20997 second multiplier.

The invention claimed is:

1. A power conversion device disposed between a distributed power supply and an AC distribution system, the power conversion device comprising:
    an inverter to convert DC power output from the distributed power supply into AC power;
    a voltage measurement sensor to measure an AC voltage in the AC distribution system;
    an effective voltage calculator circuit to calculate an AC effective voltage in the AC distribution system from the AC voltage measured by the voltage measurement sensor;
    a voltage control target value generator to generate a voltage control target value for the AC distribution system from the AC effective voltage calculated by the effective voltage calculator circuit;
    a communication interface to transmit and receive data to and from outside the power conversion device; and
    an inverter controller circuit to control an output from the inverter, wherein
    when the AC effective voltage deviates from a voltage range defined to include the voltage control target value in accordance with dead zone information received by the communication interface, the inverter controller circuit controls an operation of the inverter to perform system voltage stabilization control for returning the AC effective voltage to fall within the voltage range by control of active power and reactive power that are output from the inverter,
    wherein
    in the system voltage stabilization control, the inverter controller circuit controls the active power and the reactive power to change the AC effective voltage toward a target voltage that is set to fall within the voltage range, and
    when the AC effective voltage deviates to a high voltage side of the voltage range and the system voltage stabilization control is started, the target voltage is set to fall between the voltage control target value generated by the voltage control target value generator and an upper limit voltage of the voltage range.

2. The power conversion device according to claim 1, wherein
    the voltage control target value generator generates the voltage control target value in accordance with a moving average value of the AC effective voltage calculated by the effective voltage calculator circuit or a value Obtained by removing a high frequency component from the AC effective voltage by a low pass filter.

3. The power conversion device according to claim 1, wherein
    data transmitted from the communication interface to outside the power conversion device includes at least one of
    the voltage control target value generated by the voltage control target value generator,
    the reactive power output from the inverter for the system voltage stabilization control,
    a time length in which the reactive power is output,
    a suppression amount of the active power output from the inverter for the system voltage stabilization control, and
    a time length in which the active power is suppressed.

4. The power conversion device according to claim 1, wherein
    in the system voltage stabilization control, the inverter controller circuit calculates a control command value of the reactive power for causing the AC effective voltage to fall within the voltage range, and adjusts a control command value of the active power to cause the AC effective voltage to fall within the voltage range when electric power according to the control command value cannot be output from the inverter.

5. The power conversion device according to claim 1, wherein
    in the system voltage stabilization control, the inverter controller circuit calculates one of control command values of the reactive power and the active power for causing the AC effective voltage to fall within the voltage range, and adjusts the other of the control command values of the reactive power and the active power to cause the AC effective voltage to fall within the voltage range when electric power according to the one of the control command values cannot be output from the inverter,
    data received by the communication interface from outside the power conversion device includes impedance information of the AC distribution system, and
    the one of the control command values of the reactive power and the active power that is preferentially controlled is selectively determined based on the impedance information.

6. The power conversion device according to claim 1, wherein
when the system voltage stabilization control accompanied by output of the reactive power from the inverter is performed, the inverter controller circuit controls the reactive power to change the AC effective voltage toward a target voltage that is set to fall within the voltage range, and
a condition for ending the system voltage stabilization control includes a condition that the reactive power output from the inverter is equal to or less than a predetermined determination end value.

7. The power conversion device according to claim 1, wherein
in the system voltage stabilization control, the inverter controller circuit controls the active power and the reactive power within a range in which apparent power output from the inverter does not exceed a rated capacity of the inverter, and
a condition for ending the system voltage stabilization control includes a condition that the reactive power output from the inverter is equal to or less than a predetermined determination end value.

8. The power conversion device according to claim 1, wherein
the distributed power supply includes an energy creation device that has a capability to generate DC power,
the inverter includes a first inverter to convert the DC power generated by the energy creation device into the AC power,
a plurality of types of the dead zone information is set for the first inverter,
the first inverter is controlled to perform the system voltage stabilization control when the AC effective voltage deviates from the voltage range defined based on one dead zone information selected from the plurality of types of the dead zone information, and
the one dead zone information is selected from the plurality of types of the dead zone information in accordance with electric power generated by the energy creation device.

9. The power conversion device according to claim 1, wherein
a plurality of the distributed power supplies are connected to the AC distribution system,
the plurality of the distributed power supplies include
an energy creation device having a capability to generate DC power, and
an energy storage device having a capability to store DC power,
the inverter includes
a first inverter to convert the DC power generated b the energy creation device into the AC power, and
a second inverter to perform power conversion between the DC power and the AC power that are input into and output from the energy storage device,
in the system voltage stabilization control, the first inverter controls the active power and the reactive power to change the AC effective voltage toward a first target voltage that is set to fall within the voltage range,
in the system voltage stabilization control, the second inverter controls the active power and the reactive power to change the AC effective voltage toward a second target voltage that is set to fall within the voltage range, and
the first target voltage and the second target voltage are set at different values.

10. The power conversion device according to claim 9, wherein
the second target voltage is set in a plurality of stages in accordance with electric power generated by the energy creation device.

11. A power conversion device disposed between a distributed power supply and an AC distribution system, the power conversion device comprising:
an inverter to convert DC power output from the distributed power supply into AC power;
a voltage measurement sensor to measure an AC voltage in the AC distribution system;
an effective voltage calculator circuit to calculate an AC effective voltage in the AC distribution system from the AC voltage measured by the voltage measurement sensor;
a voltage control target value generator to generate a voltage control target value for the AC distribution system from the AC effective voltage calculated by the effective voltage calculator circuit;
a communication interface to transmit and receive data to and from outside the power conversion device; and
an inverter controller circuit to control an output from the inverter, wherein
when the AC effective voltage deviates from a voltage range defined to include the voltage control target value in accordance with dead zone information received by the communication interface, the inverter controller circuit controls an operation of the inverter to perform system voltage stabilization control for returning the AC effective voltage to fall within the voltage range by control of active power and reactive power that are output from the inverter, wherein
a plurality of the distributed power supplies are connected to the AC distribution system,
the plurality of the distributed power supplies include
an energy creation device having a capability to generate DC power, and
an energy storage device having a capability to store DC power,
the inverter includes
a first inverter to convert the DC power generated by t e energy creation device into the AC power, and
a second inverter to perform power conversion between the DC power and the AC power that are input into and output from the energy storage device, and
the dead zone information set for the first inverter is different from the dead zone information set for the second inverter.

12. The power conversion device according to claim 11, wherein
a plurality of types of the dead zone information is set for the second inverter,
the second inverter is controlled to perform the system voltage stabilization control when the AC effective voltage deviates from the voltage range defined based on one dead zone information selected from the plurality of types of the dead zone information, and
the one dead zone information is selected from the plurality of types of the dead zone information in accordance with electric power generated by the energy creation device.

13. A power conversion device disposed between a distributed power supply and an AC distribution system, the power conversion device comprising:
an inverter to convert DC power output from the distributed power supply into AC power;

a voltage measurement sensor to measure an AC voltage in the AC distribution system;

an effective voltage calculator circuit to calculate an AC effective voltage in the AC distribution system from the AC voltage measured by the voltage measurement sensor;

a voltage control target value generator to generate a voltage control target value for the AC distribution system from the AC effective voltage calculated by the effective voltage calculator circuit:

a communication interface to transmit and receive data to and from outside the power conversion device; and an inverter controller circuit to control an output from the inverter, wherein when the AC effective voltage deviates from a voltage range defined to include the voltage control target value in accordance with dead zone information received by the communication interface, the inverter controller circuit controls an operation of the inverter to perform system voltage stabilization control for returning the AC effective voltage to fall within the voltage range by control of active power and reactive power that are output from the inverter, wherein a plurality of the distributed power supplies are connected to the AC distribution system, the plurality of the distributed power supplies include an energy creation device having a capability to generate DC power, and an energy storage device having a capability to store DC power, the inverter includes a first inverter to convert the DC power generated by the energy creation device into the AC power, and a second inverter to perform power conversion between the DC power and the AC power that are input into and output from the energy storage device, a condition for ending system voltage stabilization control is set separately for the first inverter and the second inverter, and the condition for ending is set such that output of the reactive power by the first inverter ends earlier than output of the reactive power by the second inverter.

* * * * *

UNITED STATES PATENT AND TRADEMARK OFFICE
CERTIFICATE OF CORRECTION

PATENT NO. : 11,489,338 B2
APPLICATION NO. : 17/040055
DATED : November 1, 2022
INVENTOR(S) : Sadayuki Inoue et al.

It is certified that error appears in the above-identified patent and that said Letters Patent is hereby corrected as shown below:

In the Specification

Column 24, Line 16, should be changed from "Vr*± 4Vdz" to -- Vr*± ΔVdz --.

Column 43, Line 48, should be changed from "upper limit voltage of the dead zone width" "the target" to -- upper limit voltage of the dead zone width" ≥ "the target --.

Column 43, Line 50, should be changed from "energy creation device" "the target voltage for storage battery" to -- energy creation device" ≥ "the target voltage for storage battery --.

Column 43, Line 51, should be changed from "energy storage device" "the end determination voltage" to -- energy storage device" ≥ "the end determination voltage --.

Column 43, Line 53, should be changed from "energy creation device" "the end determination voltage" to -- energy creation device" ≥ "the end determination voltage --.

Column 43, Line 55, should be changed from "energy storage device" "the voltage control target value" to -- energy storage device" ≥ "the voltage control target value --.

Column 47, Line 17, should be changed from "the dead zone width" "the target voltage for solar cell" to -- the dead zone width" ≥ "the target voltage for solar cell --.

Column 47, Line 22, should be changed from "the reference value" "the target voltage for storage battery" to -- the reference value" ≥ "the target voltage for storage battery --.

Column 47, Line 25, should be changed from "the reference value" "the end determination voltage" to -- the reference value" ≥ "the end determination voltage --.

Column 47, Line 27, should be changed from "2 (energy creation device)" "the end determination voltage" to -- 2 (energy creation device)" ≥ "the end determination voltage --.

Signed and Sealed this
Twenty-eighth Day of February, 2023

Katherine Kelly Vidal
*Director of the United States Patent and Trademark Office*

Column 47, Line 29, should be changed from "storage device)" "the voltage control target value" to -- storage device)" $\geq$ "the voltage control target value --.

Column 47, Line 41, should be changed from "the reference value" "the target voltage for storage battery" to -- the reference value" $\leq$ "the target voltage for storage battery --.